US008178861B2

(12) United States Patent
Futatsuyama

(10) Patent No.: US 8,178,861 B2
(45) Date of Patent: May 15, 2012

(54) SEMICONDUCTOR DEVICE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 12/565,439

(22) Filed: Sep. 23, 2009

(65) Prior Publication Data
US 2010/0090188 A1 Apr. 15, 2010

(30) Foreign Application Priority Data

Oct. 15, 2008 (JP) ................................. 2008-266683

(51) Int. Cl.
*H01L 47/00* (2006.01)
*G11C 11/00* (2006.01)
(52) U.S. Cl. ............. 257/4; 257/E45.002; 257/E23.164; 365/148
(58) Field of Classification Search ............... 257/2, 316, 257/324, E45.002, 4, 359, E23.164; 365/105, 365/148, 163
See application file for complete search history.

(56) References Cited

U.S. PATENT DOCUMENTS

| 5,599,724 | A | 2/1997 | Yoshida |
| 5,643,804 | A | 7/1997 | Arai et al. |
| 5,707,885 | A | 1/1998 | Lim |
| 7,264,985 | B2 | 9/2007 | Chung et al. |
| 7,348,624 | B2 | 3/2008 | Sakaguchi et al. |
| 7,910,973 | B2 | 3/2011 | Sakaguchi et al. |
| 2007/0158736 | A1 | 7/2007 | Arai et al. |
| 2007/0252201 | A1 | 11/2007 | Kito et al. |
| 2008/0073635 | A1 | 3/2008 | Kiyotoshi et al. |
| 2008/0084728 | A1* | 4/2008 | Sakuma et al. ................. 365/63 |
| 2008/0128780 | A1 | 6/2008 | Nishihara et al. |
| 2008/0173928 | A1 | 7/2008 | Arai et al. |

FOREIGN PATENT DOCUMENTS

| JP | 06-338602 | 12/1994 |
| JP | 08-264721 | 10/1996 |
| JP | 10-032269 | 2/1998 |
| JP | 2000-514243 | 10/2000 |
| JP | 2001-320016 | 11/2001 |
| JP | 2002-110825 | 4/2002 |
| JP | 2002-141469 | 5/2002 |
| JP | 2004-200504 | 7/2004 |
| JP | 2006-186038 | 7/2006 |
| JP | 2007-266143 | 10/2007 |
| JP | 2007-311566 | 11/2007 |
| JP | 2007-317874 | 12/2007 |
| WO | WO 98/00871 | 1/1998 |

OTHER PUBLICATIONS

H. Tanaka, et al., "Bit Cost Scalable Technology with Punch and Plug Process for Ultra High Density Flash Memory", Symposium on VLSI technology Digest of Technical Papers, 2007, pp. 14-15.
Office Action issued Aug. 17, 2010 in Japanese Application No. 2008-067544.

* cited by examiner

*Primary Examiner* — Thomas L Dickey
*Assistant Examiner* — Nikolay Yushin
(74) *Attorney, Agent, or Firm* — Oblon, Spivak, McClelland, Maier & Neustadt, L.L.P.

(57) ABSTRACT

A semiconductor device is comprised of a semiconductor substrate, conductive layers stacked above the semiconductor substrate, which is comprised of a conductive polysilicon, and a metal layer provided above the conductive layers. Both ends of the conductive layers have stairsteps respectively. The conductive layers are connected in series by a metal layer which is provided on the stairsteps. The conductive layers connected in series comprise a resistance element.

17 Claims, 59 Drawing Sheets

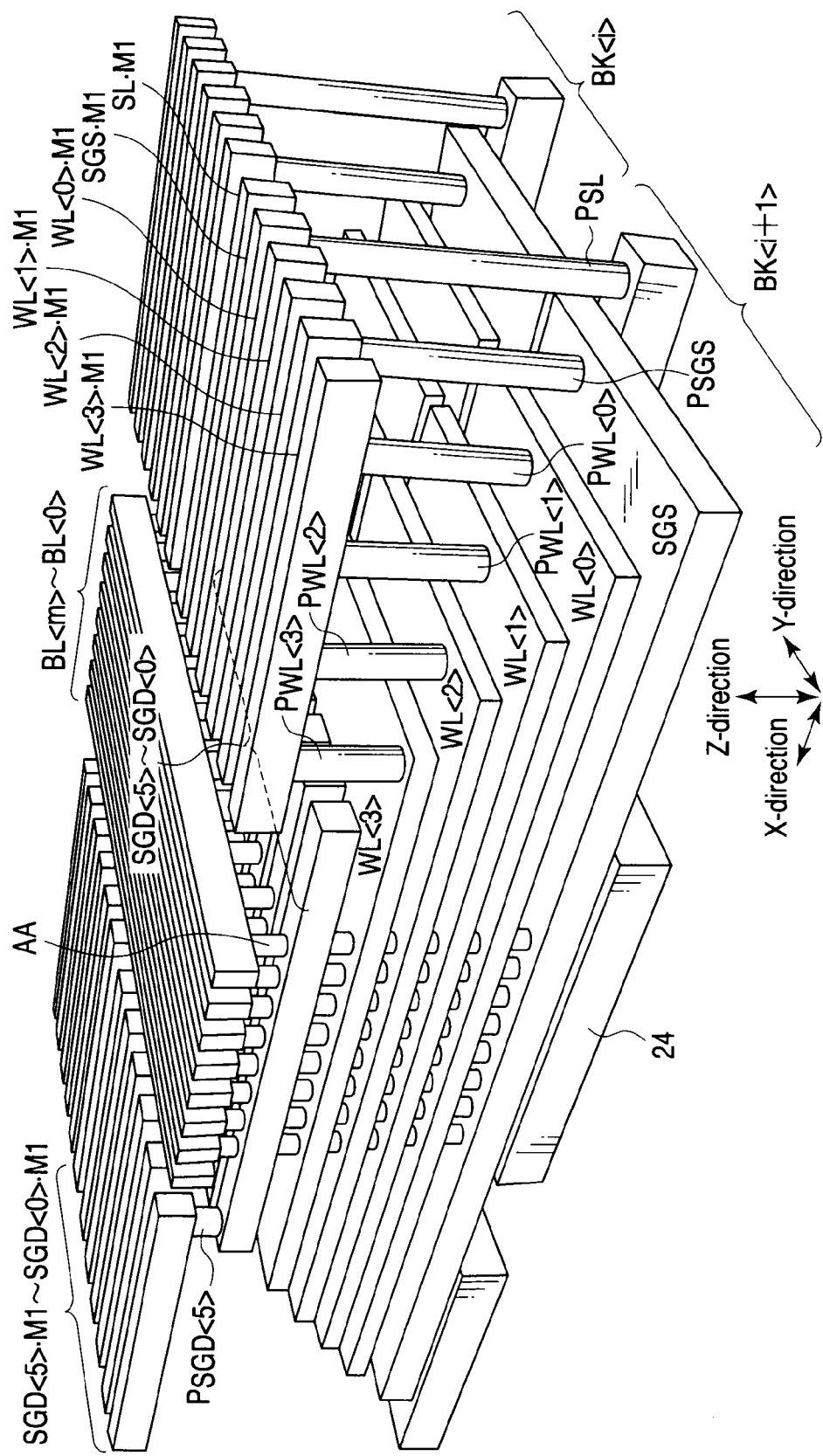
F I G. 3

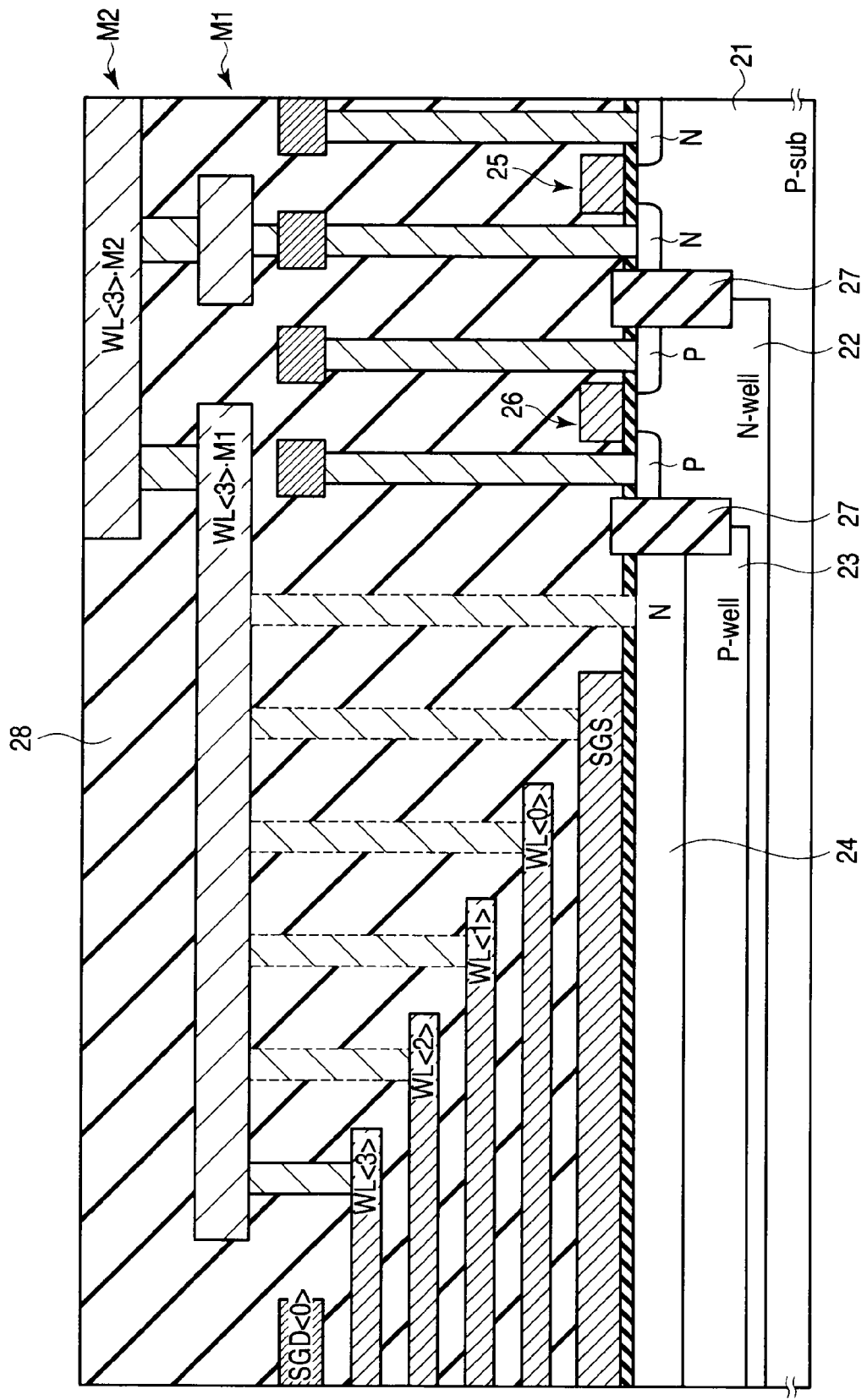
F I G. 5

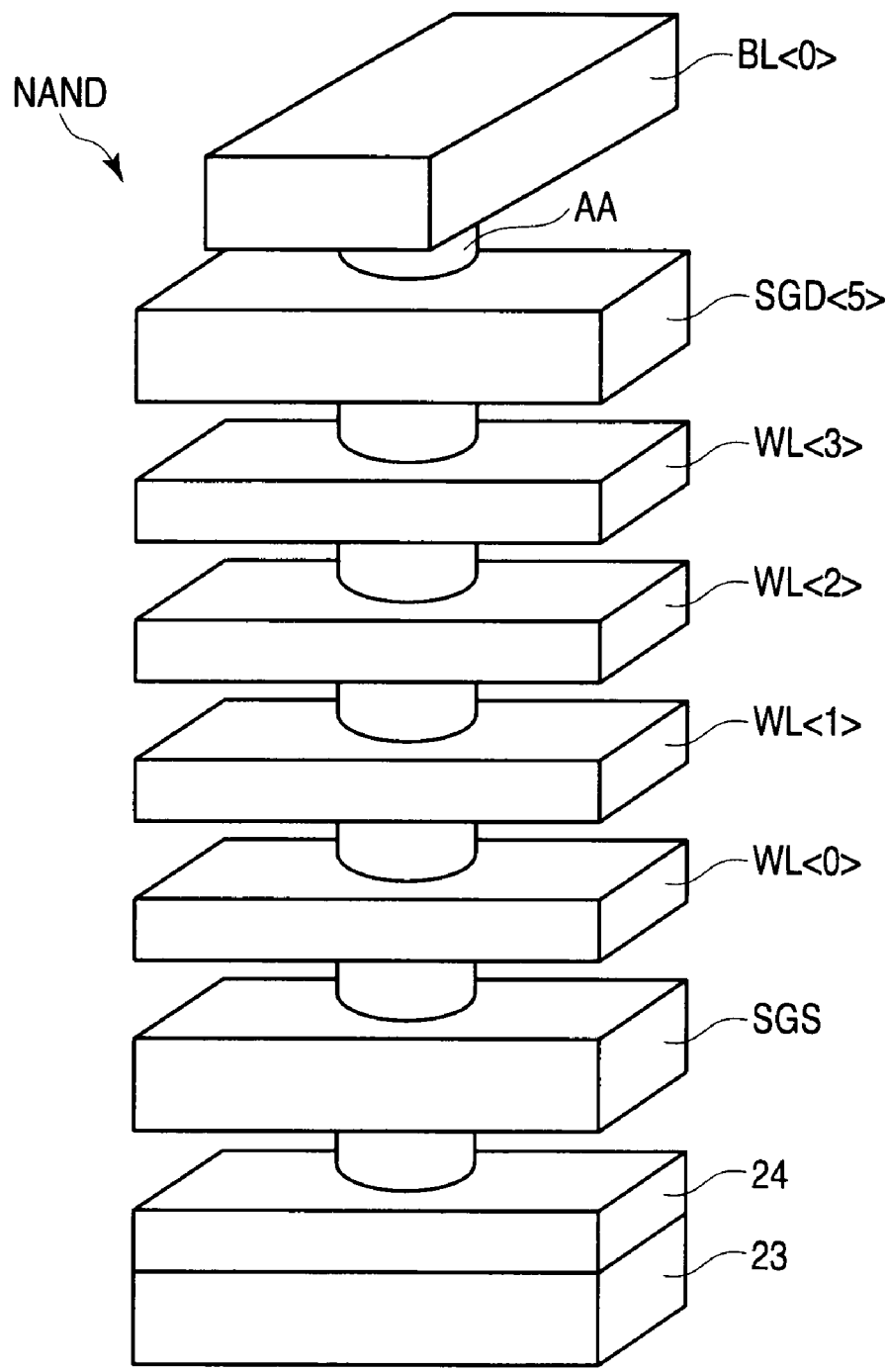
F I G. 8

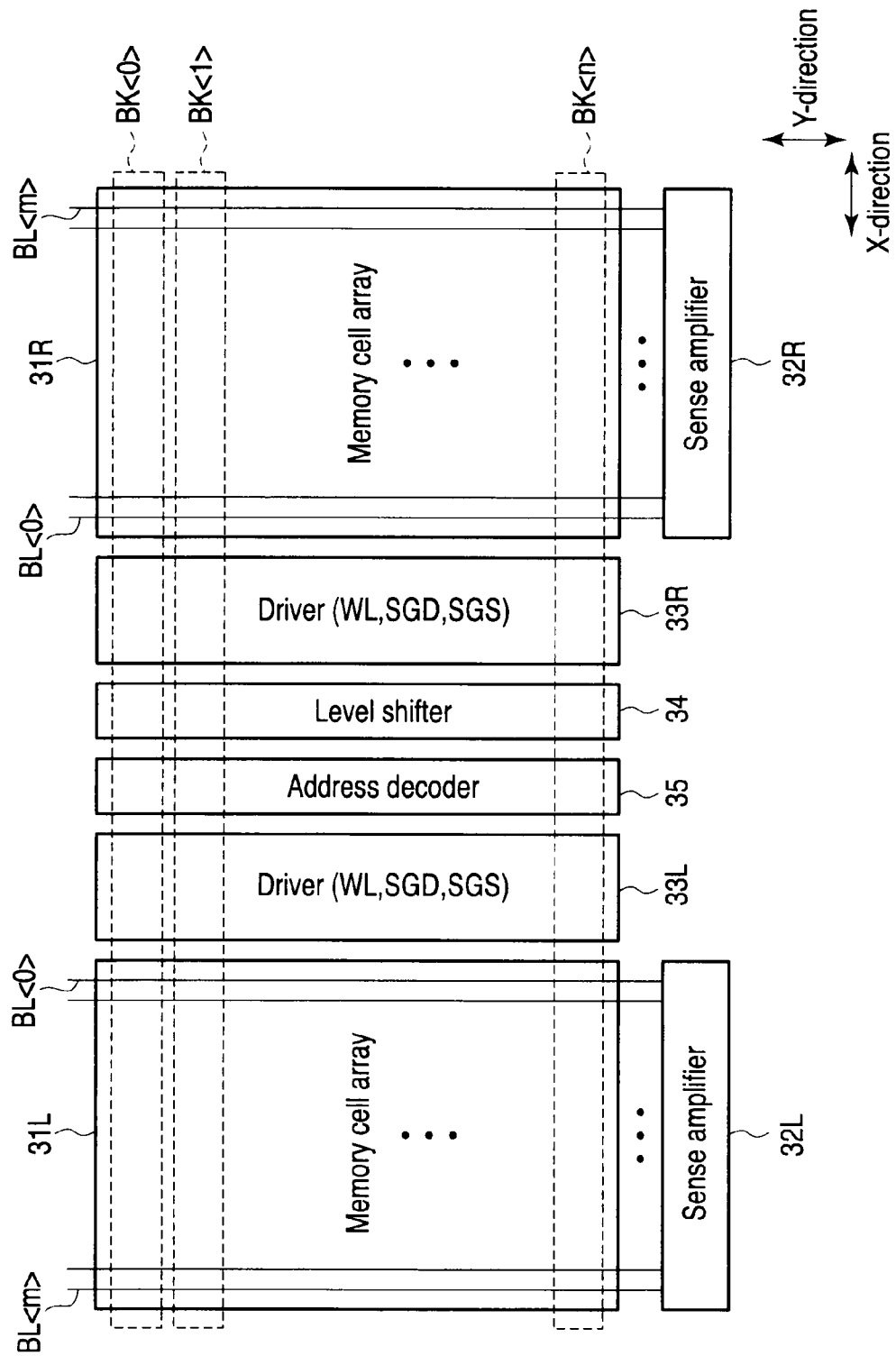
F I G. 13

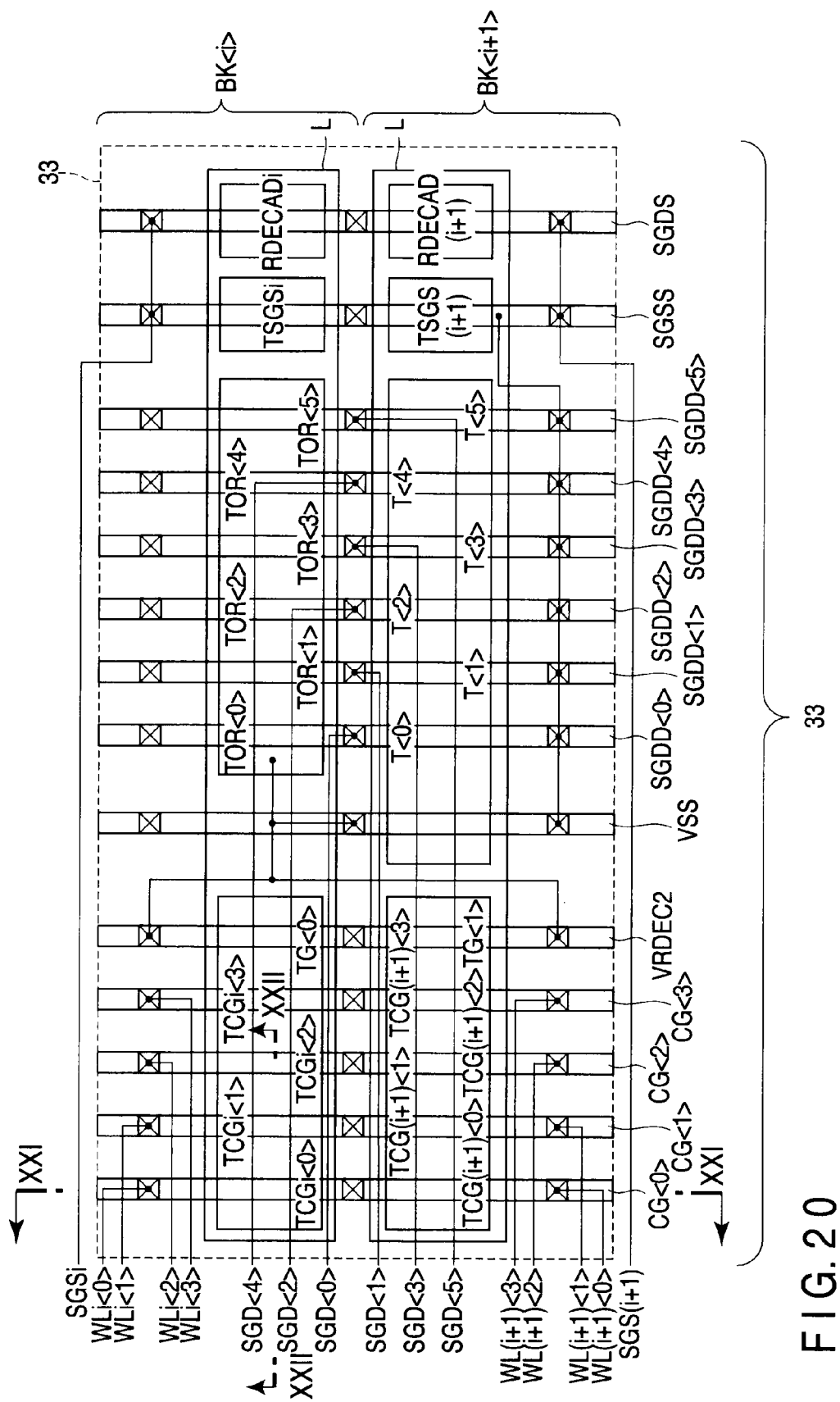
F I G. 20

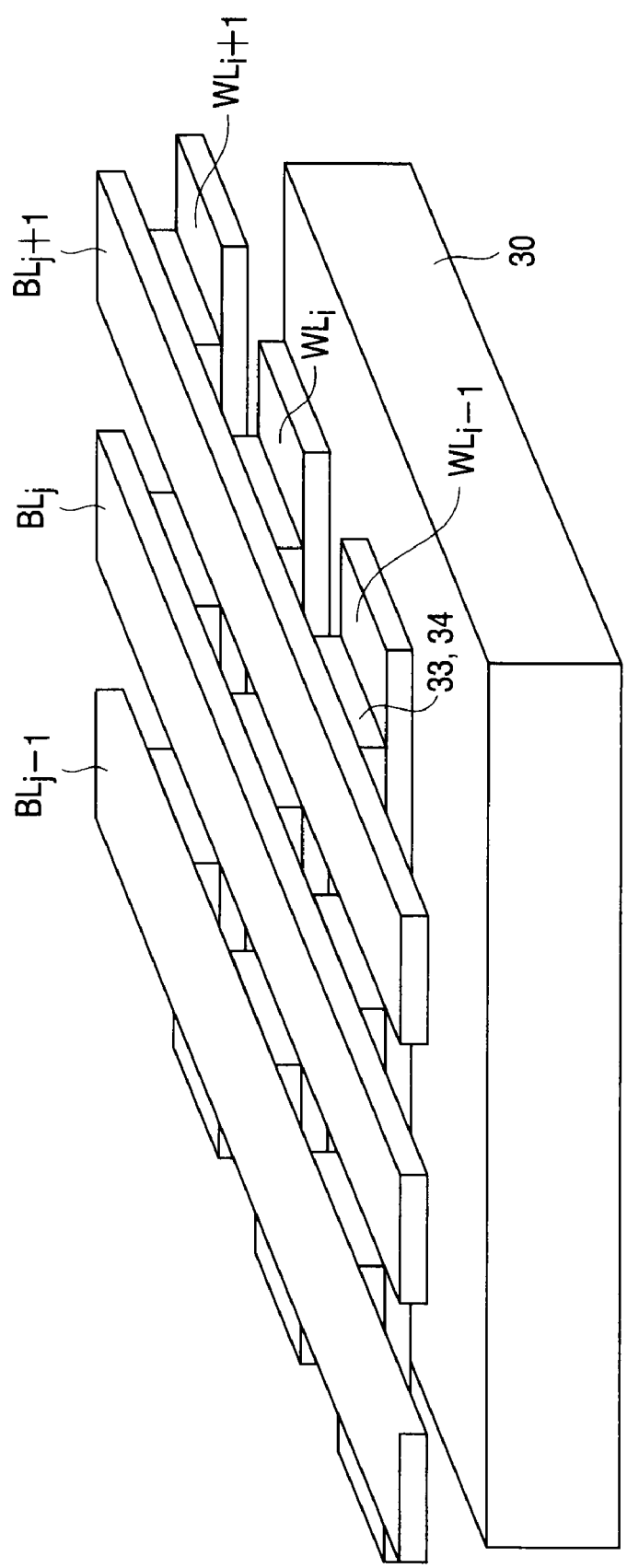
F I G. 26

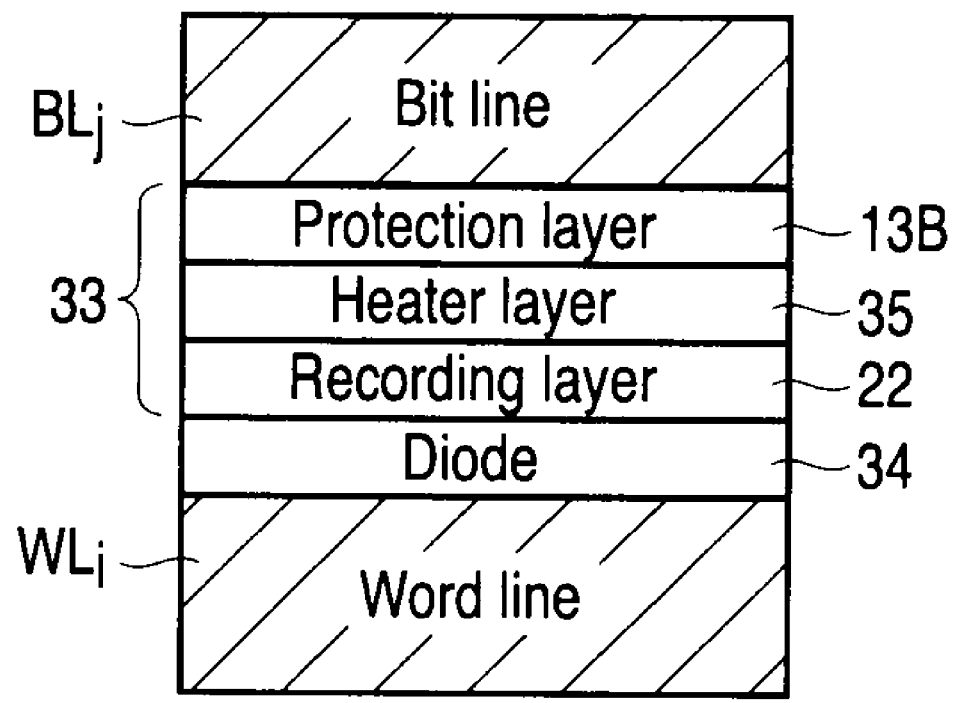
F I G. 27

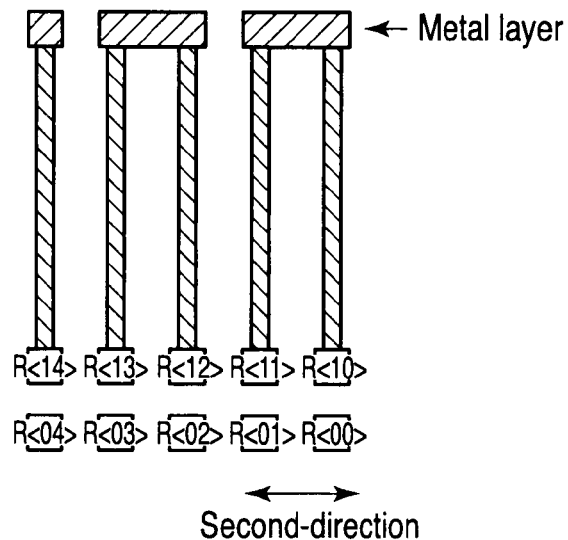
F I G. 3 5
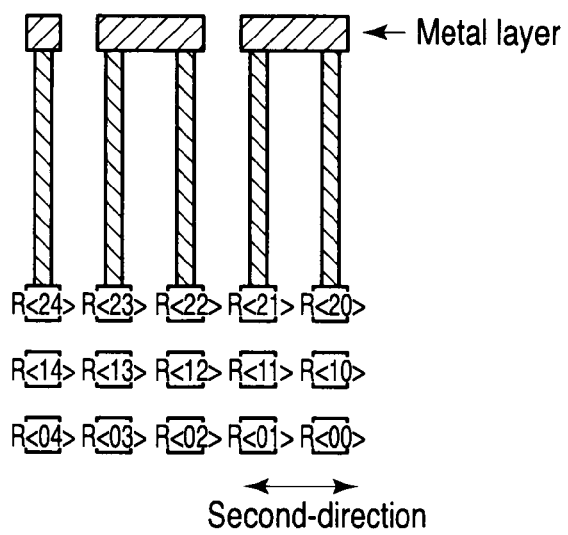
F I G. 3 6

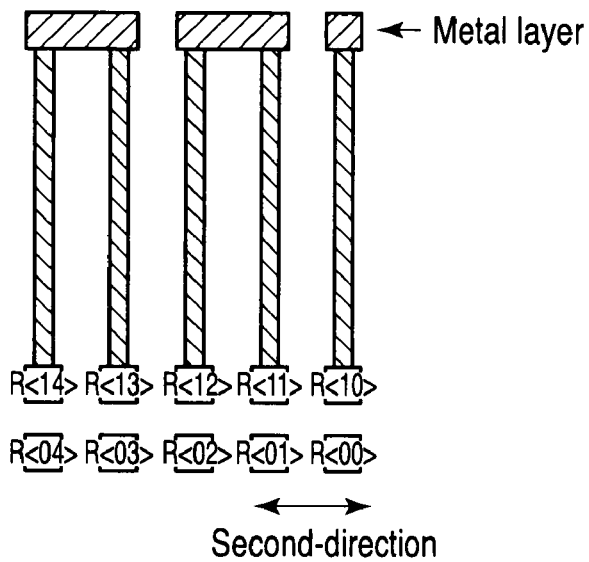
F I G. 3 9
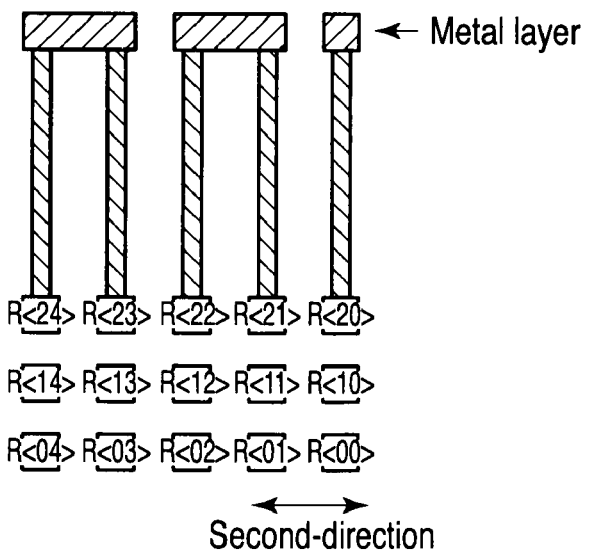
F I G. 4 0

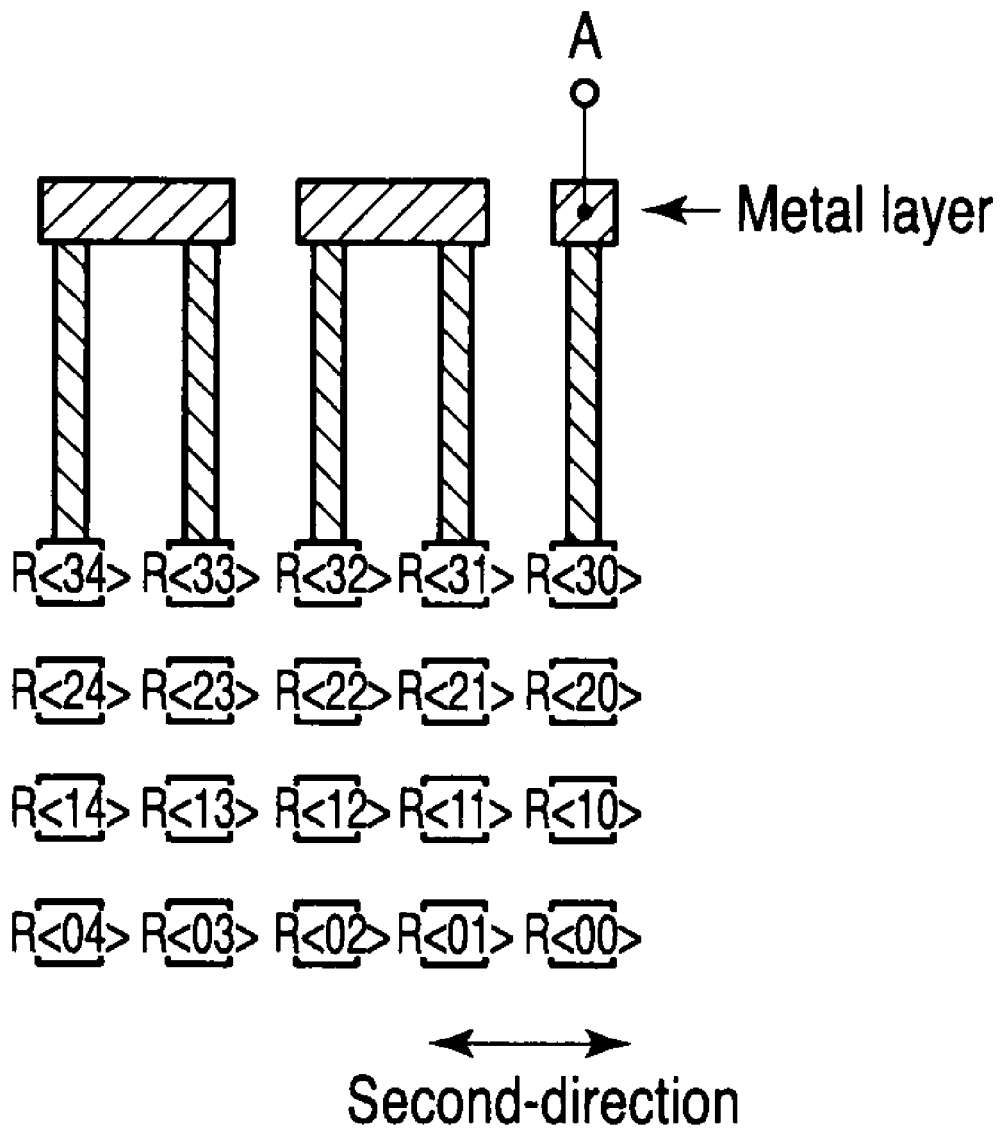
F I G. 4 1

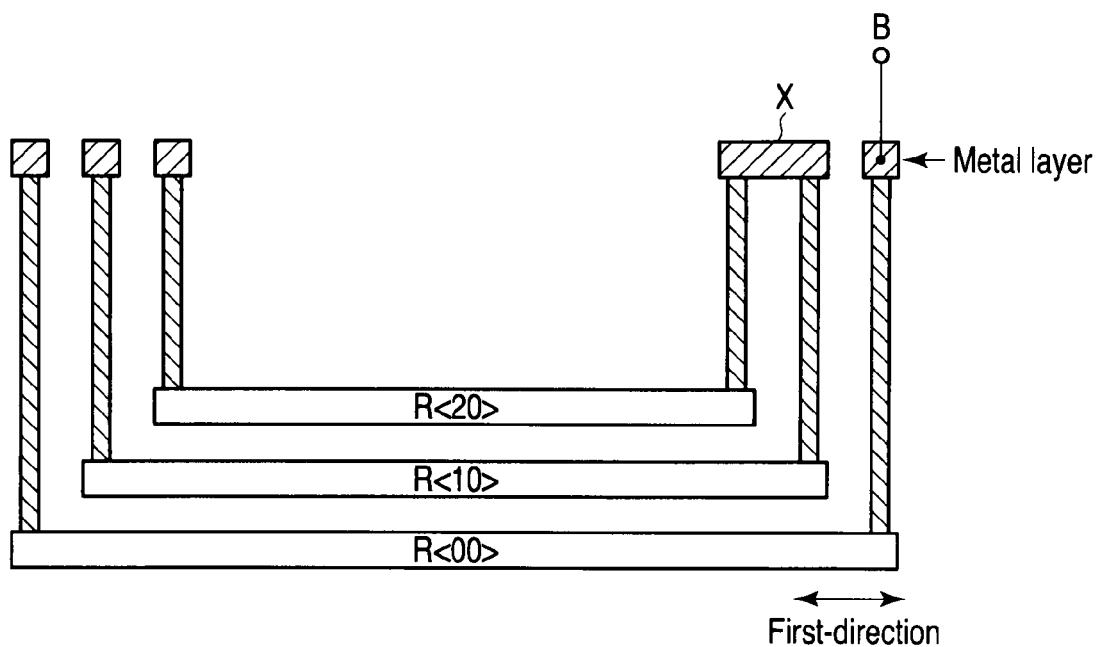
F I G. 4 5
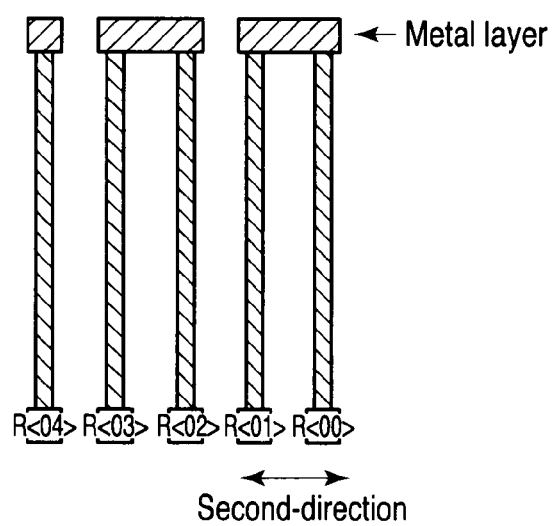
F I G. 4 6

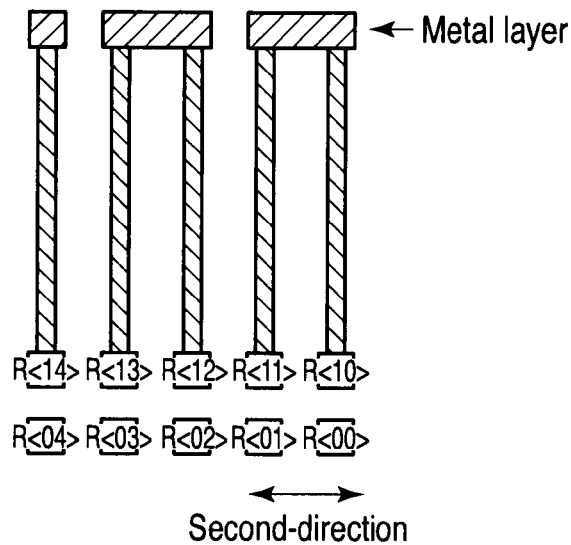
F I G. 47
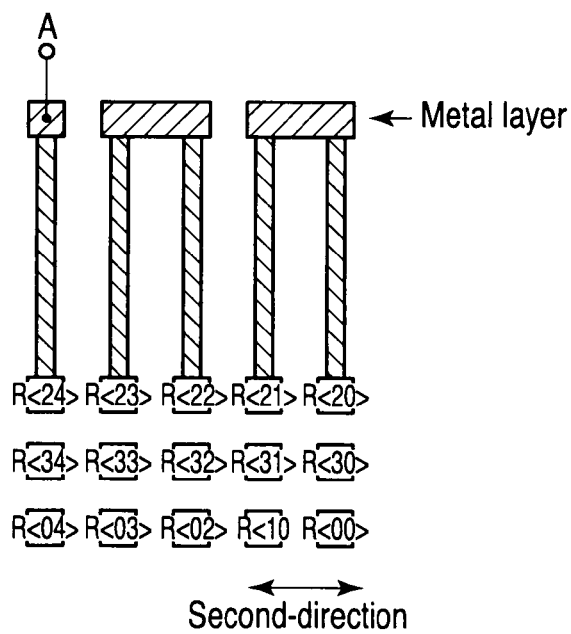
F I G. 48

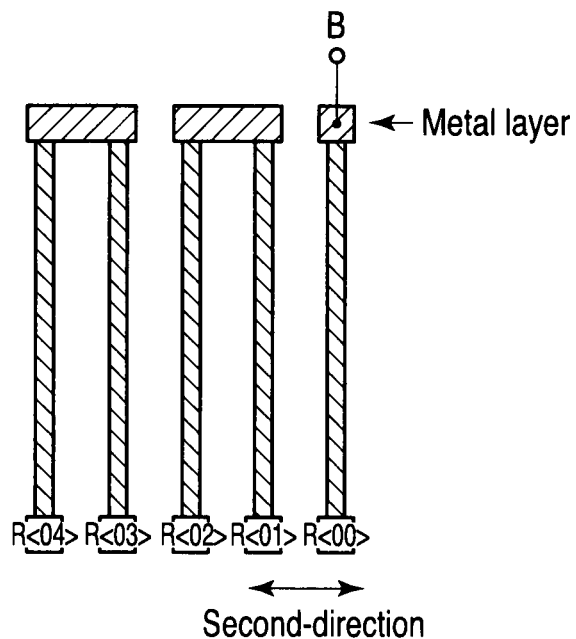
F I G. 4 9
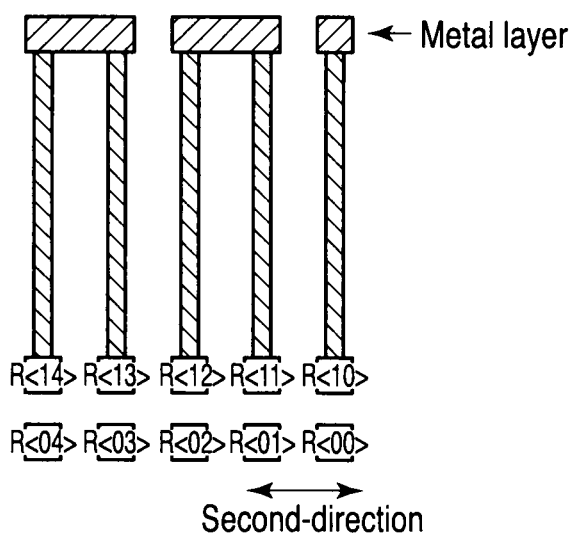
F I G. 5 0

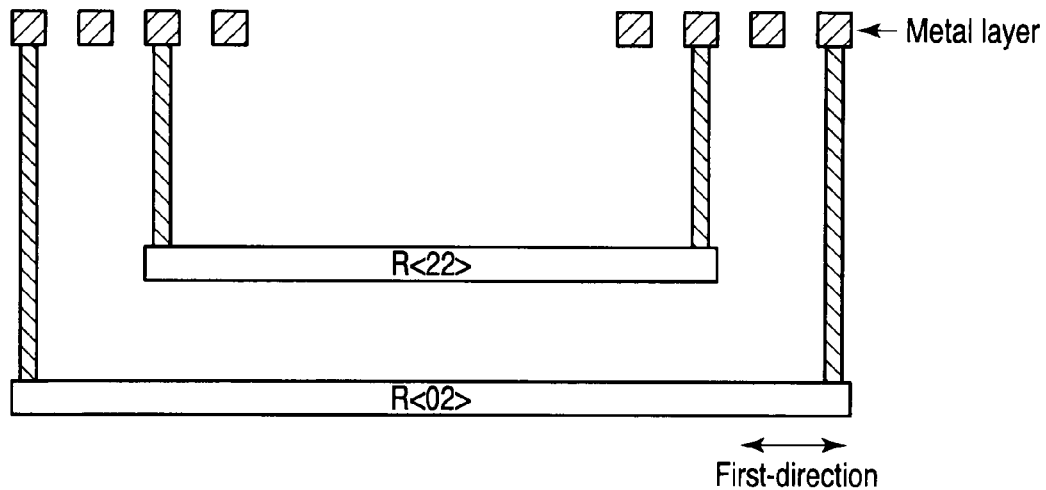
F I G. 5 7
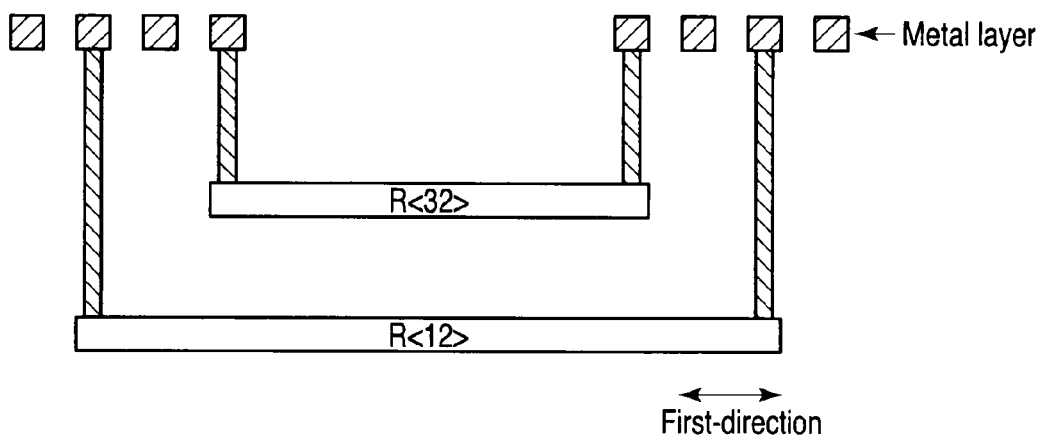
F I G. 5 8

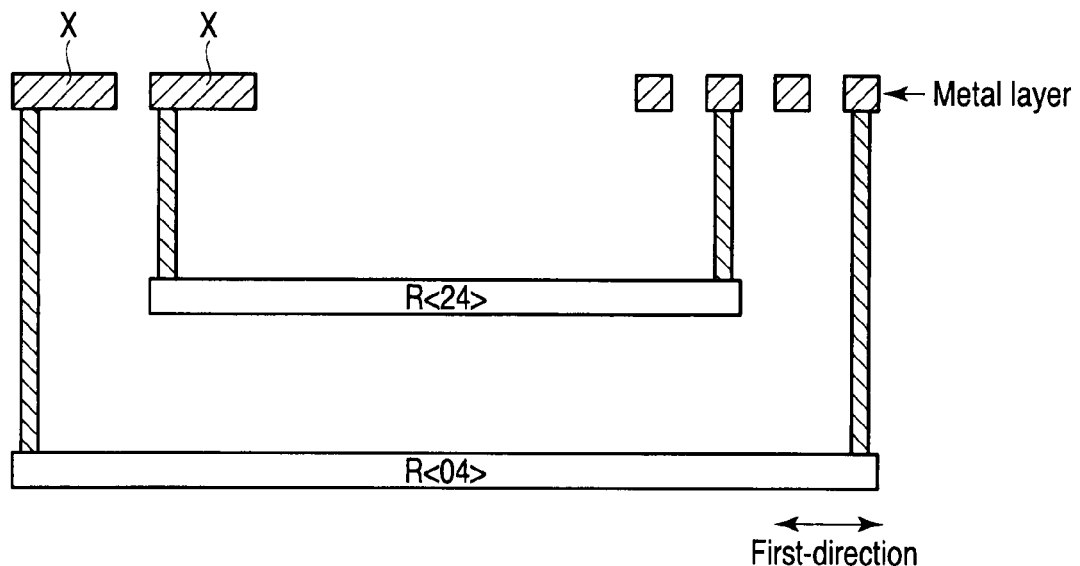
F I G. 5 9
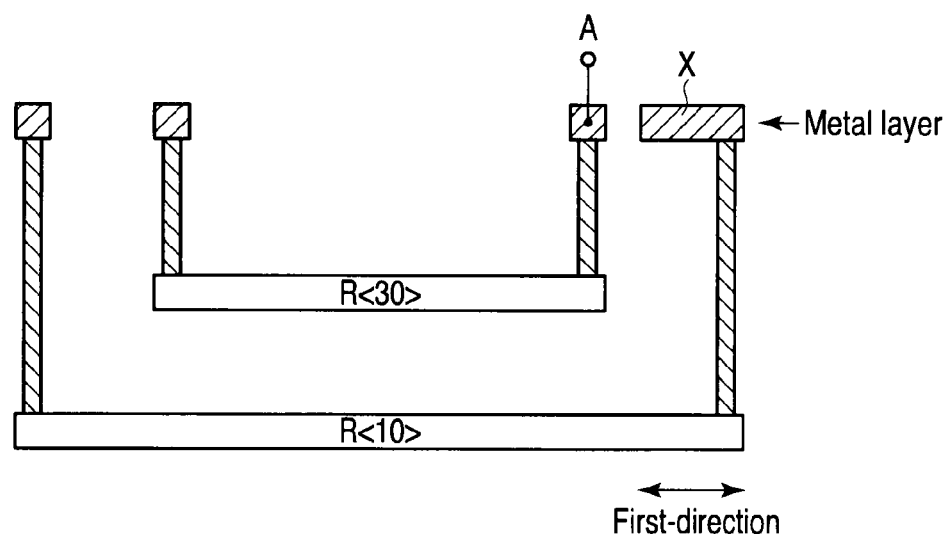
F I G. 6 0

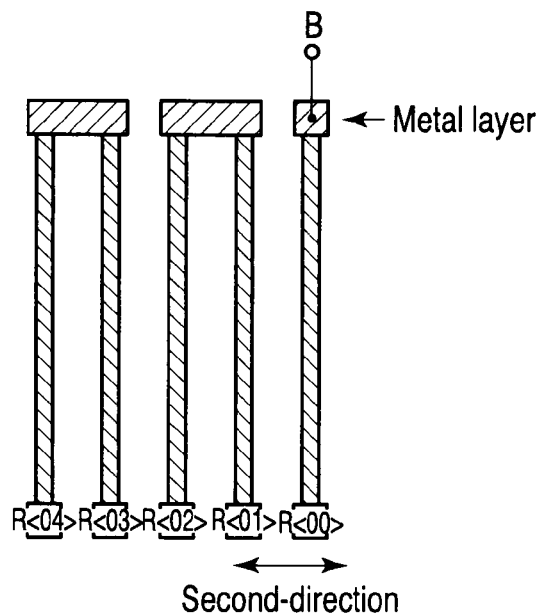
F I G. 6 5
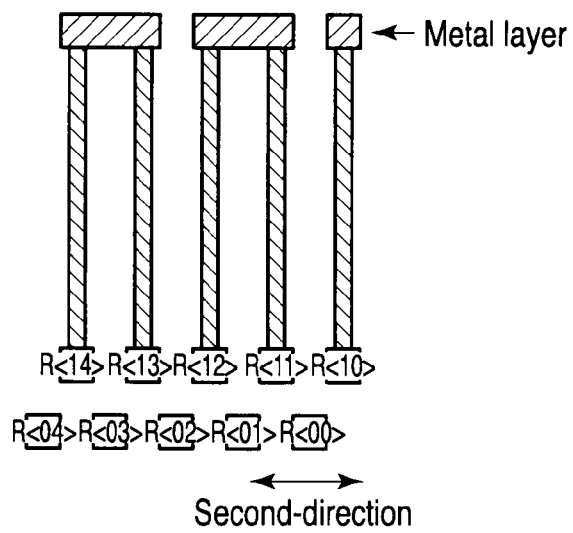
F I G. 6 6

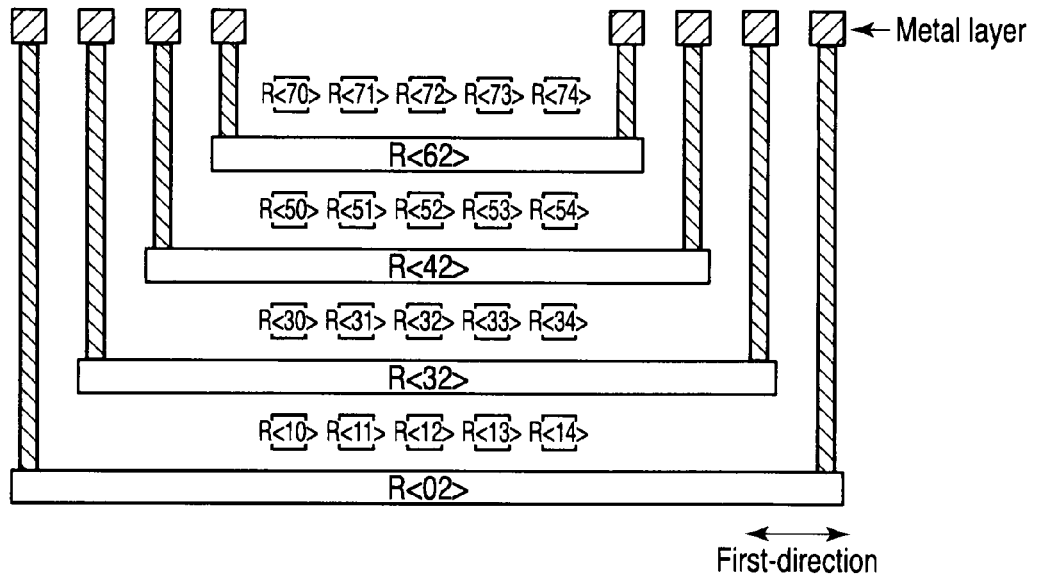
F I G. 70
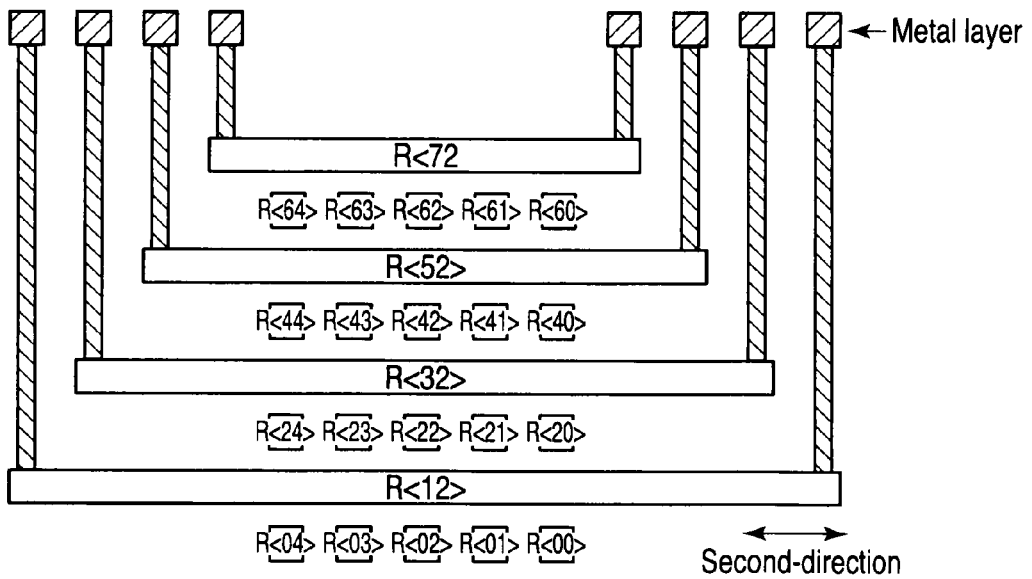
F I G. 71

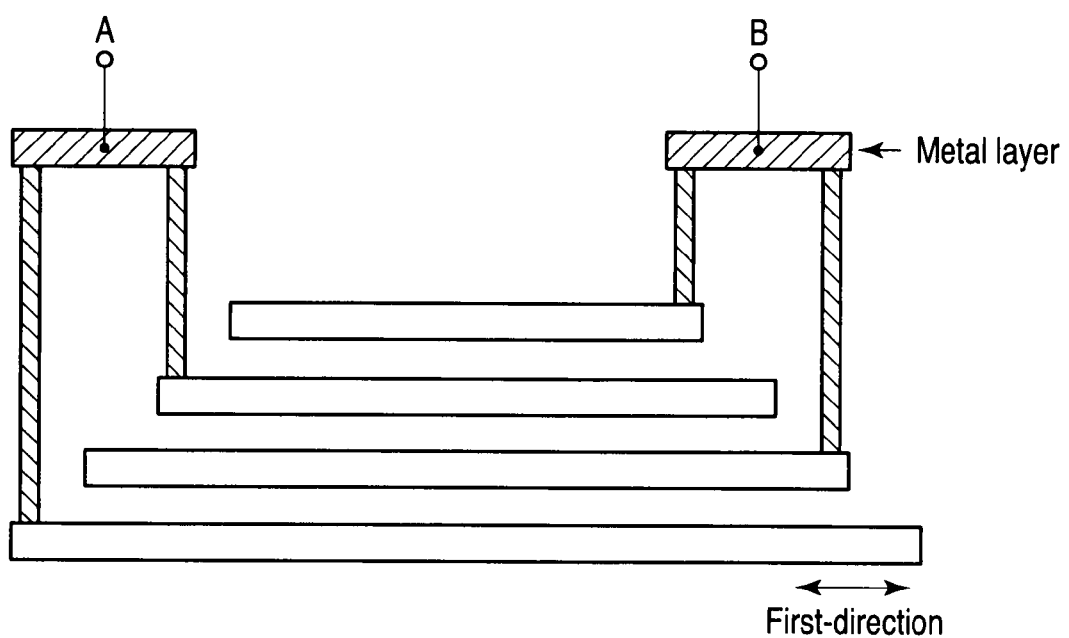
F I G. 73

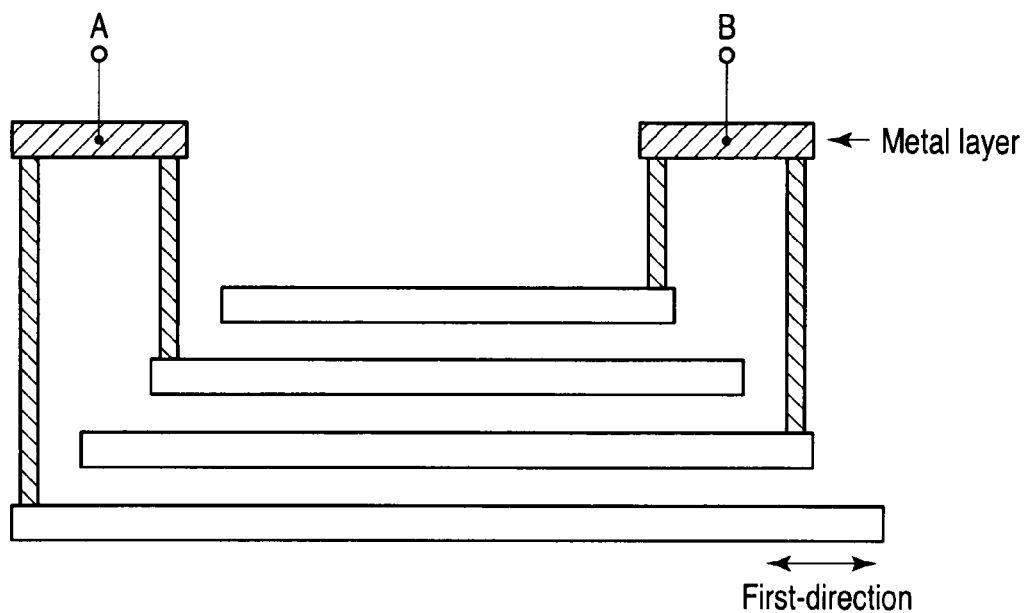
F I G. 77
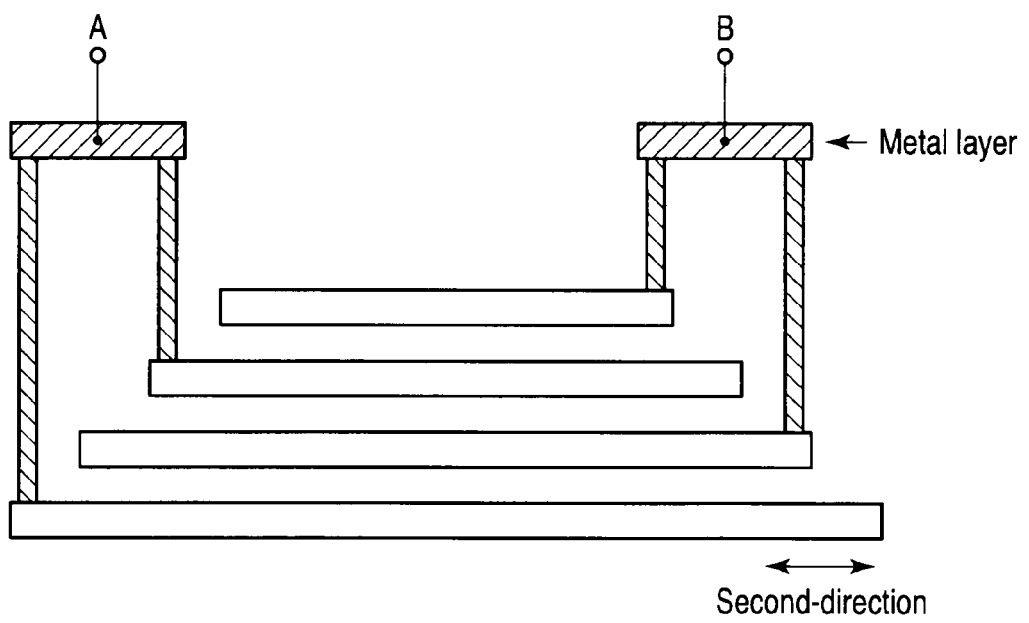
F I G. 78

SEMICONDUCTOR DEVICE

CROSS-REFERENCE TO RELATED APPLICATIONS

This application is based upon and claims the benefit of priority from prior Japanese Patent Application No. 2008-266683, filed Oct. 15, 2008, the entire contents of which are incorporated herein by reference.

BACKGROUND OF THE INVENTION

1. Field of the Invention

The present invention relates to a resistance element and a capacitance element which are applied to a semiconductor integrated circuit having a 3-dimensional stacked layer structure.

2. Description of the Related Art

Recently a technique of stacking elements on a semiconductor substrate to form a 3-dimensional structure is developed to achieve high integration and high performance of a semiconductor integrated circuit.

For example, a BiCS (Bit Cost Scalable) technique is a well-known technique of achieving large capacity to curb costs by the 3-dimensional structure (for example, see "Bit Cost Scalable Technology with Punch and Plug Process for Ultra High Density Flash Memory" 2007 Symposium on VLSI Technology Digest of Technical Papers. p 14).

A nonvolatile semiconductor memory (hereinafter referred to as BiCS memory) to which the BiCS technique is applied is not a simple 3-dimensional structure, but the BiCS memory enables bit cost scalability by devising a device structure and a process technique. In the bit cost scalability, bit cost is reduced in proportion with an increase of the number of stacked layers.

For example, when the BiCS technique is applied to a NAND flash memory (hereinafter referred to as BiCS-NAND flash memory), the number of cells constituting a NAND string is vertically increased by increasing the number of stacked layers, thereby realizing a memory capacity that largely exceeds a memory capacity limit of a NAND flash memory having a 2-dimensional structure.

However, in a semiconductor memory such as the BiCS memory having the 3-dimensional stacked layer structure, although a memory cell array is 3-dimensionally formed, a 3-dimensional peripheral circuit is not sufficiently studied yet.

BRIEF SUMMARY OF THE INVENTION

A semiconductor device according to an aspect of the present invention is comprised of a semiconductor substrate, conductive layers stacked above the semiconductor substrate, which is comprised of a conductive polysilicon, and a metal layer provided above the conductive layers. Both ends of the conductive layers have stairsteps respectively. The conductive layers are connected in series by a metal layer which is provided on the stairsteps. The conductive layers connected in series comprise a resistance element.

A semiconductor device according to an aspect of the present invention is comprised of a semiconductor substrate, three or more conductive layers stacked above the semiconductor substrate, which is comprised of a conductive polysilicon; and, a metal layer provided above the conductive layers. Both ends of the conductive layers have stairsteps respectively. The odd-numbered conductive layers are connected in series by a metal layer which is provided on the stairsteps. The odd-numbered conductive layers connected in series comprise a first electrode of a capacitance element. The even-numbered conductive layers are connected in series by a metal layer which is provided on the stairsteps. The even-numbered conductive layers connected in series comprise a second electrode of the capacitance element.

BRIEF DESCRIPTION OF THE SEVERAL VIEWS OF THE DRAWING

FIGS. 3 and 4 are diagrams, each showing a BiCS-NAND flash memory;

FIG. 5 is a cross sectional view along line V-V in FIG. 4;

FIGS. 7 and 8 are diagrams, each showing a NAND cell unit;

FIG. 13 is a diagram showing a third example of a block layout;

FIG. 20 is a plane vies showing a layout of a driver;

FIG. 26 is a diagram showing a cross point type memory cell array;

FIG. 27 is a diagram showing a structure of a memory cell;

FIG. 35 is a cross sectional view along line XXXV-XXXV in FIG. 30;

FIG. 36 is a cross sectional view along line XXXVI-XXXVI in FIG. 30;

FIG. 39 is a cross sectional view along line XXXIX-XXXIX in FIG. 30;

FIG. 40 is a cross sectional view along line XL-XL in FIG. 30;

FIG. 41 is a cross sectional view along line XLI-XLI in FIG. 30;

FIG. 45 is a cross sectional view along line XLV-XLV in FIG. 42;

FIG. 46 is a cross sectional view along line XLVI-XLVI in FIG. 42;

FIG. 47 is a cross sectional view along line XLVII-XLVII in FIG. 42;

FIG. 48 is a cross sectional view along line XLVIII-XLIII in FIG. 42;

FIG. 49 is a cross sectional view along line XLIX-XLIX in FIG. 42;

FIG. 50 is a cross sectional view along line L-L in FIG. 42;

FIG. 57 is a cross sectional view along line LVII-LVII in FIG. 56;

FIG. 58 is a cross sectional view along line LVIII-LVIII in FIG. 56;

FIG. 59 is a cross sectional view along line LIX-LIX in FIG. 56;

FIG. 60 is a cross sectional view along line LX-LX in FIG. 56;

FIG. 65 is a cross sectional view along line LXV-LXV in FIG. 56;

FIG. 66 is a cross sectional view along line LXVI-LXVI in FIG. 56;

FIG. 70 is a cross sectional view along line LXX-LXX in FIG. 69;

FIG. 71 is a cross sectional view along line LXXI-LXXI in FIG. 69;

FIG. 73 is a cross sectional view along line LXXIII-LXXIII in FIG. 72;

FIG. 77 is a cross sectional view along line LXXVII-LXXVII in FIG. 76;

FIG. 78 is a cross sectional view along line LXXVIII-LXXVIII in FIG. 76;

DETAILED DESCRIPTION OF THE INVENTION

A semiconductor device of an aspect of the present invention will be described below in detail with reference to the accompanying drawing.

1. Outline

In the semiconductor integrated circuit having the 3-dimensional stacked layer structure, conductive layers made of conductive polysilicon are stacked on a semiconductor substrate to achieve the 3-dimensional structure. In an example of the invention a technique of forming a resistance element and a capacitance element by the conductive layers is proposed.

The technique of forming the resistance element and capacitance element by the conductive layers made of conductive polysilicon is already realized in the semiconductor integrated circuit having the 2-dimensional structure. However, in order to 3-dimensionally form the resistance element and capacitance element, it is necessary to sufficiently study a connection relationship of the conductive layers stacked on the semiconductor substrate. For example, in the BiCS memory, because a contact plug is not disposed between the conductive layers in the memory cell array, it is necessary that the contact plug be not disposed between the conductive layers like the inside of the memory cell array when the resistance element and the capacitance element are formed as the peripheral circuit of the BiCS memory.

Therefore, the following technique is applied to the resistance element in the example of the invention. That is, both ends of conductive layers have stairsteps respectively, and the conductive layers are connected in series by a metal layer which is provided on the stairsteps.

The following technique is applied to the capacitance element. That is, both ends of three or more conductive layers have stairsteps respectively, odd-numbered conductive layers from a semiconductor substrate side are connected in series by a metal layer which is provided on the stairsteps to form a first electrode, and even-numbered conductive layers from the semiconductor substrate side are connected in series by a metal layer which is provided on the stairsteps to form a second electrode.

2. Semiconductor Integrated Circuit Having 3-Dimensional Stacked Layer Structure An example of the semiconductor integrated circuit in which the 3-dimensional stacked layer structure technique is proceeding will be described.

Figure 1:
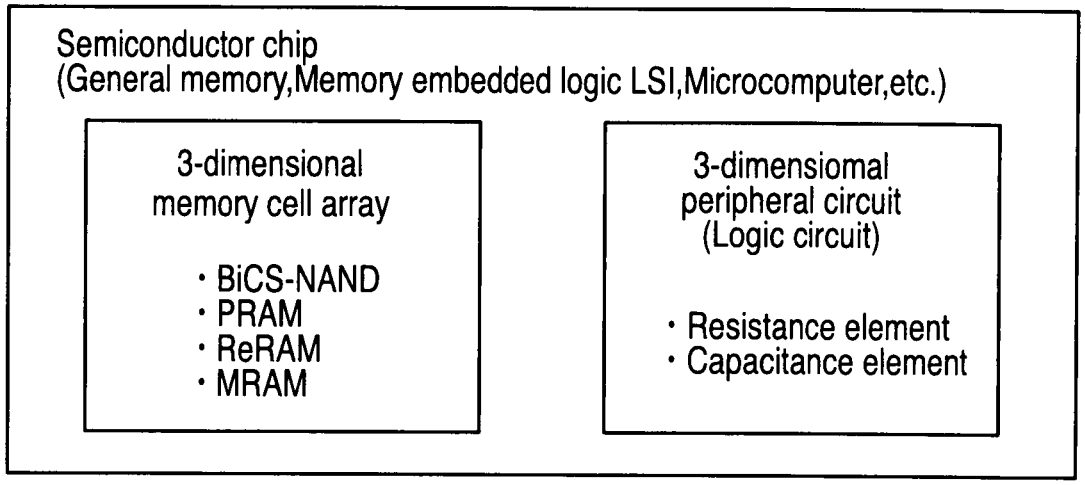
FIG. 1 is a diagram showing a layout image of a semiconductor chip.

FIG. 1 shows a layout image of a semiconductor chip.

For example, the semiconductor chip is a general memory, a memory embedded logic LSI, or a microcomputer. A 3-dimensional memory cell array is formed in the semiconductor chip, and a 3-dimensional peripheral circuit (logic circuit) is formed while adjusted to the 3-dimensional memory cell array.

For example, the 3-dimensional memory cell array includes BiCS-NAND, PRAM (Phase change RAM), ReRAM (Resistive RAM), or MRAM (Magnetic RAM). The 3-dimensional peripheral circuit (logic circuit) includes the resistance element and the capacitance element. For example, the resistance element and the capacitance element constitute a boosting circuit (such as a charge pump circuit) and an output voltage limiter circuit for the boosting circuit. In the example of the invention, resistance element and the capacitance element are 3-dimensionally formed.

An application of the example of the invention to a semiconductor memory (such as BiCS-NAND, PRAM, ReRAM, and MRAM) will be described below.

3. BiCS-NAND Flash Memory (1) Layout Image

Figure 2:
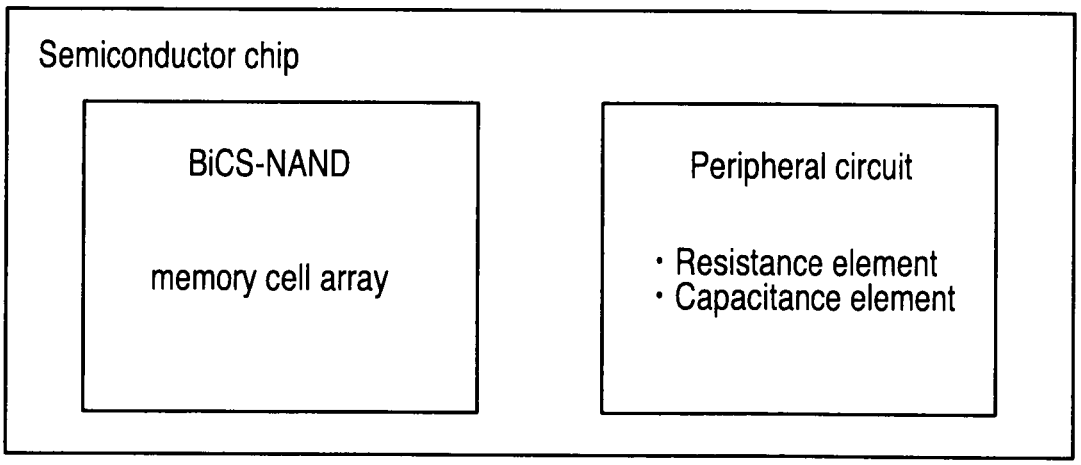
FIG. 2 is a diagram showing a layout image of a BiCS-NAND.

FIG. 2 shows a layout image of BiCS-NAND.

A BiCS-NAND memory cell array and a peripheral circuit are formed in the semiconductor chip. In usual BiCS-NAND, although the memory cell array is 3-dimensionally formed, the peripheral circuit still remains in the 2-dimensional structure. In the example of the invention, the resistance element and the capacitance element are 3-dimensionally formed in the peripheral circuits of BiCS-NAND.

(2) Basic Structure

First a basic structure of BiCS-NAND will be described.

FIG. 3 is a perspective view showing a BiCS-NAND flash memory.

For example, the NAND flash memory includes blocks each of which becomes one unit of erase. FIG. 3 shows two blocks BK<i> and BK<i+1>.

One source diffusion layer 24 formed in the semiconductor substrate is commonly provided for all the blocks. Source diffusion layer 24 is connected to source line SL-M1 through contact plug $P_{SL}$. Three or more conductive layers (in the example of the invention, six-layer structure) made of conductive polysilicon are stacked on source diffusion layer 24.

The five conductive layers except for an uppermost layer are formed plate-like in one block BK<i+1>, and ends of the five conductive layers to an S-direction have stairsteps in order to establish a contact with each conductive layer. The lowermost layer constitutes source line-side select gate line SGS, and the four conductive layers except for the lowermost layer and uppermost layer constitute word lines WL<0>, WL<1>, WL<2>, and W<3>.

The uppermost layer includes linear conductive lines extended in an X-direction. For example, six conductive lines are disposed in one block BK<i+1>. The six conductive lines in the uppermost layer constitute bit line-side select gate lines SGD<0>, . . . , and SGD<5>.

Active layers (active area) AA that constitute a NAND cell unit are formed into a columnar shape in a Z-direction (perpendicular to a surface of the semiconductor substrate) so as to penetrate through the conductive layers to reach source diffusion layer 24.

Upper ends of active layers AA are connected to bit lines BL<0>, . . . , and BL<m> extended in a Y-direction. Source line-side select gate line SGS is connected to an extraction line SGS·M1 extended in the X-direction with a contact plug $P_{SGS}$ interposed therebetween. Word lines WL<0>, WL<1>, WL<2>, and WL<3> are connected to extraction lines WL<0>·M1, WL<1>·M1, WL<2>·M1, and WL<3>·M1 extended in the X-direction with contact plugs $P_{WL<0>}$, $P_{WL<1>}$, $P_{WL<2>}$, and $P_{WL<3>}$, respectively.

Bit line-side select gate lines SGD<0>, . . . , and SGD<5> are connected to extraction lines SGD<0>·M1, . . . , and SGD<5>·M1 extended in the X-direction with contact plugs $P_{SGD<0>}$, and $P_{SGD<5>}$, respectively.

For example, bit lines BL<0>, and BL<m> and extraction lines SGS·M1, WL<0>·M1, WL<1>·M1, WL<2>·M1, WL<3>·M1, SGD<0>·M1, . . . , and SGD<5>·M1 are made of metal.

Figure 4:
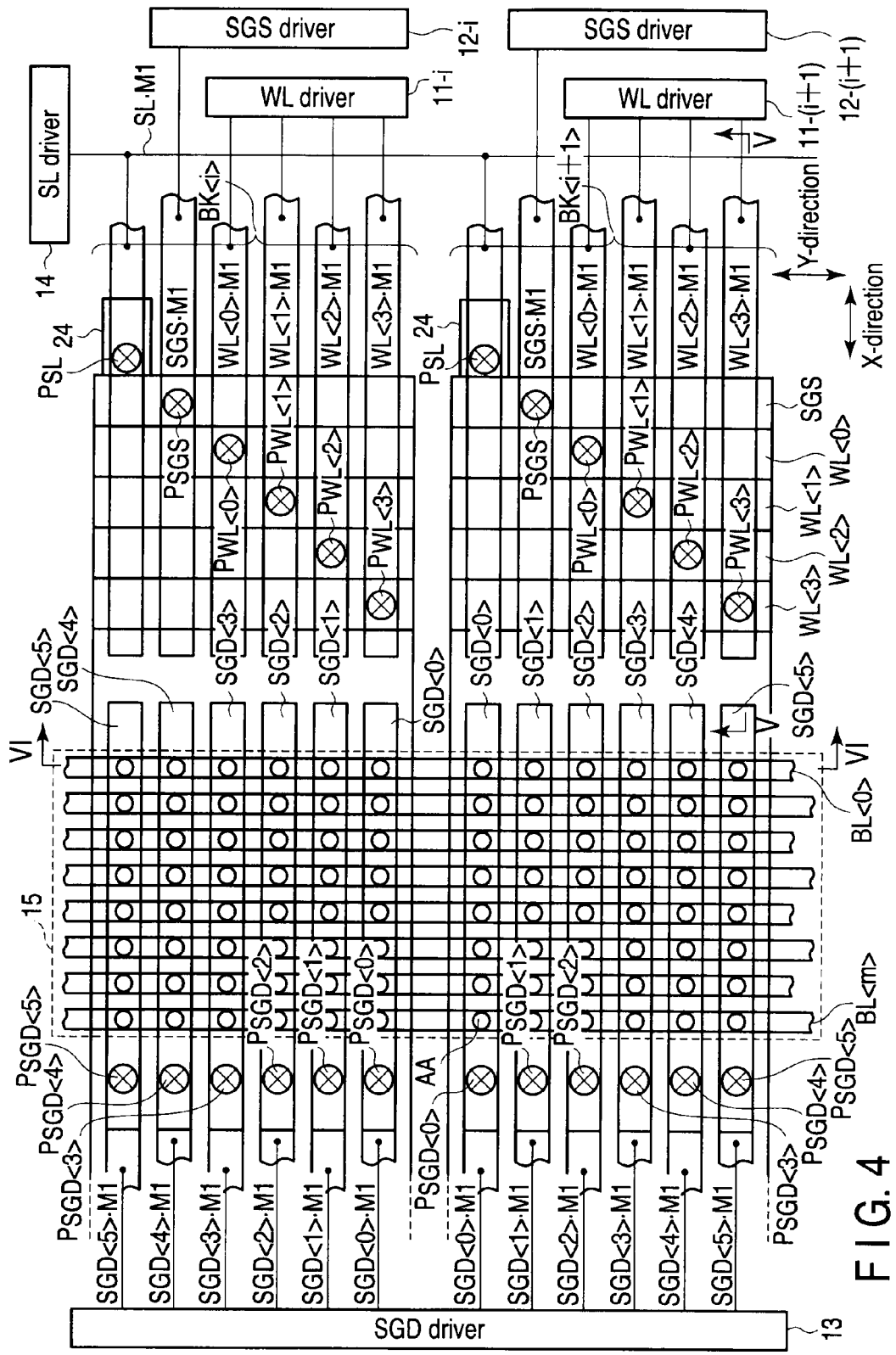

FIG. 4 is a plan view showing the BiCS-NAND flash memory of FIG. 3.

Columnar active layers AA are disposed in a matrix when viewed from an upper surface of the semiconductor substrate and constitute memory cell array 15. The NAND cell unit is formed in each of active layers AA, and the detailed NAND cell unit is described later.

WL drivers 11-$i$ and 11-($i$+1) are connected to word lines WL<0>, WL<1>, WL<2>, and WL<3> with extraction lines WL<0>·M1, WL<1>·M1, WL<2>·M1, and WL<3>·M1 interposed therebetween and drive word lines WL<0>, WL<1>, WL<2>, and WL<3> in write, read, and erase operations.

SGS driver 12-$i$ and 12-($i$+1) are connected to source line-side select gate line SGS with extraction line SGS·M1 interposed therebetween. SGD driver 13 is connected to bit line-side select gate lines SGD<0>, and SGD<5> with extraction lines SGD<0>·M1, . . . , and SGD<5>·M1 interposed therebetween.

SL driver 14 is connected to source diffusion layer 24 with source line SL·M1 interposed therebetween.

In the layout, in consideration of the increase of the number of transistors constituting the driver that is the peripheral circuit, WL drivers 11-$i$ and 11-($i$+1) and SGS drivers 12-$i$ and 12-($i$+1) are disposed on one end side in the X-direction of memory cell array 15, and SGD driver 13 is disposed on the other end side in the X-direction of memory cell array 15.

FIG. 5 is a cross sectional view along a line V-V in FIG. 4.

N-type well region (N-well) 22 and P-type well region (P-well) 23 are formed in P-type semiconductor substrate (P-sub) 21. Source diffusion layer 24 that is N-type diffusion layer is formed in P-type well region 23.

N-channel type FET (for example, N-channel type MOSFET) 25 is formed in P-type semiconductor substrate 21, and P-channel type FET (for example, P-channel type MOSFET) 26 is formed in N-type well region 22. These transistors constitute a peripheral circuit (for example, driver) that is formed in a peripheral portion of the memory cell array.

Source line-side select gate line SGS and word lines WL<0>, WL<1>, WL<2>, and WL<3> are connected to the transistors constituting the driver through the extraction line in first metal layer M1 and the extraction line in second metal layer M2 on first metal layer M1.

Specifically, for example, word line WL<3> is connected to N-channel type FET 25 constituting the word line driver through the extraction line WL<3>·M1 in the first metal layer M1 and the extraction line WL<3>-M2 in the second metal layer M2 on the first metal layer M1.

At this point, gate electrodes of N-channel type FET 25 and P-channel type FET 26 are formed along with source line-side select gate line SGS, for example.

That is, the gate electrodes of N-channel type FET 25 and P-channel type FET 26 have the same structure and thickness as source line-side select gate line SGS.

Figure 6:
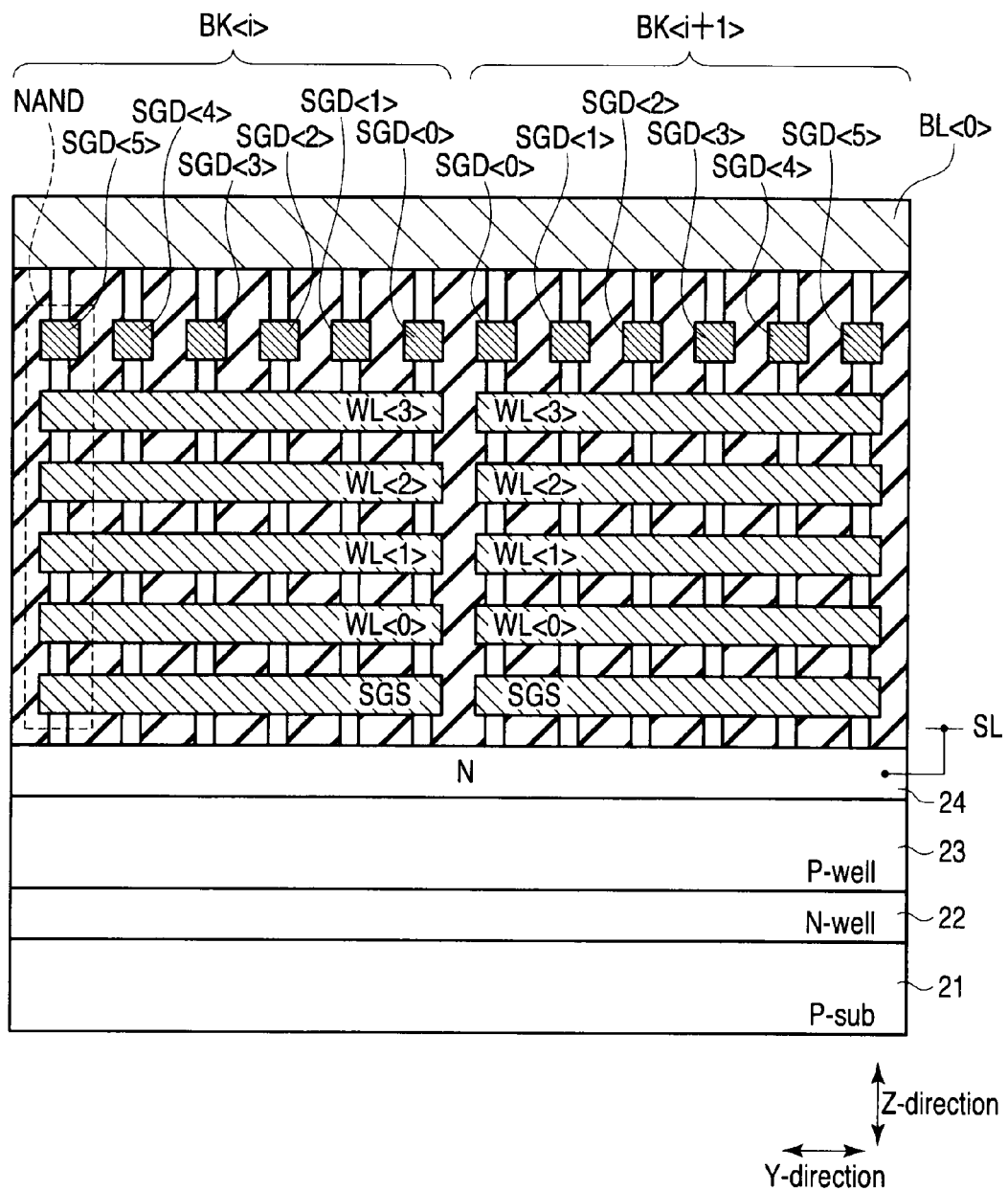
FIG. 6 is a cross sectional view along line VI-VI in FIG. 4.

FIG. 6 is a cross sectional view along a line VI-VI in FIG. 4.

Active layers (active area) AA penetrate through source line-side select gate line SGS, word lines WL<0>, WL<1>, WL<2>, and WL<3>, and bit line-side select gate lines SGD<0>, ..., and SGD<5>, one end (lowermost portion) of active layer AA is connected to source diffusion layer 24, and the other end (uppermost portion) is connected to bit line BL<0>.

Active layers AA are formed into a columnar shape in the Z-direction (perpendicular to the surface of the semiconductor substrate), and NAND cell unit NAND is formed in each of active layers AA.

Figure 7:
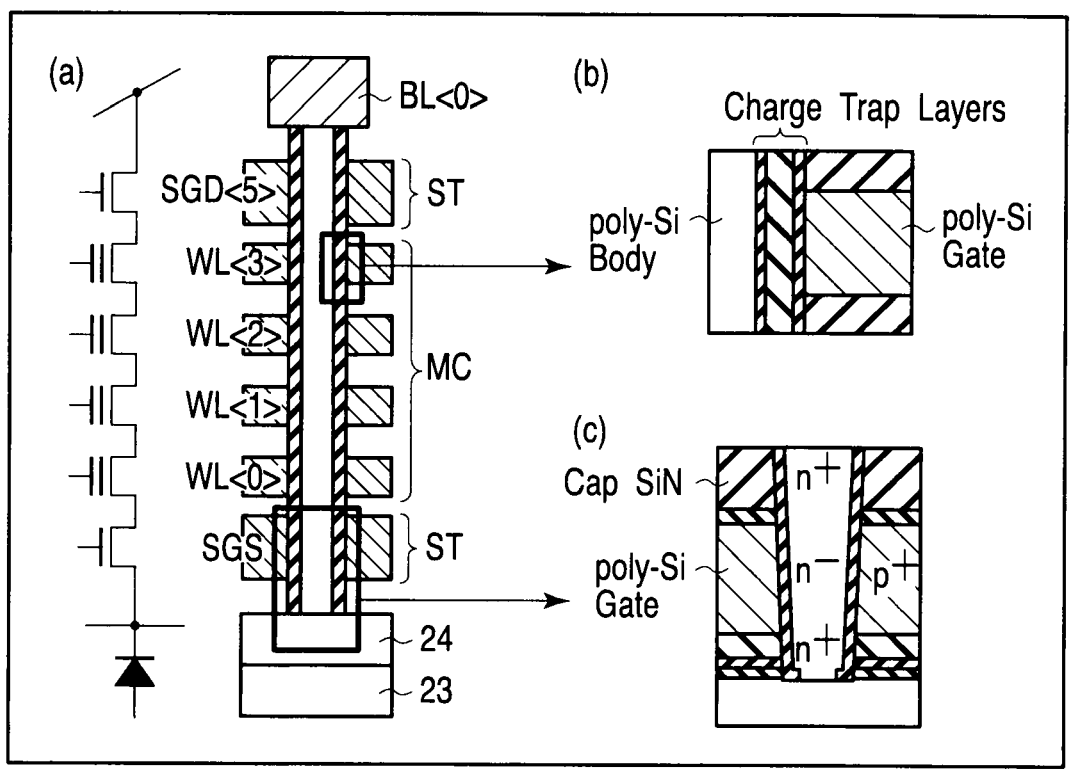

FIG. 7 shows a structure example of NAND cell unit NAND.

Memory cell MC has a MONOS structure.

The MONOS structure means a memory cell structure in which a charge accumulation layer is made of an insulating material such as nitride. It is assumed that the charge accumulation layer has a multi-layer structure (charge trap layers), and ONO (oxide/nitride/oxide) is cited as an example in FIG. 7.

For example, select gate transistor ST has the same structure as memory cell MC.

However, the gate insulator of select gate transistor ST has a structure different from that of memory cell MC, that is, the gate insulator of select gate transistor ST has structure (for example, single silicon oxide film) in which the charge accumulation layer is not provided.

FIG. 8 is a perspective view of the NAND cell unit.

One of the features of the 3-dimensional-structure NAND cell unit is that source line-side select gate line SGS, word lines WL<0>, WL<1>, WL<2>, and WL<3>, and bit line-side select gate lines SGD<0>, ..., and SGD<5> surround a side face of columnar active layer AA.

Therefore, for example, a driving force of the transistor constituting the NAND cell unit can sufficiently be ensured even if active layers AA are finely formed on the semiconductor substrates as many as possible to achieve the large capacity.

Figure 9:
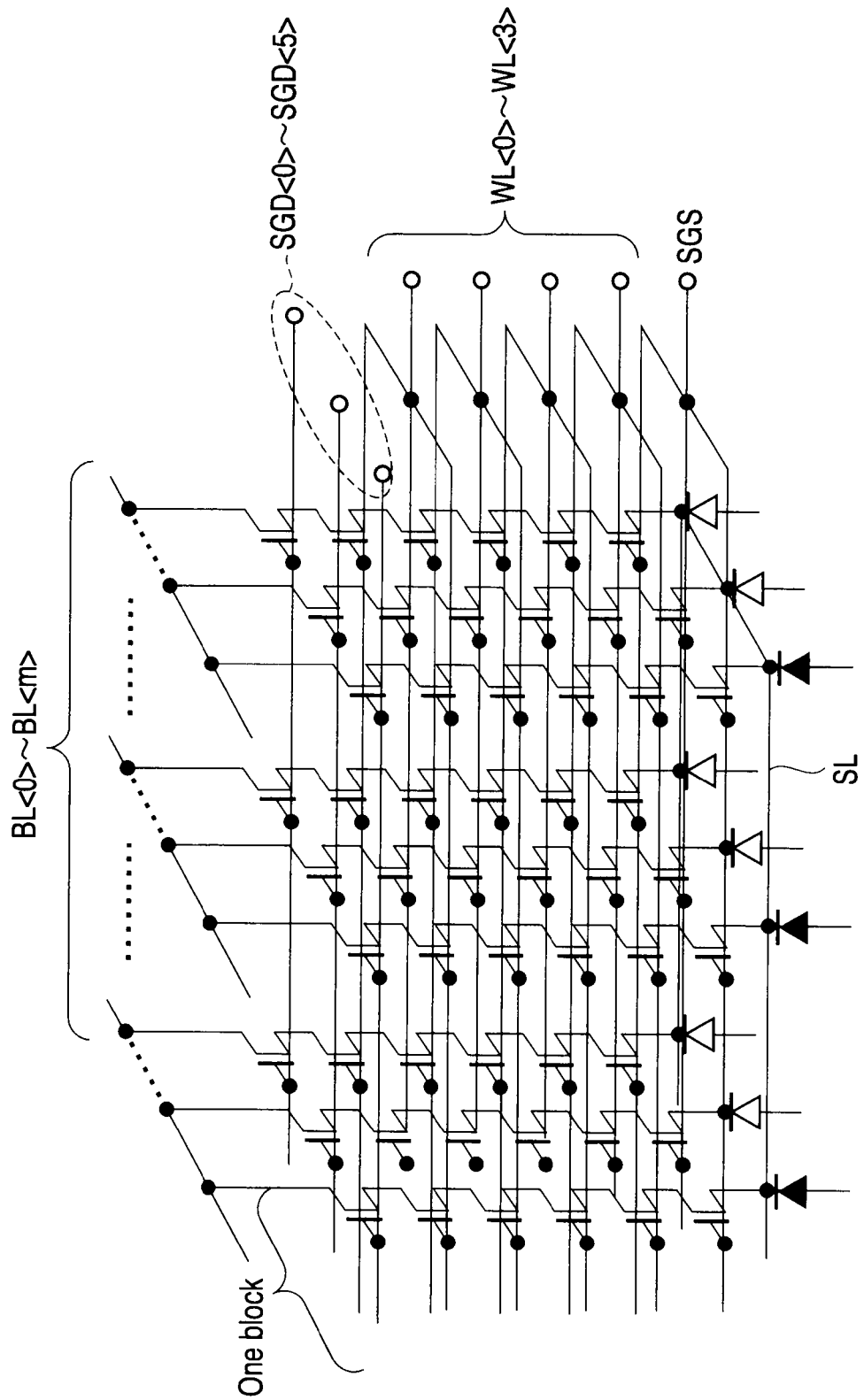
FIG. 9 is a diagram showing an equivalent circuit of a memory cell array.

FIG. 9 shows an equivalent circuit of the memory cell array.

Because the BiCS-NAND flash memory has the 3-dimensional structure, the equivalent circuit is also 3-dimensionally shown.

The capacity of the BiCS-NAND flash memory is increased as the number of memory cells constituting the NAND string is increased. However, from the viewpoint of a nature of the BiCS structure, when the number of memory cells constituting the NAND string is increased, possibly a characteristic of the memory cell may fluctuate on a production process.

In consideration of the fluctuation of the characteristic, the number of memory cells constituting the NAND string is set to a smaller number (for example, four or eight memory cells). The same structure may be stacked on the structure shown by the equivalent circuit of FIG. 9.

Figure 10:
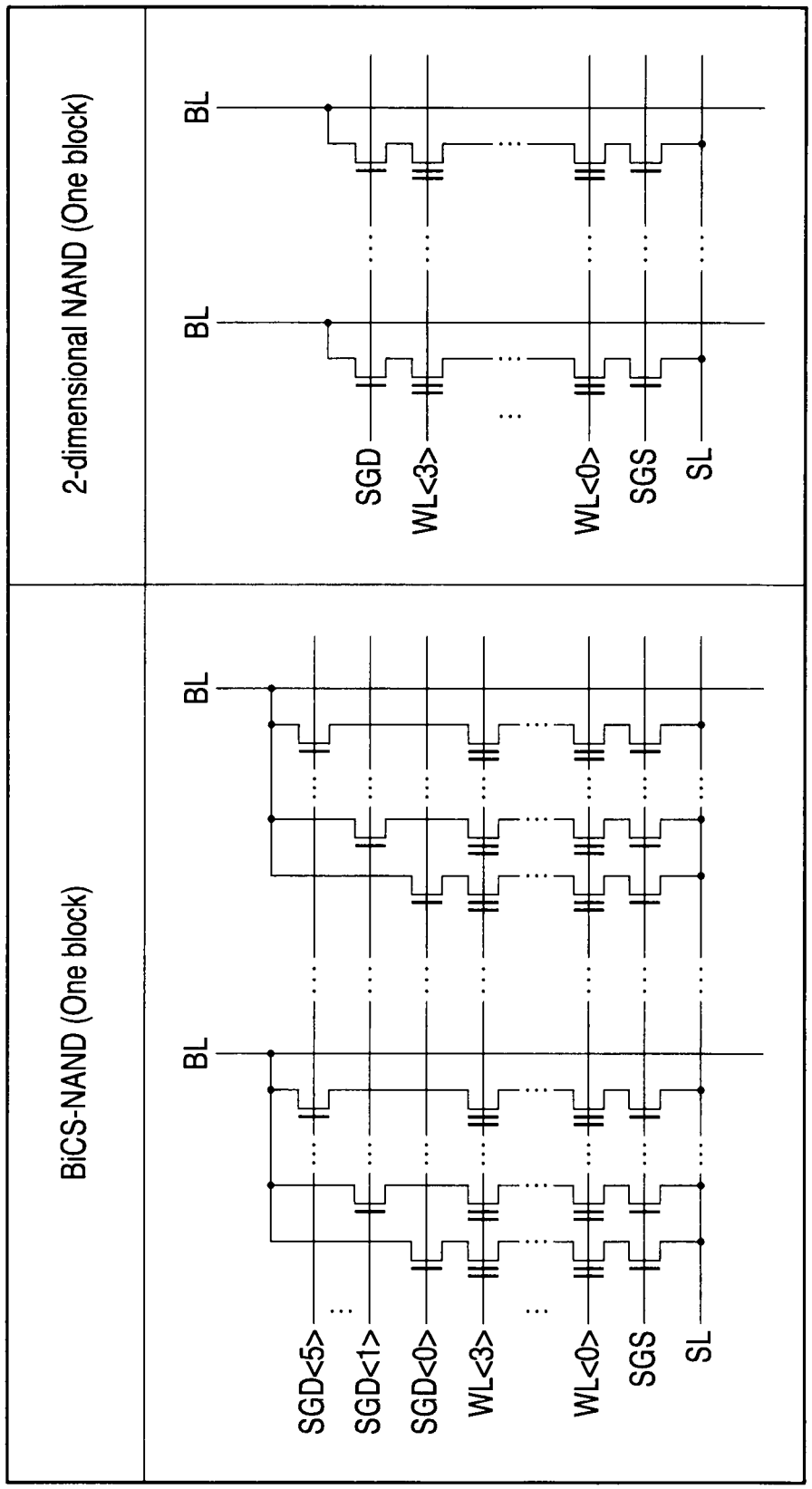
FIG. 10 is a diagram comparing a BiCS-NAND and a 2-dimensional NAND.

FIG. 10 is a diagram comparing BiCS-NAND and 2-dimensional NAND.

In the 2-dimensional-structure NAND flash memory (2-dimensional NAND), one NAND cell unit is provided in one block connected to one bit line BL. On the other hand, in BiCS-NAND flash memory, the NAND cell units are provided in one block connected to one bit line BL.

Accordingly, as described below, one of the cell units in one block connected to one bit line BL is selected by bit line-side select gate lines SGD<0>, ..., and SGD<5> in the write operation and read operation.

(3) Basic Operation

A basic operation of the BiCS-NAND flash memory of FIGS. 3 to 10 will be described below.

Because the write, read, and erase basic operations are identical to those of the 2-dimensional-structure NAND flash memory, a specific item of the BiCS-NAND flash memory will be described here.

The BiCS-NAND flash memory differs from the 2-dimensional-structure NAND flash memory in a concept of one block.

In the 2-dimensional-structure NAND flash memory, one NAND cell unit is provided in one block connected to one bit line. On the other hand, in BiCS-NAND flash memory, the NAND cell units are provided in one block connected to one bit line.

For example, in the plan view of FIG. 4, six NAND cell units (corresponding to the number of active layers AA in FIG. 4) are provided in block BK<i+1> connected to bit line BL<0>.

Accordingly, in the write operation and read operation, it is necessary to select one of the six NAND cell units in block BK<i+1> connected to bit line BL<0>.

The selection is performed by bit line-side select gate lines SGD<0>, ..., and SGD<5>. Bit line-side select gate lines SGD<0>, ..., and SGD<5> are connected to the six NAND cell units in the Y-direction of block BK<i+1>, respectively.

As with the 2-dimensional-structure NAND flash memory, for example, the erase operation is collectively performed to all the memory cells in one block.

The BiCS-NAND flash memory can be applied to both a binary memory in which binary data is stored in one memory cell and a multi-level memory in which multi-level data of three or more levels is stored in one memory cell.

(4) Block Layout

Figure 11:
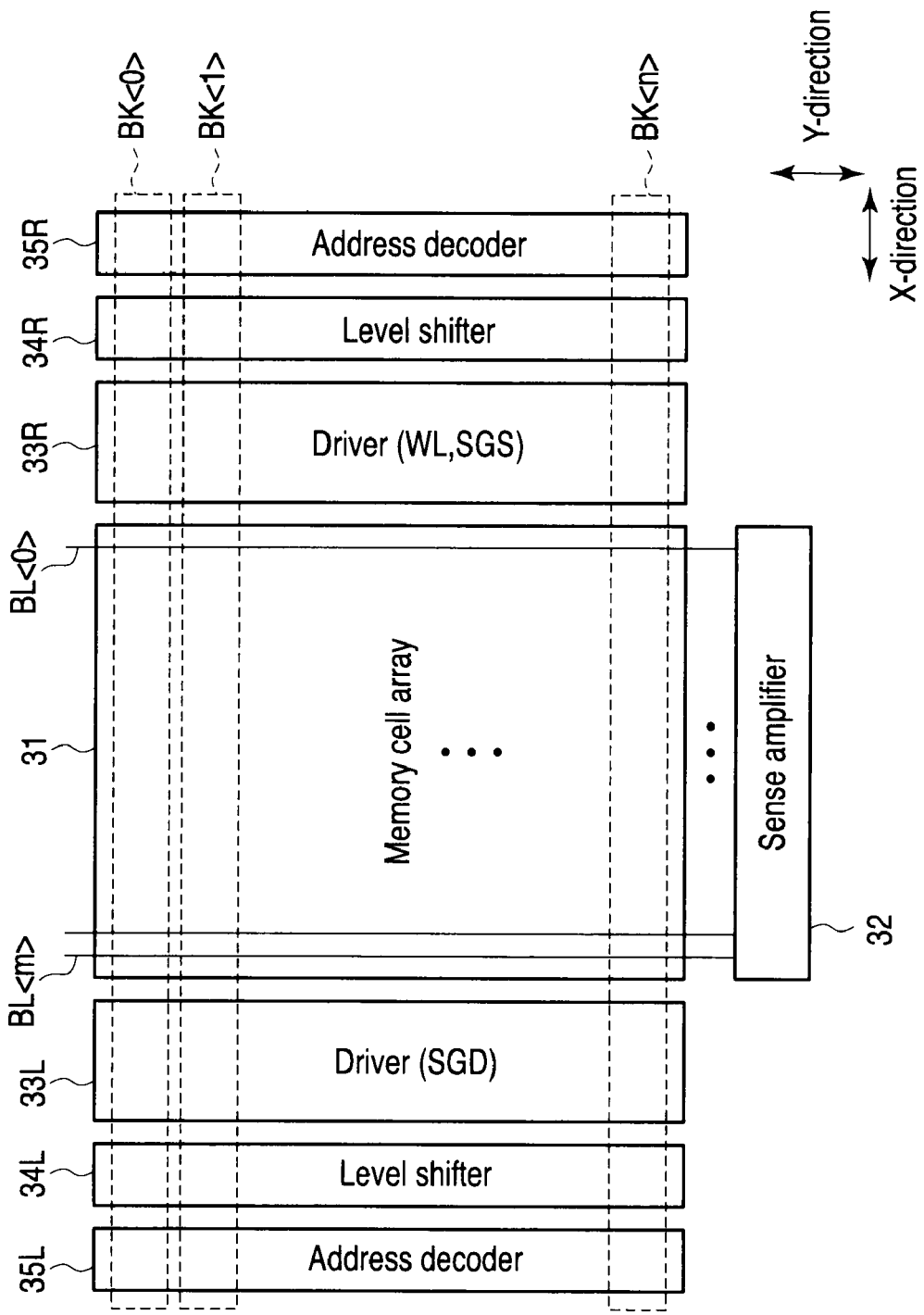
FIG. 11 is a diagram showing a first example of a block layout.

FIG. 11 shows a first example of a block layout of the BiCS memory.

For example, the block layout of FIG. 11 corresponds to the BiCS-NAND flash memory of FIG. 3, and the feature of the block layout in that the bit line-side select gate line driver is disposed at one end of the memory cell array while the word line driver and the source line-side select gate line driver are disposed on the other end of the memory cell array.

Driver 33L, level shifter 34L, and address decoder 35L are disposed at one end (left side) in the X-direction of memory cell array 31. Driver 33L drives bit line-side select gate line SGD and includes a transfer transistor.

Driver 33R, level shifter 34R, and address decoder 35R are disposed at one end (right side) in the X-direction of memory cell array 31. Driver 33R drives word line WL and source line-side select gate line SGS and includes the transfer transistor.

Sense amplifier 32 is disposed at one end in the Y-direction of memory cell array 31. Bit lines BL<0>, ..., and BL<m> extended in the Y-direction are disposed on memory cell array 31, and bit lines BL<0>, ..., and BL<m> are connected to sense amplifier 32.

Because the block layout corresponds to the BiCS-NAND flash memory of FIG. 3, bit line-side select gate lines SGD are disposed in blocks BK<0>, BL<1>, ..., and BK<n>, respectively. That is, because the driver that drives bit line-side select gate line SGD has a large area, the bit line-side select gate line driver is disposed at one end of memory cell array 32, apart from the word line driver and source line-side select gate line driver, which are disposed at the other end of memory cell array 32.

Figure 12:
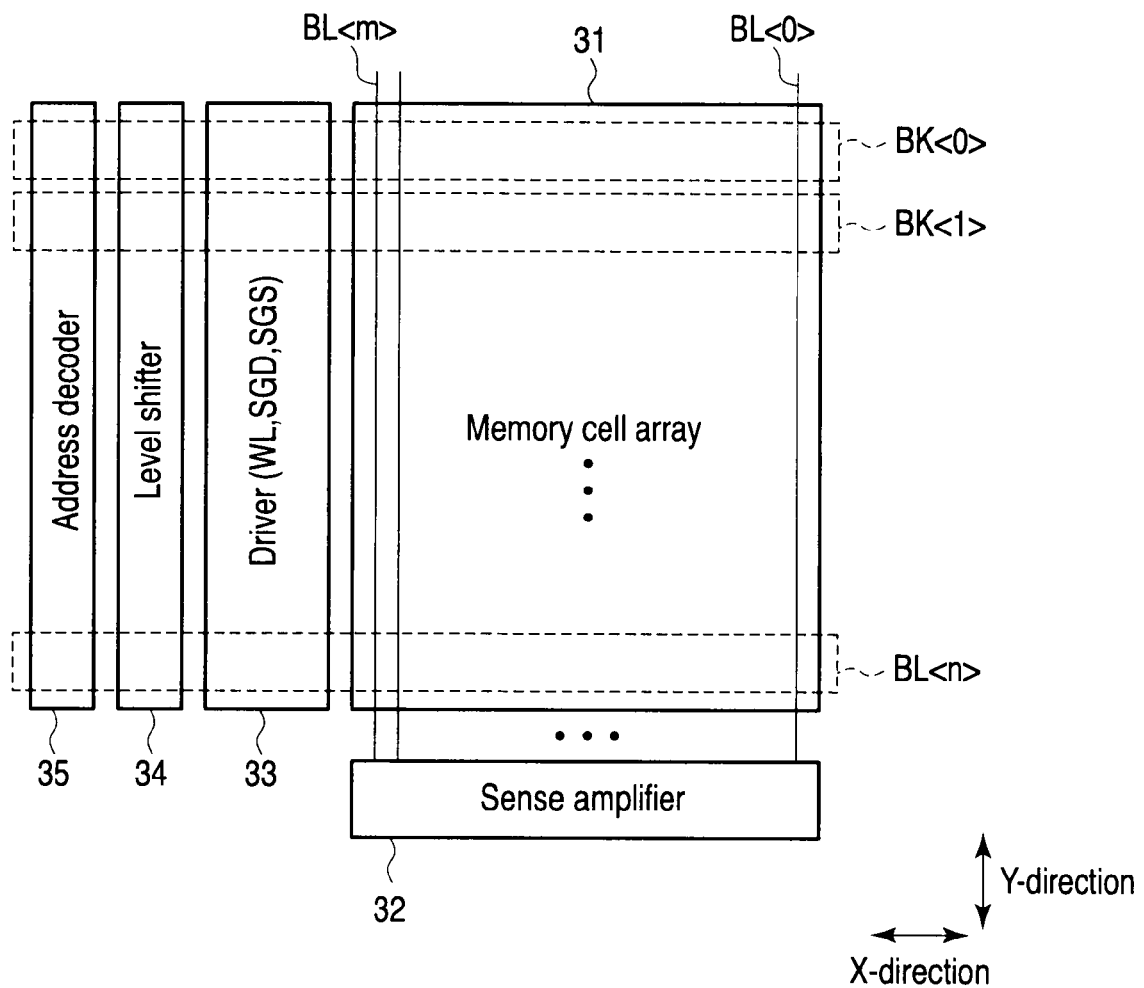
FIG. 12 is a diagram showing a second example of a block layout.

FIG. 12 shows a second example of the block layout of the BiCS memory.

When compared with the first example, the feature of the second example in that drivers 33 that drive word line WL, source line-side select gate line SGS, and bit line-side select gate line SGD are collectively disposed at one end of memory cell array 31.

Drivers 33, level shifter 34, and address decoder 35 are disposed at one end (left side) in the X-direction of memory cell array 31. Drivers 33 drive word line WL, source line-side select gate line SGS, and bit line-side select gate line SGD and include the transfer transistors.

Sense amplifier 32 is disposed at one end in the Y-direction of memory cell array 31. Bit lines BL<0>, ..., and BL<m> extended in the Y-direction are disposed on memory cell array 31, and bit lines BL<0>, ..., and BL<m> are connected to sense amplifier 32.

Drivers 33 that drive word line WL, source line-side select gate line SGS, and bit line-side select gate line SGD are collected, and therefore address decoder 34 and level shifter 35 can be also collected, which allows the layout of the peripheral circuit to be efficiently performed.

However, in the block layout of FIG. 12, memory cell array 31 is enlarged, and a pitch is narrowed in word line WL, source line-side select gate line SGS, and bit line-side select gate line SGD due to the finer memory cell, which results in a problem of signal delay caused by a parasitic capacitance.

Particularly, in the BiCS memory, because word line WL and source line-side select gate line SGS are formed into the plate shape, the parasitic capacitance is increased between the conductive lines, which causes a coupling noise.

FIG. 13 shows a third example of the block layout of the BiCS memory.

When compared with the second example, the feature of the third example in that two memory cell arrays 31L and 31R are provided. Word line WL, source line-side select gate line SGS, and bit line-side select gate line SGD in each memory cell array are shortened when the two memory cell arrays 31L and 31R are provided, so that the signal delay and the coupling noise can be suppressed.

Memory cell arrays 31L and 31R are disposed in parallel in the X-direction. Drivers 33L and 33R, level shifter 34, and address decoder 35 are disposed between memory cell arrays 31L and 31R. Drivers 33L and 33R drive word line WL, source line-side select gate line SGS, and bit line-side select gate line SGD and include the transfer transistors.

Each of sense amplifiers 32L and 32R is disposed at one end in the Y-direction of each of memory cell arrays 31L and 31R. Bit lines BL<0>, ..., and BL<m> extended in the Y-direction are disposed on memory cell arrays 31L and 31R, and bit lines BL<0>, ..., and BL<m> are connected to sense amplifiers 32L and 32R.

In the block layout of FIG. 13, although level shifter 34 and address decoder 35 are shared by two memory cell arrays 31L and 31R, driver 33L is provided with respect to memory cell array 31L, and driver 33R is provided with respect to memory cell array 31R.

The reason drivers 33L and 33R cannot be shared by two memory cell arrays 31L and 31R is that a wiring layout connecting memory cell arrays 31L and 31 and drivers 33L and 33R becomes complicated because of many transistor constituting drivers 33L and 33R. That is, when the driver is provided in each memory cell array, the wiring layout is simplified compared with when the driver is shared by the two memory cell arrays.

Figure 14:
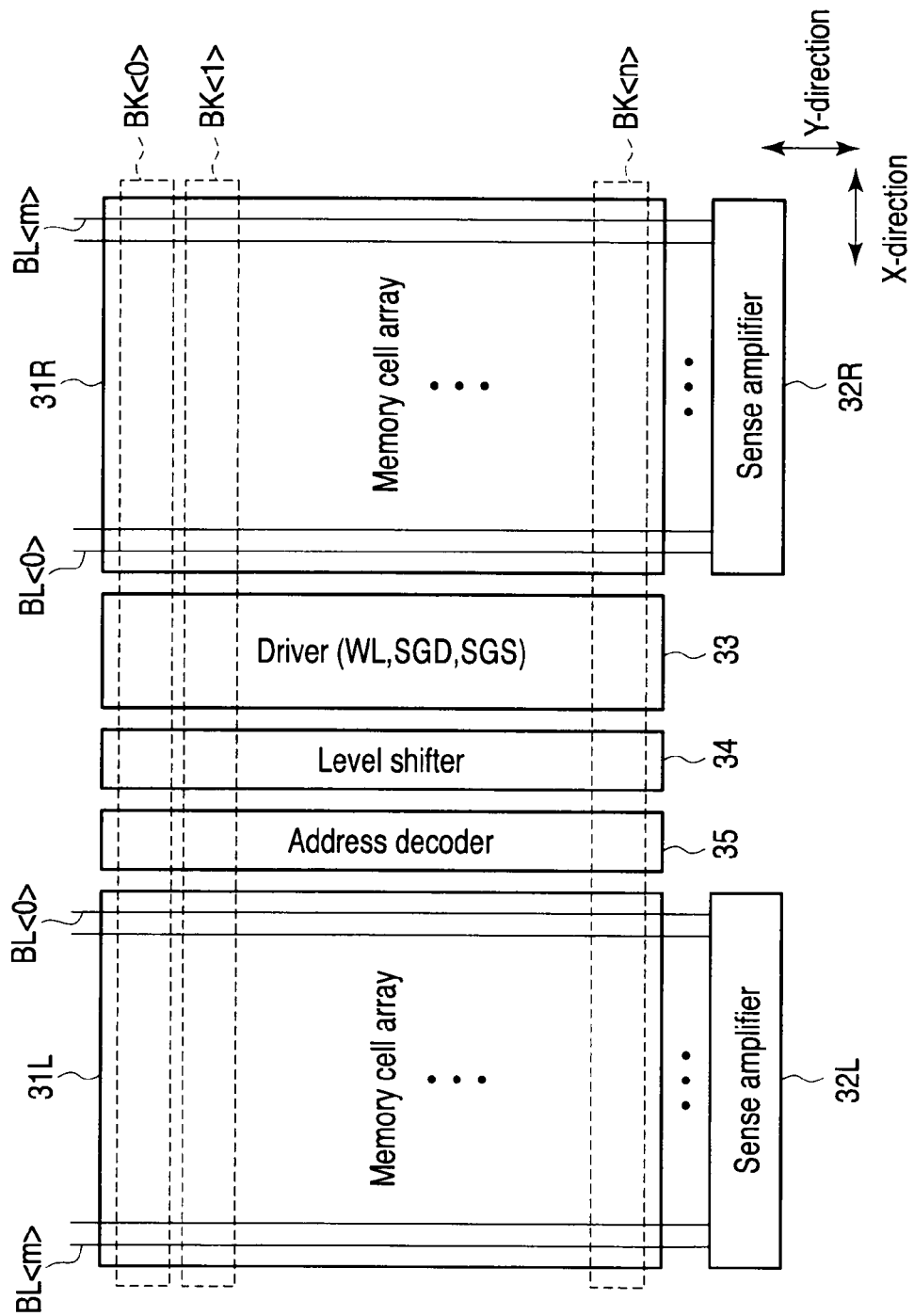
FIG. 14 is a diagram showing a fourth example of a block layout.

FIG. 14 shows a fourth example of the block layout of the BiCS memory.

When compared with the third example, the feature of the fourth example in that driver 33 that drives word line WL, source line-side select gate line SGS, and bit line-side select gate line SGD is shared by two memory cell arrays 31L and 31R.

Driver 33 is shared by two memory cell arrays 31L and 31R by reducing an area of driver 33, that is, by decreasing the number of transistors constituting driver 33. This is because the wiring layout connecting memory cell arrays 31L and 31 and drivers 33L and 33R is not complicated when the number of transistors is decreased. The number of transistors constituting driver 33 is decreased by sharing the bit line-side select gate lines in the blocks.

Memory cell arrays 31L and 31R are disposed in parallel in the X-direction. Driver 33, level shifter 34, and address decoder 35 are disposed between memory cell arrays 31L and 31R. Driver 33 drives word line WL, source line-side select gate line SGS, and bit line-side select gate line SGD and includes the transfer transistor.

Each of sense amplifiers 32L and 32R is disposed at one end in the Y-direction of each of memory cell arrays 31L and 31R. Bit lines BL<0>, ..., and BL<m> extended in the Y-direction are disposed on memory cell arrays 31L and 31R, and bit lines BL<0>, ..., and BL<m> are connected to sense amplifiers 32L and 32R.

In the block layout of FIG. 14, driver 33, level shifter 34, and address decoder 35 are shared by two memory cell arrays 31L and 31R.

When driver 33 can be shared by two memory cell arrays 31L and 31R without complicating the wiring layout, the fourth example becomes the most preferable block layout in the first to fourth examples.

(5) Layout of Bit Line-Side Select Gate Line

Figure 15:
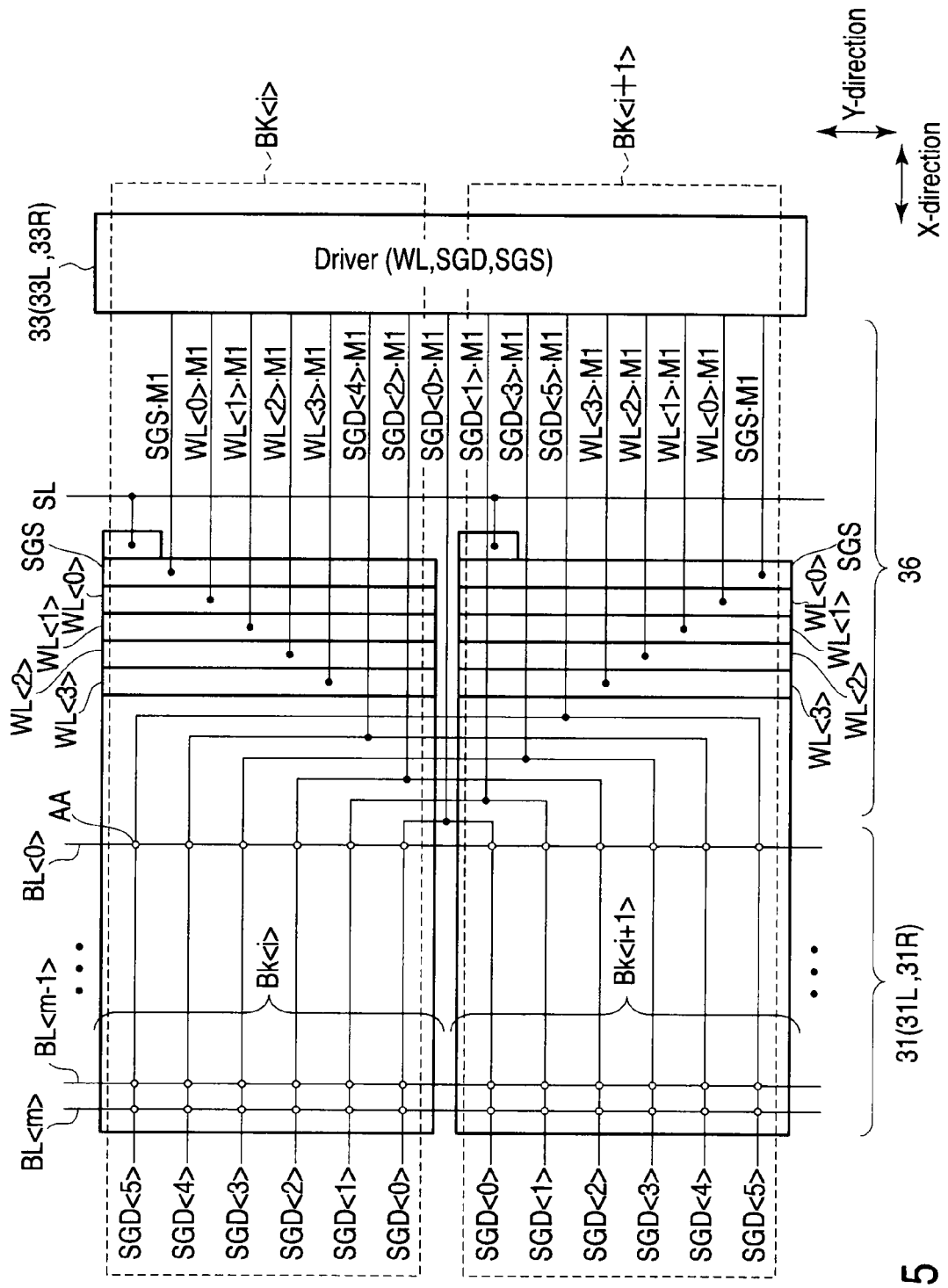
FIG. 15 is a diagram showing a layout of a bit line side select gate line.
Figure 16:
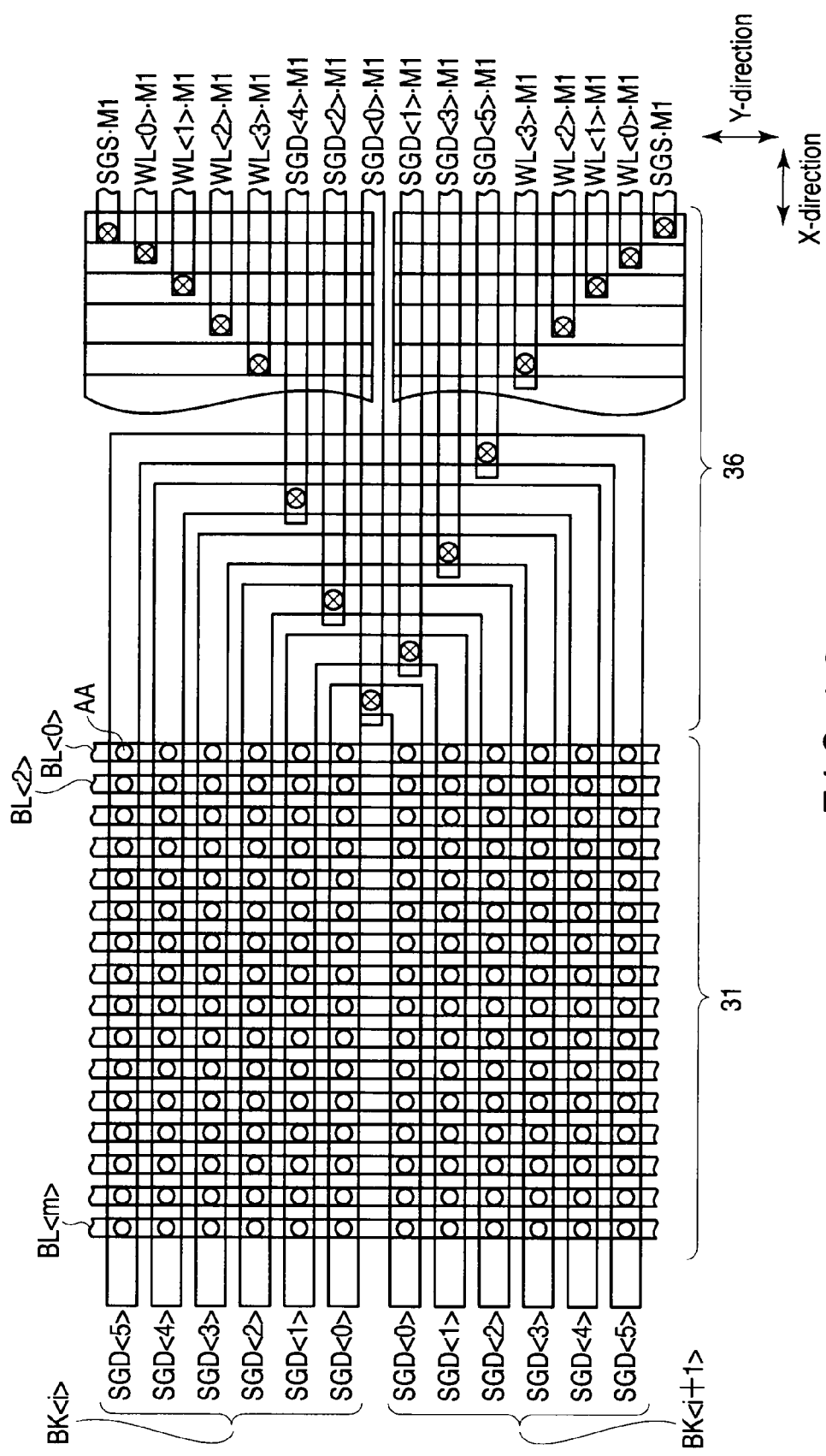
FIG. 16 is a plane view showing a device structure of FIG. 15.

FIG. 15 is a conceptual view showing a layout of the bit line-side select gate line. FIG. 16 shows a planar layout when the conceptual view of FIG. 15 is implemented into a specific device.

The example of FIGS. 15 and 16 corresponds to the block layout of FIGS. 12 to 14. That is, driver 33 (33L and 33R) disposed at one end (right side) in the X-direction of memory cell array 31 is connected to word lines WL<0>, ..., and WL<3>, source line-side select gate line SGS, and bit line-side select gate lines SGD<0>, ..., and SGD<5>.

It should be noted that the layout of FIGS. 15 and 16 is directly applied between memory cell array 31L and driver 33L of FIG. 13 and between memory cell array 31L and driver 33 of FIG. 14.

A layout in which the layout of FIGS. 15 and 16 is mirror-reversed is applied between memory cell array 31 and driver 33 of FIG. 12, between memory cell array 31R and driver 33R of FIG. 13, and between memory cell array 31R and driver 33 of FIG. 14.

Each of two blocks BK<i> and BK<i+1> includes three or more conductive layers, bit lines BL<0>, ..., and BL<m>, and active layers (semiconductor column) AA. The three or more conductive layers are stacked on the semiconductor substrate while insulated from one another. Bit lines BL<0>, ..., and BL<m> are disposed on the three or more conductive layers while insulated from the conductive layers. Lower ends of active layers AA are connected to the semiconductor substrate, upper ends of active layers AA are connected to bit lines BL<0>, ..., and BL<m>, and active layers AA penetrate through the three or more conductive layers.

In the three or more conductive layers, the uppermost layer includes bit line-side select gate lines SGD<0>, ..., and SGD<5>, the lowermost layer includes source line-side select gate line SGS, and remaining conductive layers except for the uppermost layer and lowermost layer include word lines WL<0>, ..., and WL<3>.

In the example of FIGS. 15 and 16, six bit line-side select gate lines SGD<0>, ..., and SGD<5> are provided in one block, and four word lines WL<0>, ..., and WL<3> are provided in one block. However, the number of bit line-side select gate lines and the number of word lines are not limited to the example of FIGS. 15 and 16. That is, one or more bit line-side select gate lines may be provided in one block, and one or more word lines may be provided in one block.

In the three or more conductive layers, the conductive layer except for the uppermost layer are formed into the plate shape in which a width in the Y-direction is larger than a width in the Y-direction of each of bit line-side select gate lines SGD<0>, and SGD<5>.

Bit line-side select gate lines SGD<0>, ..., and SGD<5> and active layer AA constitute the bit line-side select gate transistor, and source line-side select gate line SGS and active layer AA constitute the source line-side select gate transistor. Word lines WL<0>, and WL<3> and active layer AA constitute the memory cell.

A region between memory cell array 31 (31L and 31R) and driver 33 (33L and 33R) constitutes extraction portion 36 in which extraction lines (conductive lines) WL<0>·M1, ..., and WL<3>·M1, SGS·M1, SGD<0>·M1, ..., and SGD<5>·M1 are disposed to connect memory cell array 31 and driver 33.

At this point, bit line-side select gate lines SGD<0>, and SGD<5> in block BK<i> and bit line-side select gate lines SGD<0>, and SGD<5> in block BK<i+1> are connected to driver 33 (33L and 33R) while commonly connected one-on-one at one end (right side) in the X-direction of memory cell array 31.

Specifically, the i-th (i is a natural number) bit line-side select gate lines from the block BK<i+1> side in bit line-side select gate lines SGD<0>, and SGD<5> of block BK<i> are commonly connected to i-th bit line-side select gate lines from the block BK<i> side in bit line-side select gate lines SGD<0>, and SGD<5> of block BK<i+1>.

Accordingly, bit line-side select gate lines SGD<0>, ..., and SGD<5> have a folded layout as a whole.

The folded layout can easily be formed by utilizing a sidewall mask technique of etching an underlying layer with a sidewall as a mask.

In the example of FIGS. 15 and 16, because bit line-side select gate lines SGD<0>, and SGD<5> in the two blocks disposed in parallel in the Y-direction are commonly connected one-on-one, the area of driver 33 (33L and 33R) that drives bit line-side select gate lines SGD<0>, ..., and SGD<5> is reduced. Accordingly, the area of the peripheral circuit can be reduced to contribute to the implementation of the BiCS memory.

In such cases, for bit line-side select gate lines SGD<0>, and SGD<5>, the same signal is supplied to two blocks BK<i> and BK<i+1>. However, as described above, there is no problem because the block can be selected by word lines WL<0>, and WL<3> and source line-side select gate line SGS.

In the example of FIGS. 15 and 16, although the number of extraction lines WL<0>·M1, WL<3>·M1, SGS·M1, SGD<0>·M1, ..., SGD<5>·M1 disposed at one end of memory cell array 31 (31L and 31R) is increased, because extraction lines WL<0> M1, WL<3>·M1, ..., SGS·M1, SGD<0>·M1, SGD<5>·M1 are sufficiently accommodated in a size in the Y-direction of each of two blocks BK<i> and BK<i+1>, the layout of extraction lines WL<0>·M1, ..., WL<3>·M1, SGS·M1, SGD<0>·M1, ..., SGD<5>·M1 is not complicated.

In the example of FIGS. 15 and 16, two blocks BK<i> and BK<i+1> are disposed adjacent to each other. Alternatively, another block may be disposed between two blocks BK<i> and BK<i+1>. In the example of FIGS. 15 and 16, the bit line-side select gate line is shared by two blocks BK<i> and BK<i+1>. Alternatively, the bit line-side select gate line may be shared by three or more blocks or all the blocks in the memory cell array.

Figure 17:
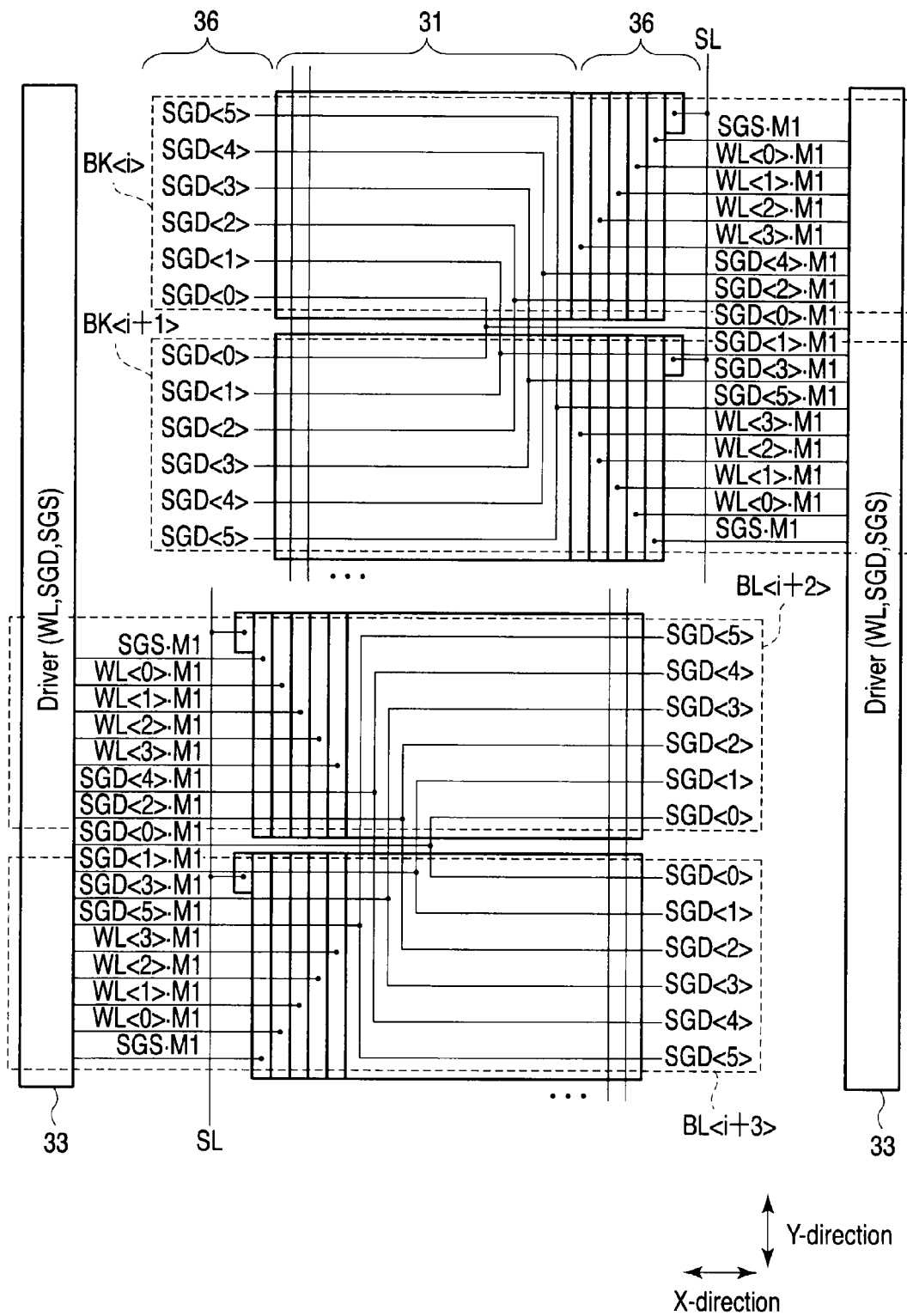
FIG. 17 is a diagram showing a layout of a bit line side select gate line.

FIG. 17 shows a layout in which the drivers are disposed on both sides of the memory cell array.

As shown in FIG. 17, when drivers 33 are disposed on both sides of memory cell array 31, for example, a size in the Y-direction of driver 33 per one block can be enlarged (the number of transistors can be increased), and therefore a size in the X-direction of driver 33 can be narrowed (the number of transistors can be decreased). Therefore, the layout of extraction lines (conductive lines) WL<0>·M1, ..., and WL<3>·M1, SGS·M1, SGD<0>·M1, ..., and SGD<5>·M1 is further simplified in extraction portion 36.

A determination whether driver 33 (33L and 33R) is disposed on one side of memory cell array 31 (31L and 31R) as shown in FIGS. 12 to 14 or drivers 33 are disposed on both sides of memory cell array 31 as shown in FIG. 17 is made in consideration of specifications of the BiCS memory (chip) or area efficiency of the peripheral circuit.

(6) Conductive Layer Structure of Driver

Figure 18:
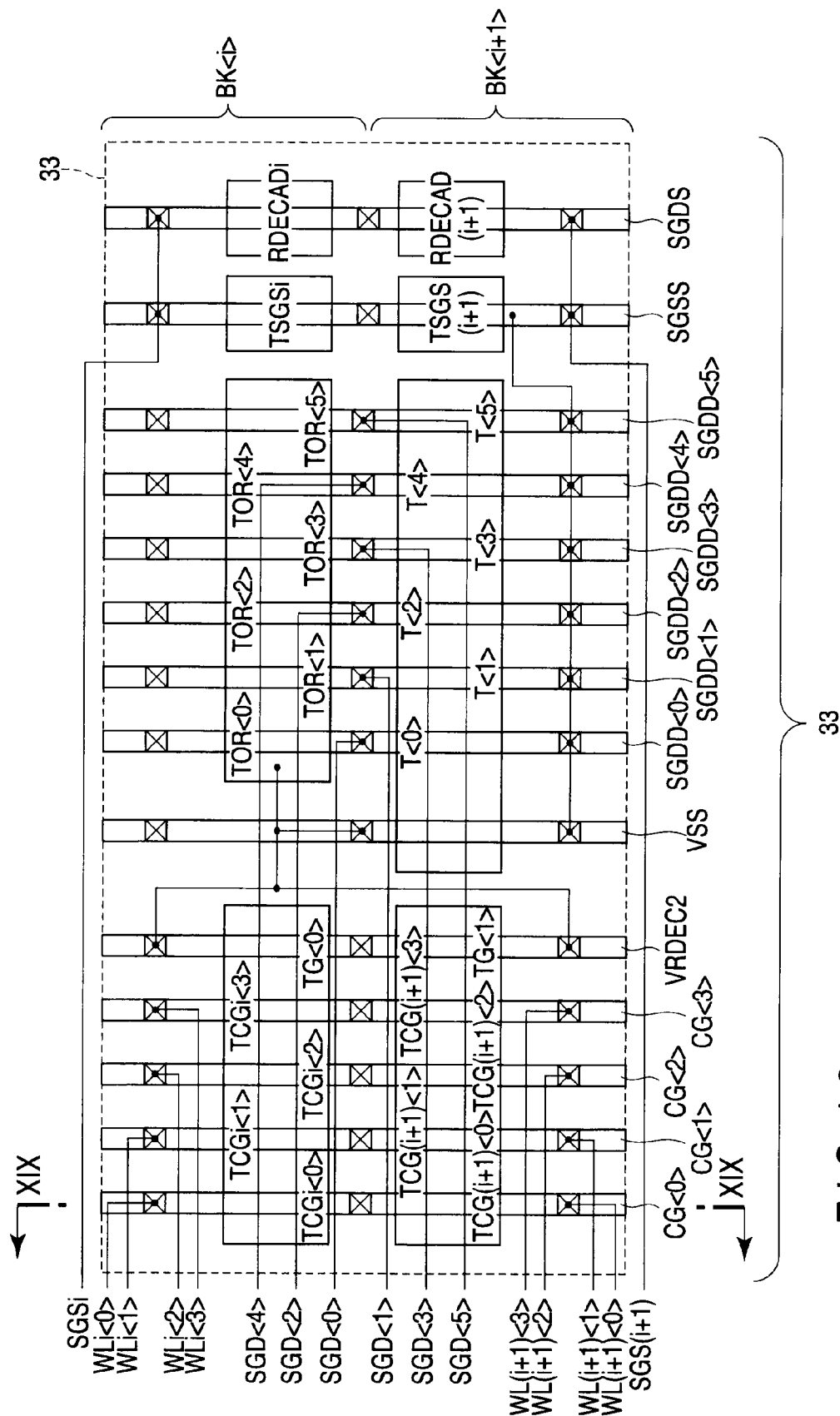
FIG. 18 is a plane view showing a layout of a driver.
Figure 19:
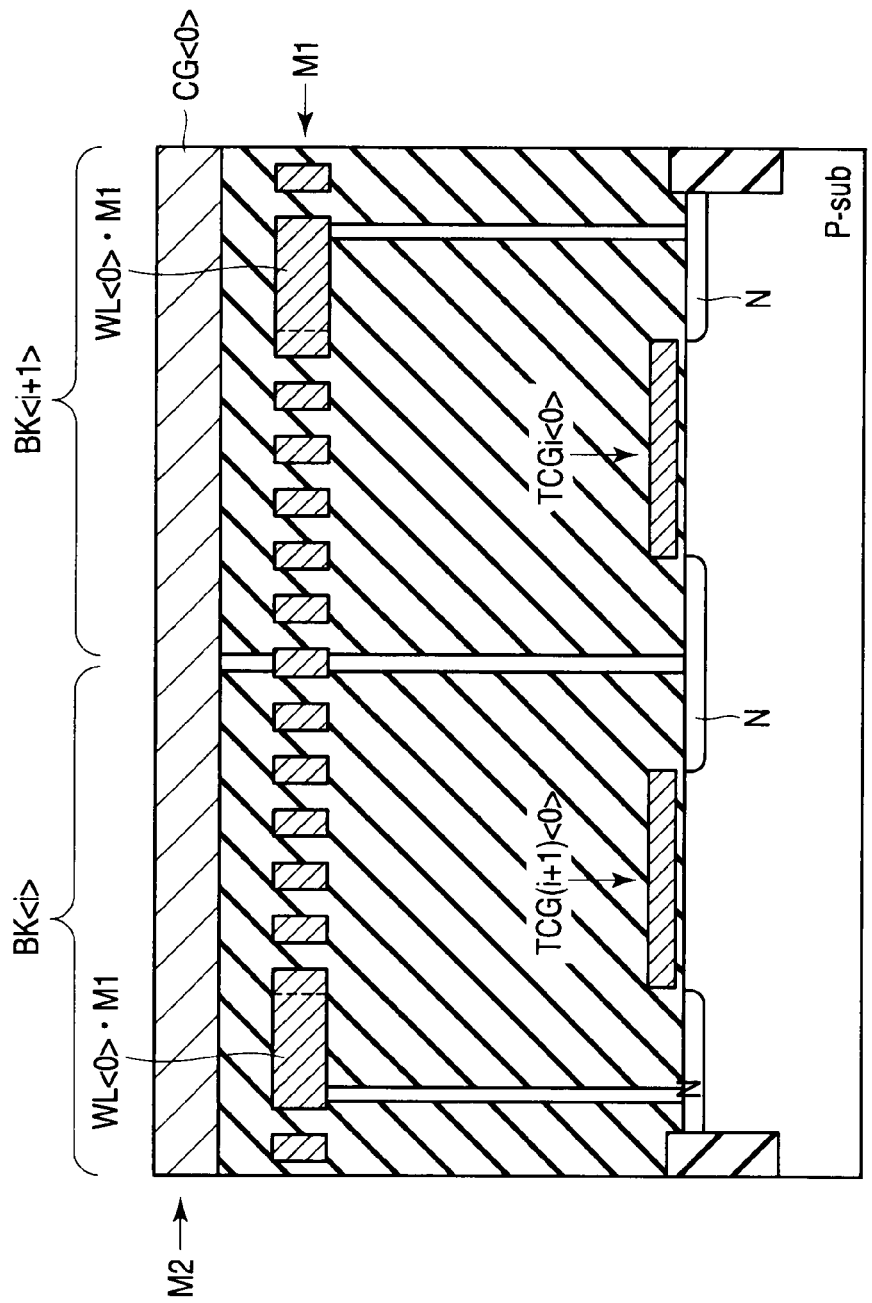
FIG. 19 is a cross sectional view along line XIX-XIX in FIG. 18.

FIG. 18 shows a first example of a conductive layer structure of the driver. FIG. 19 is a cross sectional view along a line XIX-XIX in FIG. 18.

In FIG. 18, two blocks BK<i> and BK<i+1> are shown while correlated with the layout of FIGS. 15 and 16.

Driver 33 includes a transfer transistor (high-voltage transistor) to which a high voltage is applied. Transfer transistor TCGi<3:0> connects conductive line CG<3:0> and word line WLi<3:0> in block BK<i>, and transfer transistor TCG(i+1)<3:0> connects conductive line CG<3:0> and word line WL(i+1)<3:0> in block BK<i+1>.

Transfer transistor TOR<5:0> connects conductive line SGDD<5:0> and bit line-side select gate line SGD<5:0> in blocks BK<i> and BK<i+1>, and transfer transistor T<5:0> connects conductive line SGDS and bit line-side select gate line SGD<5:0> in blocks BK<i> and BK<i+1>.

Transfer transistor Q connects ground line Vss and a gate terminal of transfer transistor TOR<5:0>. A gate terminal of transfer transistor Q is connected to the gate terminal of transfer transistor T<5:0>. Transfer transistor TG<0> connects conductive line VRDEC2 and the gate terminal of transfer transistor TOR<5:0>, and transfer transistor TG<1> connects conductive line VRDEC2 and the gate terminal of transfer transistor TOR<5:0>.

Transfer transistor TSGSi connects conductive line SGSS and source line-side select gate line SGSi in block BK<i>, and transfer transistor TSGS(i+1) connects conductive line SGSS and source line-side select gate line SGS(i+1) in block BK<i+1>.

Transfer transistor RDECADi connects conductive line SGDS and source line-side select gate line SGSi in block BK<i>, and transfer transistor RDECAD(i+1) connects conductive line SGDS and source line-side select gate line SGS(i+1) in block BK<i+1>.

Many conductive lines connect blocks BK<i> and BK<i+1> in the memory cell array and the transfer transistors in driver 33.

In such cases, as shown in the cross sectional view of FIG. 19, unless the conductive layer exists between transfer transistors TCGi<0> and TCG(i+1)<0> and first metal layer M1, the wiring is complicated to hardly connect the memory cell array and driver 33.

Figure 21:
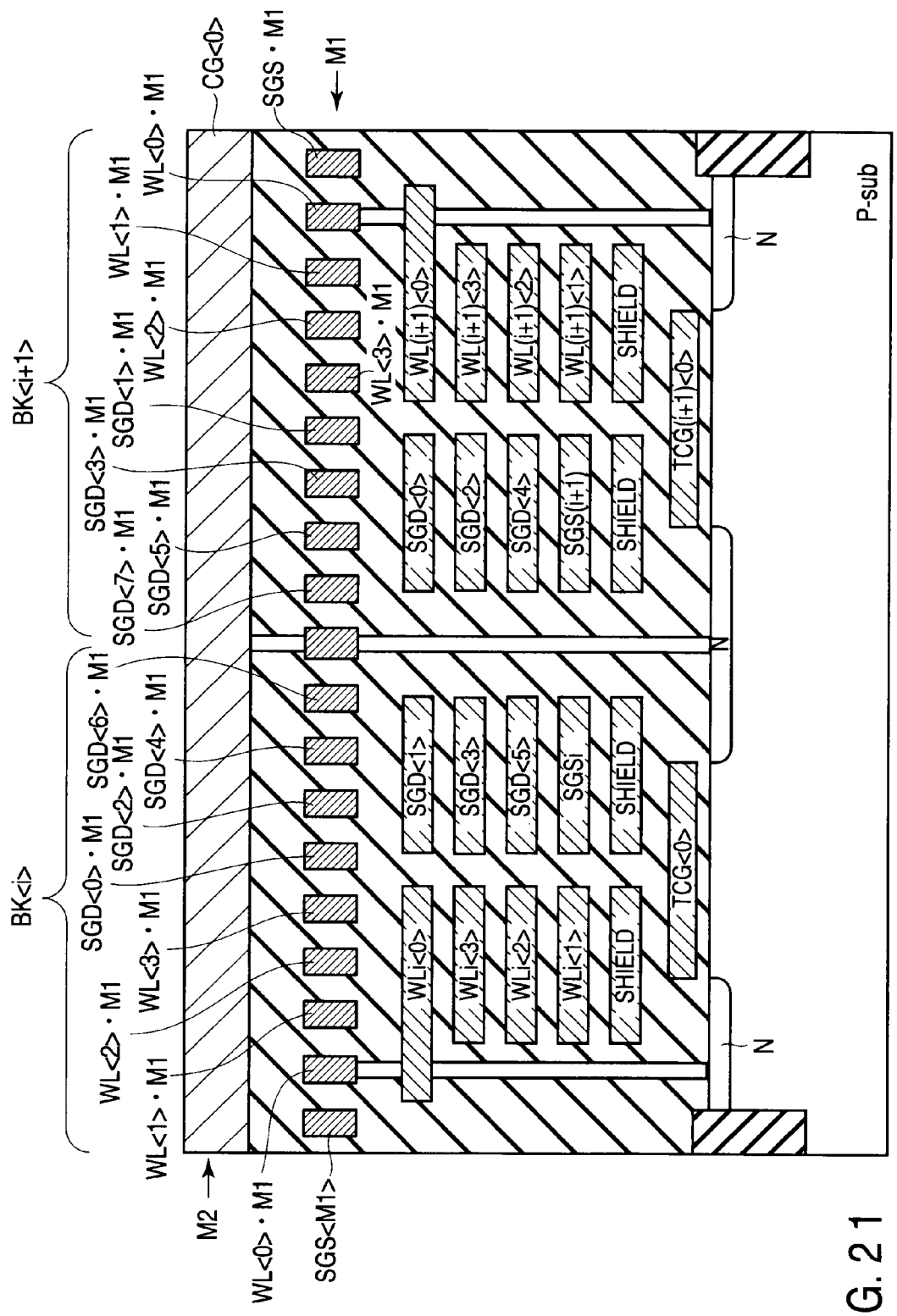
FIG. 21 is a cross sectional view along line XXI-XXI in FIG. 20.
Figure 22:
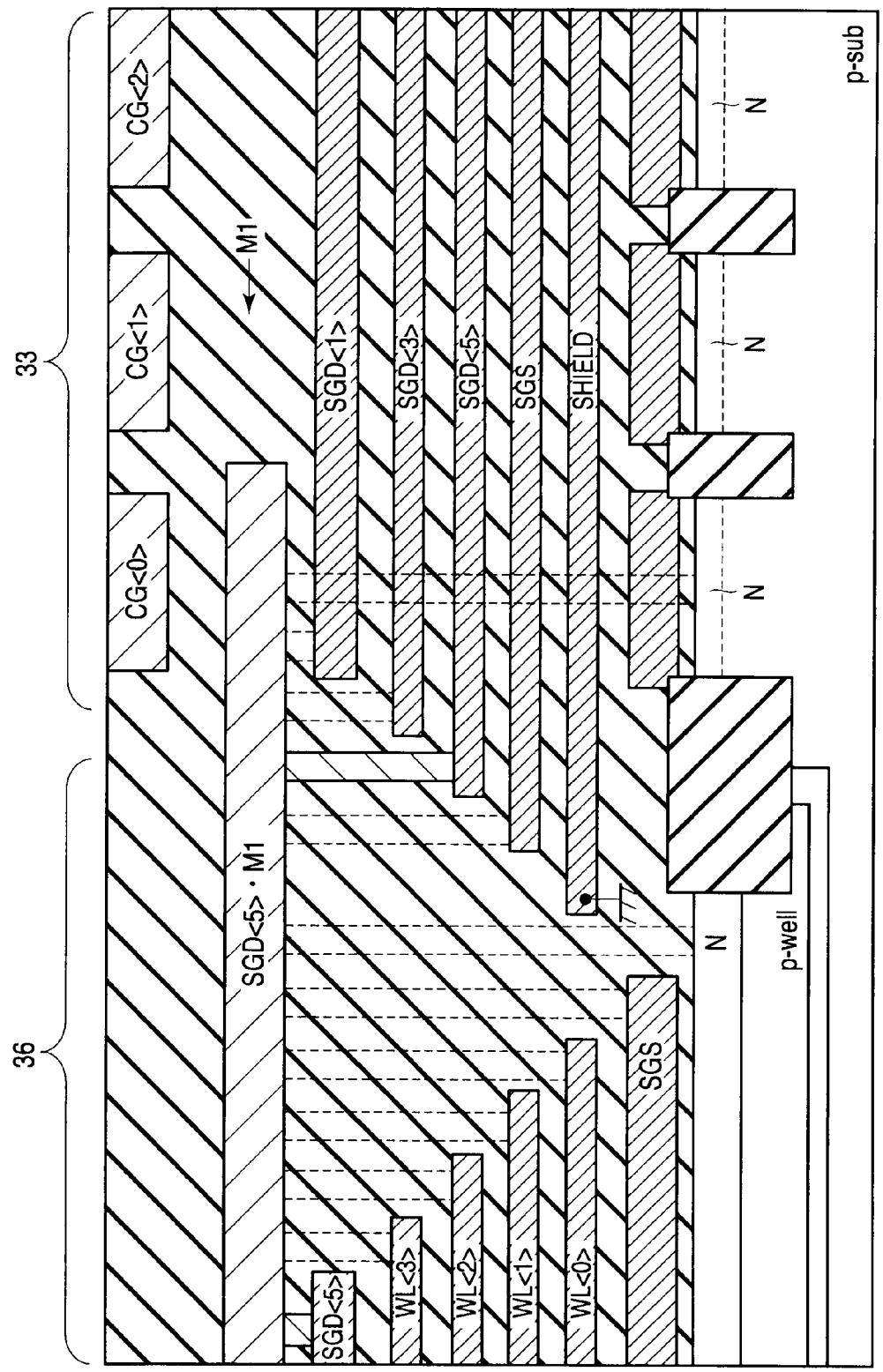
FIG. 22 is a cross sectional view along line XXII-XXII in FIG. 20.

FIG. 20 shows a second example of the conductive layer structure of the driver. FIG. 21 is a cross sectional view along a line XXI-XXI in FIG. 20, and FIG. 22 is a cross sectional view along a line XXII-XXII in FIG. 20.

In the second example, as with the first example, two blocks BK<i> and BK<i+1> are shown while correlated with the layout of FIGS. 15 and 16.

Driver 33 includes a transfer transistor (high-voltage transistor) to which a high voltage is applied. Transfer transistor TCGi<3:0> connects conductive line CG<3:0> and word line WLi<3:0> in block BK<i>, and transfer transistor TCG(i+1)<3:0> connects conductive line CG<3:0> and word line WL(i+1)<3:0> in block BK<i+1>.

Transfer transistor TOR<5:0> connects conductive line SGDD<5:0> and bit line-side select gate line SGD<5:0> in blocks BK<i> and BK<i+1>, and transfer transistor T<5:0> connects conductive line SGDS and bit line-side select gate line SGD<5:0> in blocks BK<i> and BK<i+1>.

Transfer transistor Q connects ground line Vss and the gate terminal of transfer transistor TOR<5:0>. The gate terminal of transfer transistor Q is connected to the gate terminal of transfer transistor T<5:0>. Transfer transistor TG<0> connects conductive line VRDEC2 and the gate terminal of transfer transistor TOR<5:0>, and transfer transistor TG<1> connects conductive line VRDEC2 and the gate terminal of transfer transistor TOR<5:0>.

Transfer transistor TSGSi connects conductive line SGSS and source line-side select gate line SGSi in block BK<i>, and transfer transistor TSGS(i+1) connects conductive line SGSS and source line-side select gate line SGS(i+1) in block BK<i+1>.

Transfer transistor RDECADi connects conductive line SGDS and source line-side select gate line SGSi in block BK<i>, and transfer transistor RDECAD(i+1) connects conductive line SGDS and source line-side select gate line SGS(i+1) in block BK<i+1>.

The second example differs from the first example in that three or more conductive layers L having the same structure as that of three or more conductive layers in blocks BK<i> and BK<i+1> are disposed on driver 33 in order to connect blocks BK<i> and BK<i+1> in the memory cell array and the transfer transistors in driver 33. At least bit line-side select gate line SGD<5:0> is connected to driver 33 using three or more conductive layers L.

In such cases, as shown in the cross sectional views of FIGS. 21 and 22, as the three or more conductive layers (in the second example, five conductive layers) are formed between transfer transistors TCGi<0> and TCG(i+1)<0> and first metal layer M1 like the inside of the memory cell array, so that the complication of the wiring can be suppressed to simplify the connection between the memory cell array and driver 33.

In the second example, the three or more conductive layers on driver 33 are used for word lines WLi<5:0> and WL(i+1)<5:0>, bit line-side select gate line SGD<5:0>, and source line-side select gate lines SGSi and SGS(i+1). The effect that the complicated wiring is suppressed can be obtained, when the conductive layers are used for at least one of word lines WLi<5:0> and WL(i+1)<5:0>, bit line-side select gate line SGD<5:0>, and source line-side select gate lines SGSi and SGS(i+1), for example, when the conductive layers are used for bit line-side select gate line SGD<5:0>.

In the second example, three or more conductive layers on driver 33 have the plate shape in which the width in a first direction in which blocks BK<i> and BK<i+1> are disposed is larger than the width in the first direction of the bit line-side select gate line in the memory cell array. However, the widths and patterns of the three or more conductive layers on driver 33 is not limited to the shape and can appropriately be changed from the viewpoint of simplification of design and production.

In the second example, in the three or more conductive layers on driver 33, the lowermost layer constitutes shield line SHIED that is fixed to ground potential Vss. Therefore, interference can be prevented between transfer transistors TCGi<0> and TCG(i+1)<0> and the three or more conductive layers formed on transfer transistors TCGi<0> and TCG(i+1)<0>. The interference between the signal lines can be prevented appropriately disposing shield line SHIELD in the three or more conductive layers on driver 33.

At least one of three or more conductive layers on driver 33 may be set to a dummy layer that is in an electrically floating state or a power supply layer that supplies a power supply potential (such as a positive power supply potential and a ground potential) to the memory cell array and the peripheral circuit.

The second example is based on the layout of FIGS. 15 and 16, that is, the layout in which the bit line-side select gate line is shared such that the bit line-side select gate line in block BK<i> and bit line-side select gate line in block BK<i+1> are connected to driver 33 while commonly connected one-on-one.

However, in the second example, the definite effect on the suppression of the complicated wiring is obtained for the device in which the bit line-side select gate line is not shared.

(7) Circuit Diagram of Driver

Figure 23:
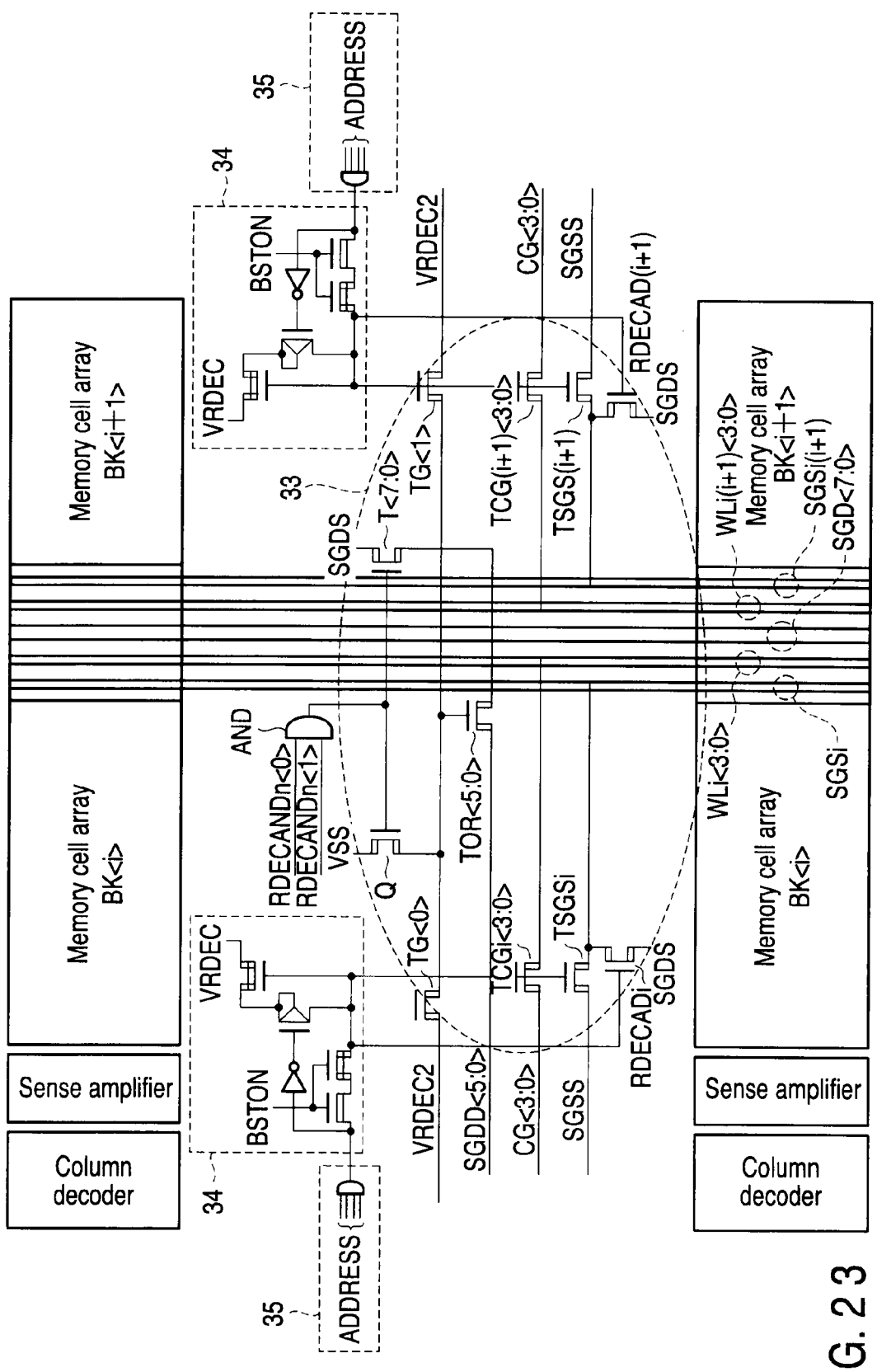
FIG. 23 is a diagram showing a circuit example of a driver.

FIG. 23 shows the detailed driver of the BiCS-NAND flash memory.

The driver of FIG. 23 corresponds to the layout of FIG. 14 and the structure of FIGS. 20 to 22.

In one block, it is assumed that the four word lines are provided (four layers), the six bit line-side select gate lines are provided (one layer), and one source line-side select gate line is provided (one layer).

Driver 33 includes a transfer transistor (high-voltage transistor) to which a high voltage is applied. Row decoder 35 includes an AND circuit and decodes address signal ADDRESS. Level shifter 34 is connected between driver 33 and row decoder 35.

BSTON, VRDEC, RDECANDn<0>, and RDEANDn<1> are control signals that control turn-on and turn-off of the transfer transistors, and SGDD<5:0>, CG<3:0>, SGSS, RDECADi, RDECAD(i+1), and SGDS are transfer voltages.

In the example of FIG. 23, 27 transfer transistors are necessary for two blocks BK<i> and BK<i+1>. Of the total,
  8 transfer transistors TCGi<3:0> and TOG(i+1)<3:0> for eight (=4 lines×2 blocks) word lines WL<3:0> in blocks BK<i> and BK<i+1>,
  15 transfer transistors TOR<5:0>, T<5:0>, TG<0>, TG<1>, and Q for 12 (=6 lines×2 blocks) bit line-side select gate lines SGD<5:0> in blocks BK<i> and BK<i+1>, and 4 transfer transistors TSGSi, TSGS(i+1), RDECADi, and RDECAD(i+1) for two (=1 line×2 blocks) source line-side select gate line SGS in blocks BK<i> and BK<i+1>.

In the example, 27 transfer transistors may be provided for the two blocks. That is, the increase in area of the peripheral circuit can be prevented in the BiCS-NAND flash memory in which the four word lines (four layers), six bit line-side select gate lines (one layer), and one source line-side select gate line (one layer) are provided in one block.

4. Resistance Change Memory (1) Layout Image

Figure 24:
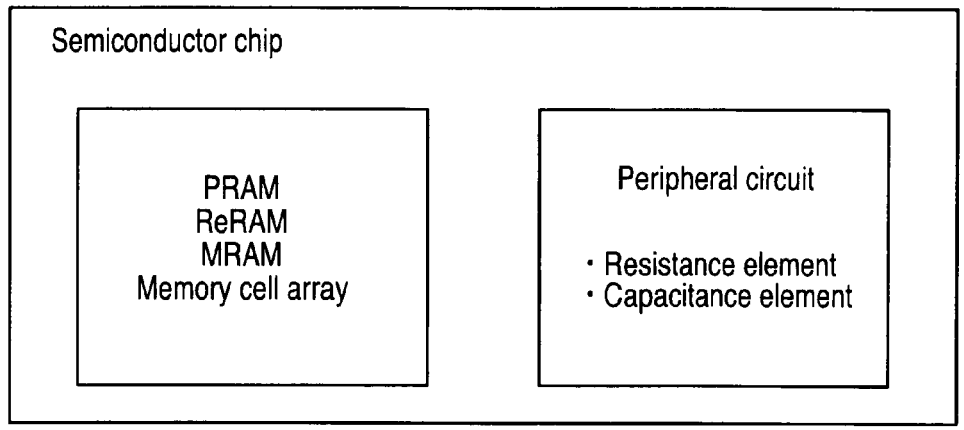
FIG. 24 is a diagram showing a layout image of a resistive memory.

FIG. 24 shows a layout image of the resistance change memory.

The memory cell array and the peripheral circuit are formed in the semiconductor chip. In the memory cell array, a resistance change element such as PRAM, ReRAM, and MRAM is used as the memory cell. For example, the memory cell is made of a phase change material memory cell in PRAM, magnetoresistive effect element is used as the memory cell in MRAM, and the memory cell is made of a resistance change material whose resistance value is changed by a voltage or a current in ReRAM.

In the example of the invention, the resistance element and capacitance element in the peripheral circuit are 3-dimensionally formed.

(2) Basic Structure

Figure 25:
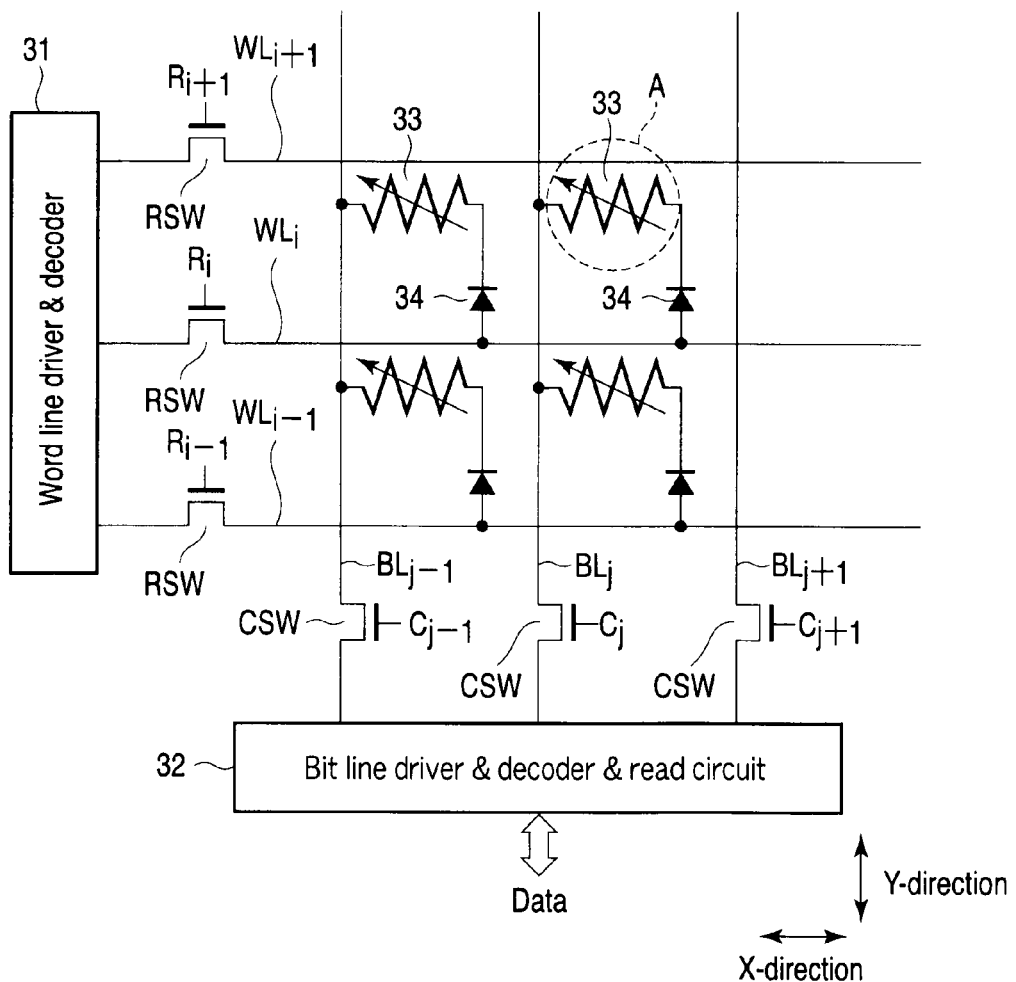
FIG. 25 is a diagram showing a memory cell array of a resistive memory.

FIG. 25 shows a cross-point type semiconductor memory.

Word lines WLi−1, WLi, and WLi+1 are extended in the X-direction, and bit lines BLj−1, BLj, and BLj+1 are extended in the Y-direction.

One end of each of word lines WLi−1, WLi, and WLi+1 is connected to word line driver and decoder 31 through MOS transistor RSW that is a selection switch, and one end of each of bit lines BLj−1, BLj, and BLj+1 is connected to bit line driver and decoder and read circuit 32 through MOS transistor CSW that is the selection switch.

Selection signals Ri−1, Ri, and Ri+1 are input into a gate of MOS transistor RSW in order to select one word line (row), and selection signals Ci−1, Ci, and Ci+1 are input into a gate of MOS transistor CSW in order to select one bit line (column).

Memory cell 33 includes the resistance change material such as PRAM, ReRAM, and MRAM and is disposed in a cross-point portion of word lines WLi−1, WLi, and WLi+1 and bit lines BLj−1, BLj, and BLj+1, that is, memory cell 33 has a so-called cross-point type cell array structure.

Diode 34 is added to memory cell 33 in order to prevent a sneak current during recording and reproduction.

FIG. 26 shows a structure of a memory cell array portion in the semiconductor memory of FIG. 25.

Word lines WLi−1, WLi, and WLi+1 and bit lines BLj−1, BLj, and BLj+1 are disposed on semiconductor chip 30, and memory cell 33 and diode 34 are disposed in the cross-point portion of these lines.

One of the features of the cross-point type cell array structure is that the cross-point type cell array structure is favorable to the high integration because the need to individually connect the MOS transistor to memory cells 33 is eliminated.

For example, as shown in FIG. 27, memory cell 33 having a stacked structure includes recording layer 22, protective layer 13B, and heater layer 35. One-bit data is stored in one memory cell 33. Diode 34 is disposed between word line WLi and memory cell 33.

Figure 28:
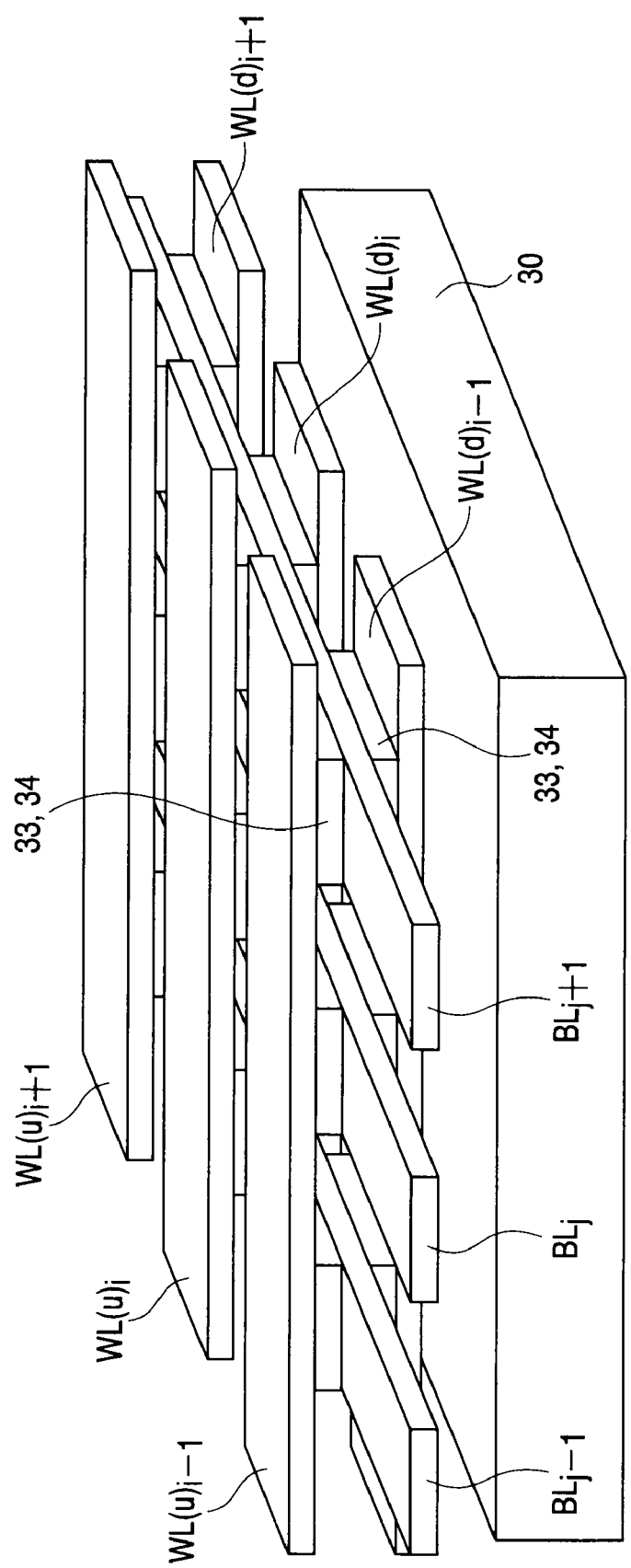
FIGS. 28 and 29 are diagrams, each showing a cross point type memory cell array.
Figure 29:
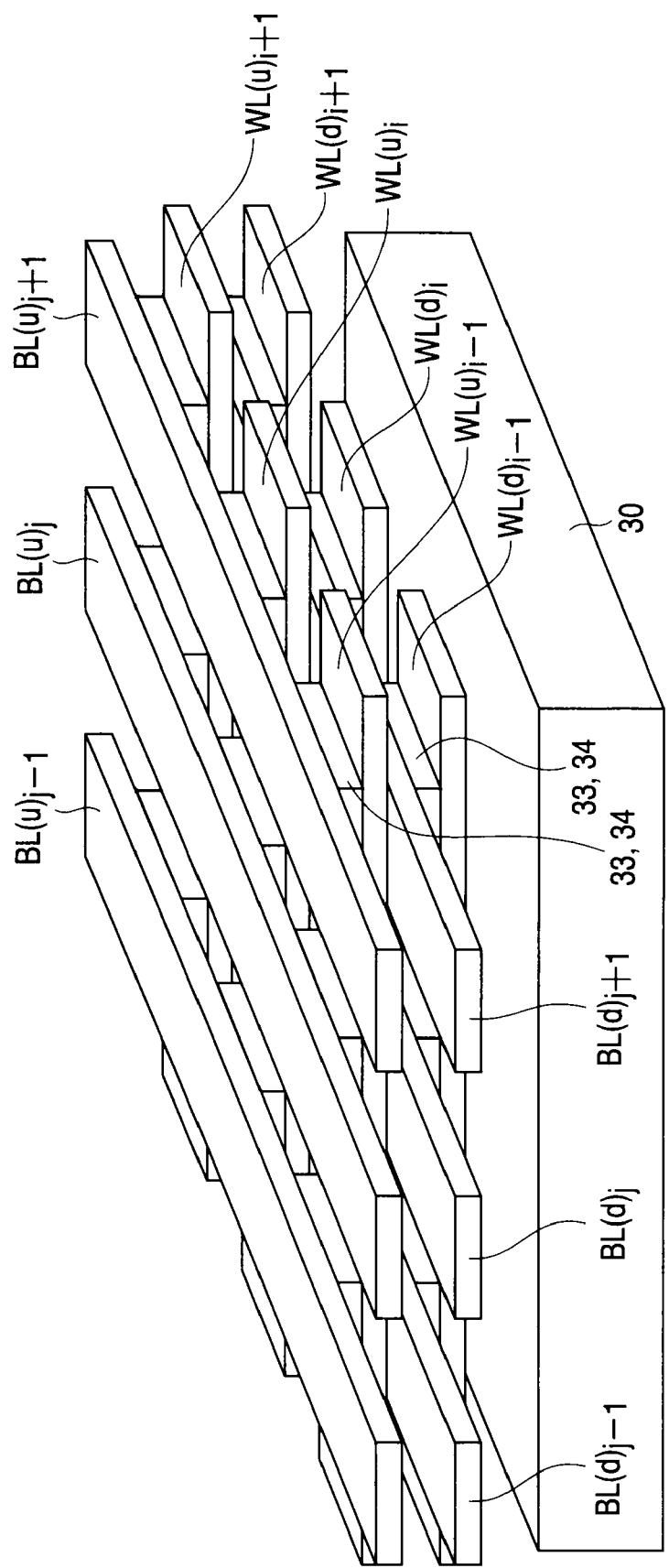

In the example of the invention, as shown in FIGS. 28 and 29, memory cells 33 are stacked to form the memory cell array into the 3-dimensional structure.

(3) Recording and Reproducing Operations

The recording and reproducing operations of ReRAM will be described with reference to FIGS. 25 to 27.

It is assumed that memory cell 33 surrounded by a dotted line A is selected and the recording and reproducing operations are performed to selected memory cell 33.

In the recording (setting operation), a voltage is applied to selected memory cell 33 to generate a potential gradient in memory cell 33, and a current pulse is passed through memory cell 33. Therefore, for example, memory cell 33 is put in a state in which a potential at word line WLi is relatively lower than a potential at bit line BLj. Assuming that bit line BLj is set to a fixed potential (for example, ground potential), a negative potential may be supplied to word line WLi.

In the recording, preferably a bias is applied to non-selected word lines WLi−1 and WLi+1 and non-selected bit lines BLj−1 and BLj+1 such that non-selected word lines WLi−1 and WLi+1 and non-selected bit lines BLj−1 and BLj+1 become the same potential.

Preferably all word lines WLi−1, WLi, and WLi+1 and all the bit lines BLj−1, BLj, and BLj+1 are precharged in a standby state before the recording.

The current pulse used in the recording may be generated by setting the potential at word line WLi relatively higher than the potential at bit line BLj.

The current pulse is passed through selected memory cell 33 surrounded by the dotted line A, and the resistance value of memory cell 33 is detected to perform the reproduction. However, it is necessary that the current pulse be set to such a minute extent that the resistance change is not generated in the material used for memory cell 33.

For example, a read current (current pulse) generated by a read circuit is passed through memory cell 33 surrounded by the dotted line A from bit line BLj, and the resistance value of memory cell 33 is measured with the read circuit.

Selected memory cell 33 surrounded by the dotted line A is heated by Joule heat generated by a large-current pulse, and oxidation-reduction reaction is promoted in memory cell 33 to perform the erase (reset) operation.

5. Resistance Element

A 3-dimensional-structure resistance element of the example of the invention will be described below.

The resistance element of the example of the invention includes the conductive layers stacked above the semiconductor substrate, which is made of a conductive polysilicon, and the metal layer is provided above the conductive layers. Each of the conductive layers includes conductive lines which are extended to the same direction.

(1) First Example

Figure 30:
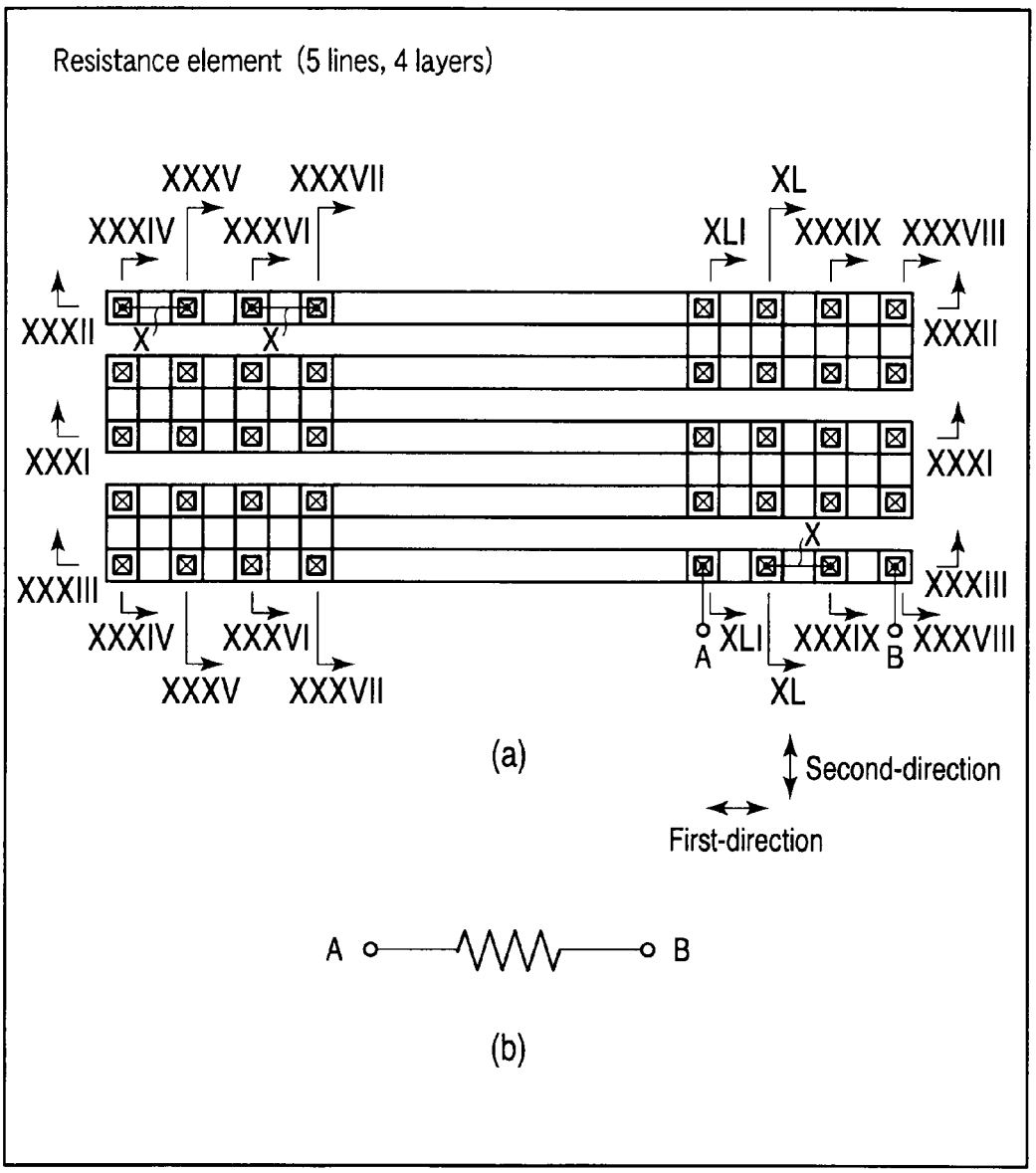
FIG. 30 is a plane view showing a first example of a resistance element.

FIG. 30 shows a resistance element according to a First example of the invention. FIG. 30A is a plan view of the semiconductor substrate, and FIG. 30B shows an equivalent circuit of FIG. 30A.

In the First example, it is assumed that the number of stacked conductive layers is set to four and the number of conductive lines in each conductive layer is set to five. The five conductive lines in each conductive layer are made of conductive polysilicon.

It is assumed that R<00>, R<01>, R<02>, R<03>, and R<04> are the five conductive lines of the first layer (lowermost layer), R<10>, R<11>, R<12>, R<13>, and R<14> are the five conductive lines of the second layer, and R<20>, R<21>, R<22>, R<23>, and R<24> are the five conductive lines of the third layer, and R<30>, R<31>, R<32>, R<33>, and R<34> are the five conductive lines of the fourth layer (uppermost layer).

The five conductive lines in each conductive layer are extended in the first direction. Preferably the conductive lines are disposed with a constant pitch in a second direction, and the widths in the second direction of the five conductive lines are equally set. A length in the first direction of the conductive line is gradually shortened from the lowermost layer toward the uppermost layer. That is, both ends of the four conductive layers have stairsteps respectively.

Figure 31:
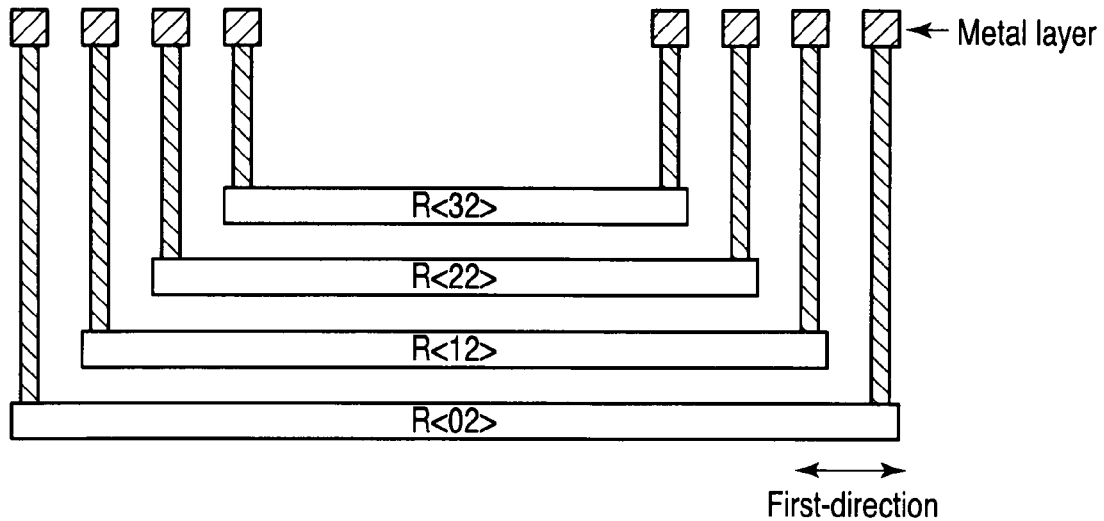
FIG. 31 is a cross sectional view along line XXXI-XXXI in FIG. 30.
Figure 32:
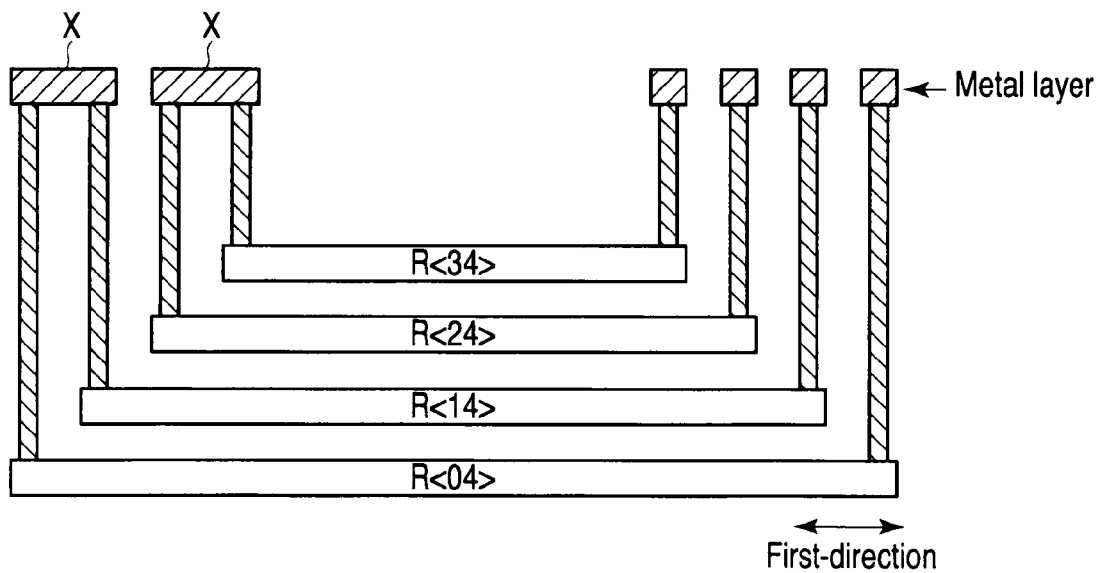
FIG. 32 is a cross sectional view along line XXXII-XXXII in FIG. 30.
Figure 33:
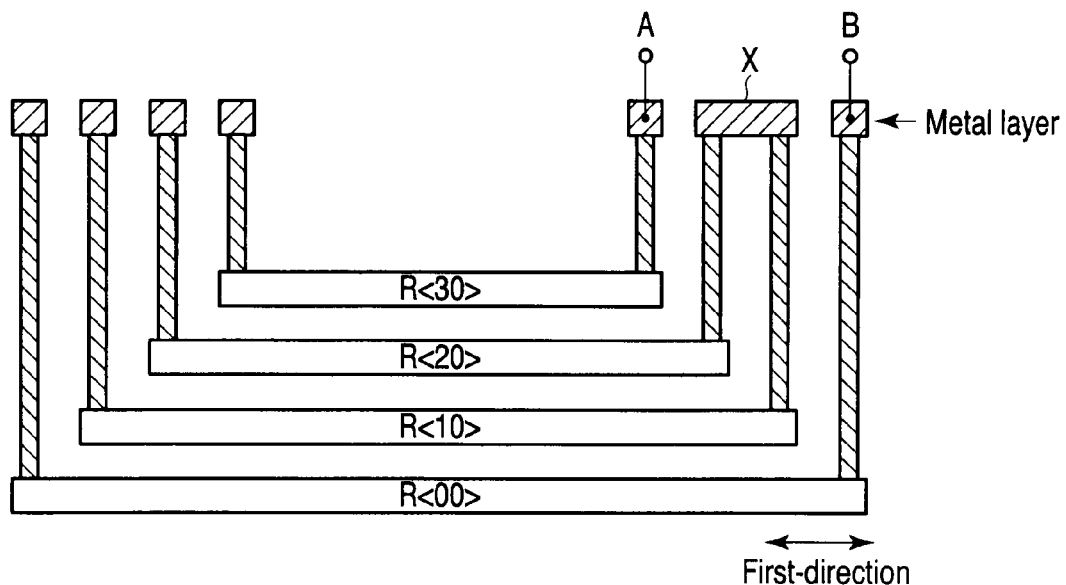
FIG. 33 is a cross sectional view along line XXXIII-XXXIII in FIG. 30.
Figure 34:
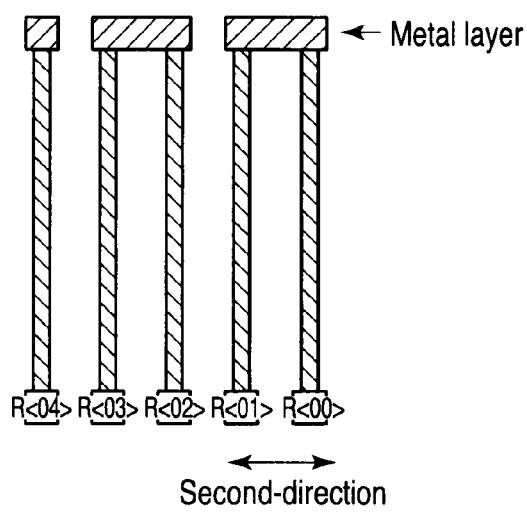
FIG. 34 is a cross sectional view along line XXXIV-XXXIV in FIG. 30.
Figure 37:
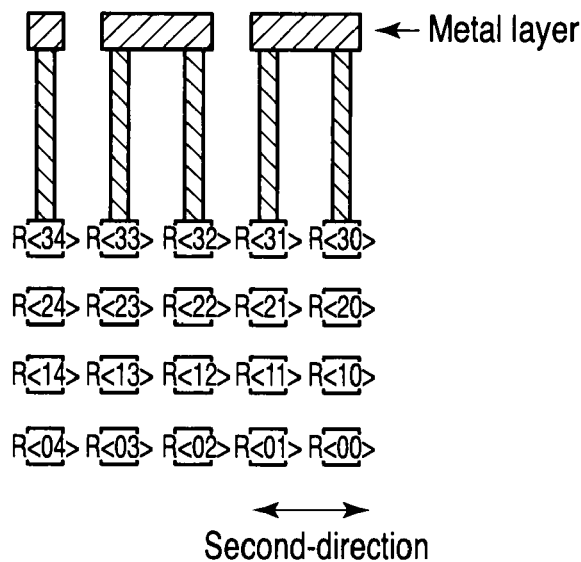
FIG. 37 is a cross sectional view along line XXXVII-XXXVII in FIG. 30.
Figure 38:
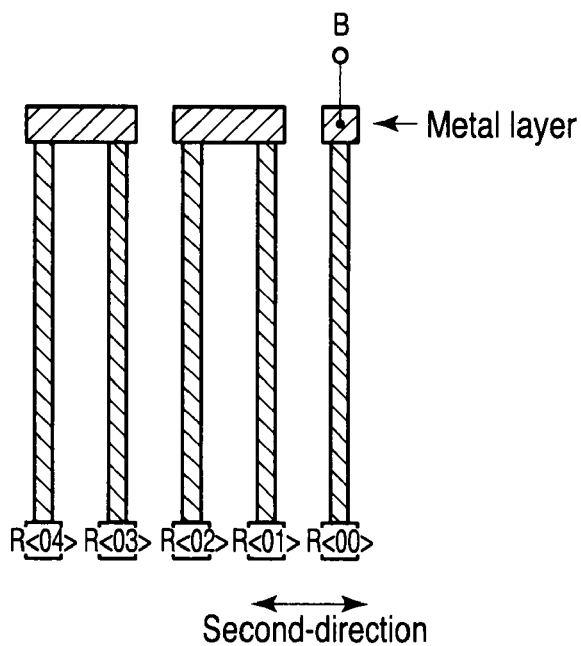
FIG. 38 is a cross sectional view along line XXXVIII-XXXVIII in FIG. 30.

FIGS. 31 to 33 show the state in which both ends (two end portions in the first direction) of the four conductive layers have stairsteps respectively. The four conductive layers are connected in series by a metal layer which is provided on the stairsteps. In the metal layer, a portion designated by the letter X expresses a line connecting the upper layer and the lower layer.

As shown in FIGS. 34 to 41, the five conductive lines in each conductive layer are connected in series by a metal layer which is provided on the stairsteps.

In the First example, because the number of stacked layers is an even number (four layers), two terminals A and B of the 3-dimensional-structure resistance element are drawn from one end side of the four conductive layers.

In the First example, both the ends of the four conductive layers have stairsteps respectively, and the four conductive layers are connected in series by the metal layer which is provided on the stairsteps, so that the resistance element that is matched with the semiconductor integrated circuit (such as BiCS-NAND, PRAM, ReRAM, and MRAM) having the 3-dimensional stacked layer structure can be implemented.

When the First example is applied to the resistance element in the peripheral circuit of BiCS-NAND, the four conductive layers are formed identical to the four conductive layers constituting word line WL<0>, WL<1>, WL<2>, and WL<3> of FIG. 3. Therefore, the 3-dimensional resistance element can be formed without adding a process.

When the First example is applied to the resistance element in the peripheral circuit of the resistance change memory, the four conductive layers are formed identical to the four conductive layers constituting word lines WL(d)i−1, WL(d)i, WL(d)i+1, WL(u)i−1, WL(u)i, and WL(u)i+1 and bit lines BL(d)j−1, BL(d)j, BL(d)j+1, BL(u)j−1, BL(u)j, and BL(u)j+1 of FIG. 29. Therefore, the 3-dimensional resistance element can be formed without adding a process.

Alternatively, in the four conductive layers, the word line may be made of CoSi or NiSi by a salicide process to lower a wiring resistance. In such cases, a process in which W, Co, and Ni are not stacked in the resistance element region or a process in which an insulating film is left on polysilicon such that a salicide reaction is not generated may be performed to each of the four conductive layers.

(2) Second Example

Figure 42:
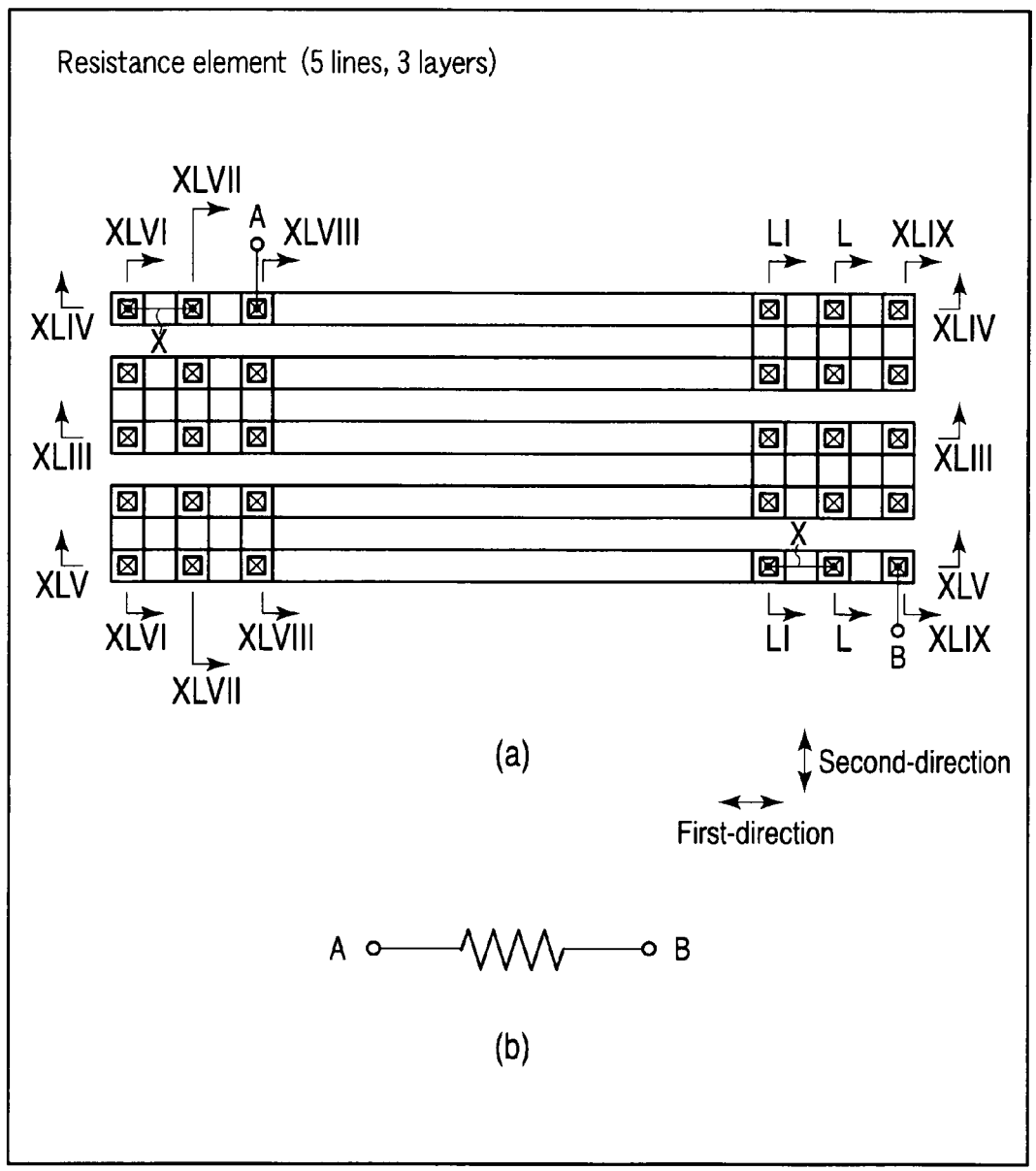
FIG. 42 is a plane view showing a second example of a resistance element.

FIG. 42 shows a resistance element according to a second example of the invention. FIG. 42A is a plan view of the semiconductor substrate, and FIG. 42B shows an equivalent circuit of FIG. 42A.

In the second example, it is assumed that the number of stacked conductive layers is set to three and the number of conductive lines in each conductive layer is set to five. The five conductive lines in each conductive layer are made of conductive polysilicon.

It is assumed that R<00>, R<01>, R<02>, R<03>, and R<04> are the five conductive lines of the first layer (lowermost layer), R<10>, R<11>, R<12>, R<13>, and R<14> are the five conductive lines of the second layer, and R<20>, R<21>, and R<22>, R<23>, and R<24> are the five conductive lines of the third layer (uppermost layer).

The five conductive lines in each conductive layer are extended in the first direction. Preferably the conductive lines are disposed with a constant pitch in the second direction, and the widths in the second direction of the five conductive lines are equally set. The length in the first direction of the conductive line is gradually shortened from the lowermost layer toward the uppermost layer. That is, both ends of the four conductive layers have stairsteps respectively.

Figure 43:
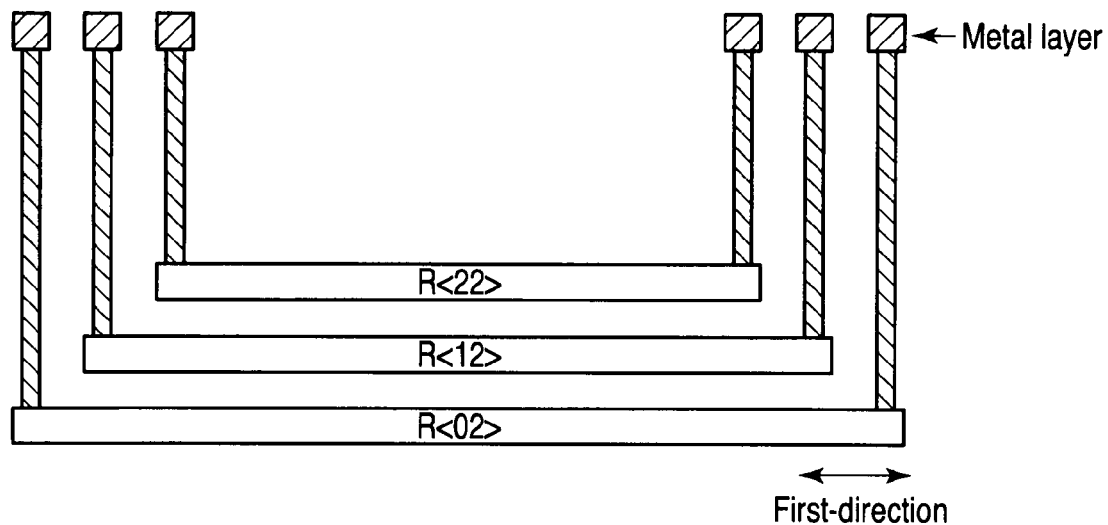
FIG. 43 is a cross sectional view along line XLIII-XLIII in FIG. 42.
Figure 44:
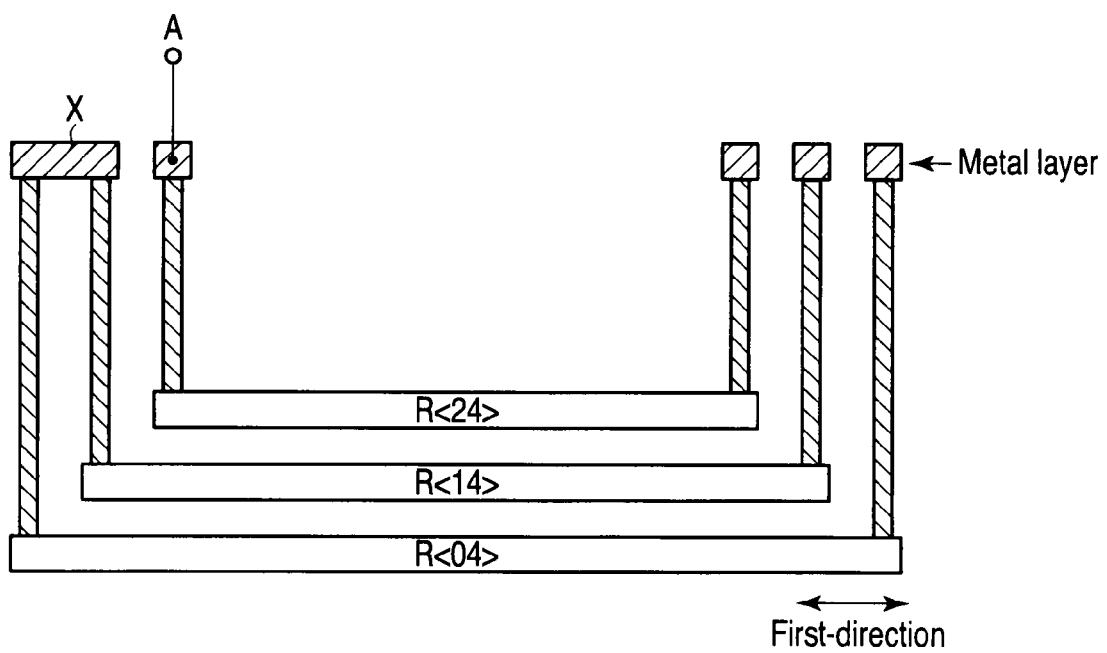
FIG. 44 is a cross sectional view along line XLIV-XLIV in FIG. 42.
Figure 51:
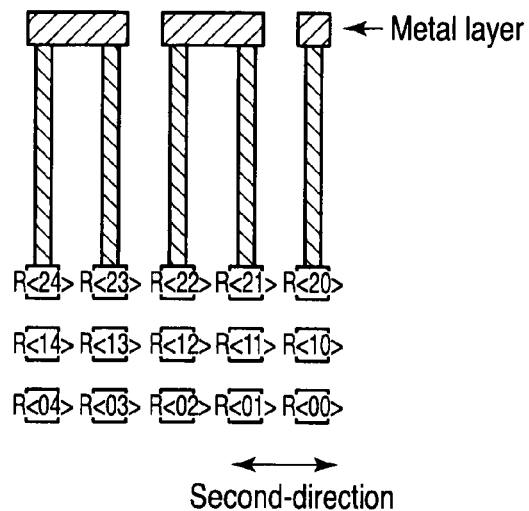
FIG. 51 is a cross sectional view along line LI-LI in FIG. 42.

FIGS. 43 to 45 show the state in which both ends (two end portions in the first direction) of the four conductive layers have stairsteps respectively. The four conductive layers are connected in series by the metal layer which is provided on the stairsteps. In the metal layer, the portion designated by the letter X expresses the line connecting the upper layer and the lower layer.

As shown in FIGS. 46 to 51, the five conductive lines in each conductive layer are connected in series by a metal layer which is provided on the stairsteps.

In the second example, because the number of stacked layers is an odd number (three layers), the terminal A of the 3-dimensional-structure resistance element is drawn from one end side of the four conductive layers, and the terminal B of the 3-dimensional-structure resistance element is drawn from the other end side of the four conductive layers.

In the second example, both the ends of the four conductive layers have stairsteps respectively, and the four conductive layers are connected in series by the metal layer which is provided on the stairsteps, so that the resistance element matched with the semiconductor integrated circuit (such as BiCS-NAND, PRAM, ReRAM, and MRAM) having the 3-dimensional stacked layer structure can be implemented.

When the second example is applied to the resistance element in the peripheral circuit of BiCS-NAND, the four conductive layers are formed identical to the four conductive layers constituting word line WL<0>, WL<1>, WL<2>, and WL<3> of FIG. 3. Therefore, the 3-dimensional resistance element can be formed without adding a process.

When the second example is applied to the resistance element in the peripheral circuit of the resistance change memory, the four conductive layers are formed identical to the four conductive layers constituting word lines WL(d)i−1, WL(d)i, WL(d)i+1, WL(u)i−1, WL(u)i, and WL(u)i+1 and bit lines BL(d)j−1, BL(d)j, BL(d)j+1, BL(u)j−1, BL(u)j, and BL(u)j+1 of FIG. 29. Therefore, the 3-dimensional resistance element can be formed without adding a process.

Alternatively, as with the First example, in the four conductive layers, the word line may be made of CoSi or NiSi by the salicide process to lower a wiring resistance. In such cases, the process in which W, Co, and Ni are not stacked in the resistance element region or the process in which the insulating film is left on polysilicon such that the salicide reaction is not generated may be performed to each of the four conductive layers.

(3) Third Example

Figure 52:
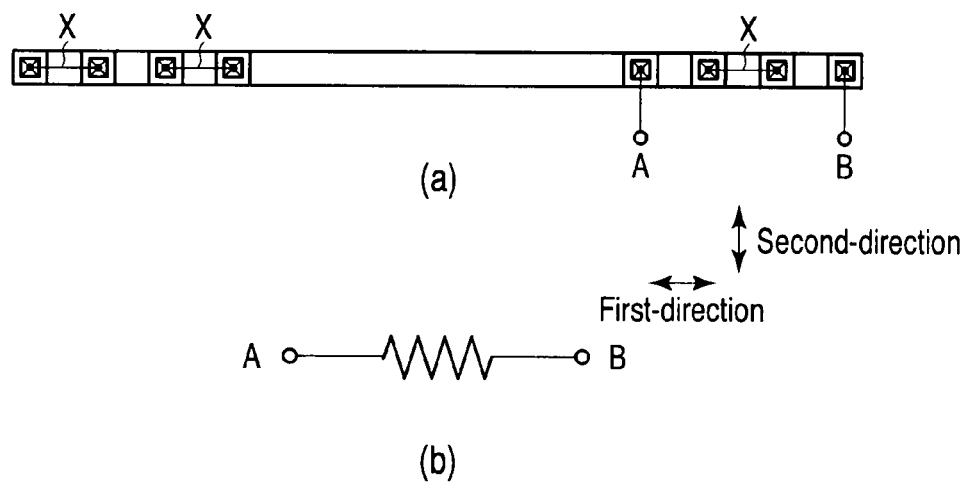
FIG. 52 is a plane view showing a third example of a resistance element.

FIG. 52 shows a resistance element according to a third example of the invention. FIG. 52A is a plan view of the semiconductor substrate, and FIG. 52B shows an equivalent circuit of FIG. 52A.

In the third example, it is assumed that the number of stacked conductive layers is set to four and the number of conductive lines in each conductive layer is set to one. The one conductive line in each conductive layer is made of conductive polysilicon.

One conductive line in each conductive layer is extended in the first direction. The length in the first direction of the conductive line is gradually shortened from the lowermost layer toward the uppermost layer. That is, both ends of the four conductive layers have stairsteps respectively.

In the third example, because the number of stacked layers is the even number (four layers), the two terminals A and B of the 3-dimensional-structure resistance element are drawn from one end side of the four conductive layers.

In the third example, as with the first and second examples, the resistance element that is matched with the semiconductor integrated circuit (such as BiCS-NAND, PRAM, ReRAM, and MRAM) having the 3-dimensional stacked layer structure can be implemented.

(4) Fourth Example

Figure 53:
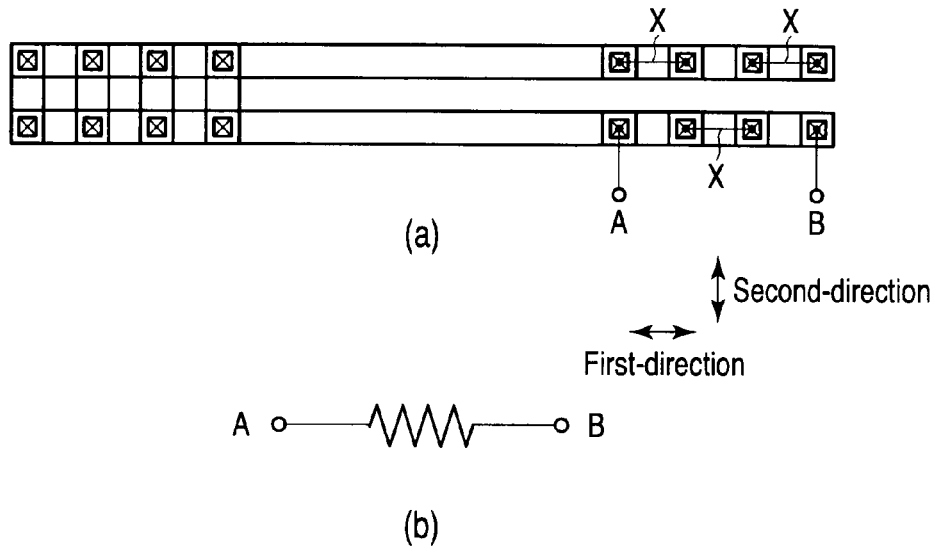
FIG. 53 is a plane view showing a fourth example of a resistance element.

FIG. 53 shows a resistance element according to a fourth example of the invention. FIG. 53A is a plan view of the semiconductor substrate, and FIG. 53B shows an equivalent circuit of FIG. 53A.

In the fourth example, it is assumed that the number of stacked conductive layers is set to four and the number of conductive lines in each conductive layer is set to two. The two conductive lines in each conductive layer are made of conductive polysilicon.

The two conductive lines in each conductive layer are extended in the first direction. Preferably the conductive lines are disposed with a constant pitch in a second direction, and the widths in the second direction of the two conductive lines are equally set. The length in the first direction of the conductive line is gradually shortened from the lowermost layer toward the uppermost layer. That is, both ends of the four conductive layers have stairsteps respectively.

In the fourth example, because the number of stacked layers is the even number (four layers), the two terminals A and B of the 3-dimensional-structure resistance element are drawn from one end side of the four conductive layers.

In the fourth example, as with the first and second examples, the resistance element that is matched with the semiconductor integrated circuit (such as BiCS-NAND, PRAM, ReRAM, and MRAM) having the 3-dimensional stacked layer structure can be implemented.

(5) Fifth Example

Figure 54:
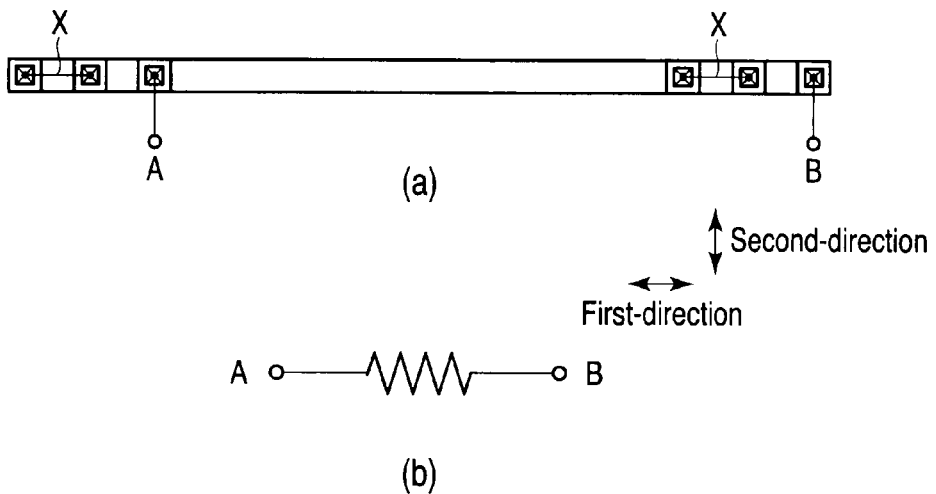
FIG. 54 is a plane view showing a fifth example of a resistance element.

FIG. 54 shows a resistance element according to a fifth example of the invention. FIG. 54A is a plan view of the semiconductor substrate, and FIG. 54B shows an equivalent circuit of FIG. 54A.

In the fifth example, it is assumed that the number of stacked conductive layers is set to three and the number of conductive lines in each conductive layer is set to one. The one conductive line in each conductive layer is made of conductive polysilicon.

The one conductive line in each conductive layer is extended in the first direction. The length in the first direction of the conductive line is gradually shortened from the lowermost layer toward the uppermost layer. That is, both ends of the four conductive layers have stairsteps respectively.

In the fifth example, because the number of stacked layers is the odd number (three layers), the terminal A of the 3-dimensional-structure resistance element is drawn from one end side of the four conductive layers, and the terminal B of the 3-dimensional-structure resistance element is drawn from the other end side of the four conductive layers.

In the fifth example, as with the first and second examples, the resistance element that is matched with the semiconductor integrated circuit (such as BiCS-NAND, PRAM, ReRAM, and MRAM) having the 3-dimensional stacked layer structure can be implemented.

(6) Sixth Example

Figure 55:
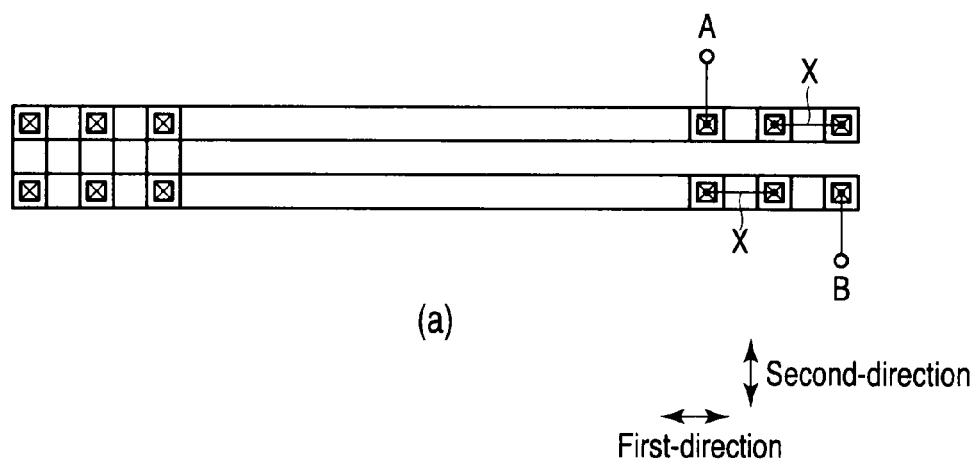
FIG. 55 is a plane view showing a sixth example of a resistance element.

FIG. 55 shows a resistance element according to a sixth example of the invention. FIG. 55A is a plan view of the semiconductor substrate, and FIG. 55B shows an equivalent circuit of FIG. 55A.

In the sixth example, it is assumed that the number of stacked conductive layers is set to three and the number of conductive lines in each conductive layer is set to two. The two conductive lines in each conductive layer are made of conductive polysilicon.

The two conductive lines in each conductive layer are extended in the first direction. Preferably the conductive lines are disposed at constant intervals in the second direction, and the widths in the second direction of the two conductive lines are equally set. The length in the first direction of the conductive line is gradually shortened from the lowermost layer toward the uppermost layer. That is, both ends of the four conductive layers have stairsteps respectively.

In the sixth example, because the number of stacked layers is the odd number (three layers), the terminal A of the 3-dimensional-structure resistance element is drawn from one end side of the four conductive layers, and the terminal B of the 3-dimensional-structure resistance element is drawn from the other end side of the four conductive layers.

In the sixth example, as with the first and second examples, the resistance element that is matched with the semiconductor integrated circuit (such as BiCS-NAND, PRAM, ReRAM, and MRAM) having the 3-dimensional stacked layer structure can be implemented.

(7) Seventh Example

Figure 56:
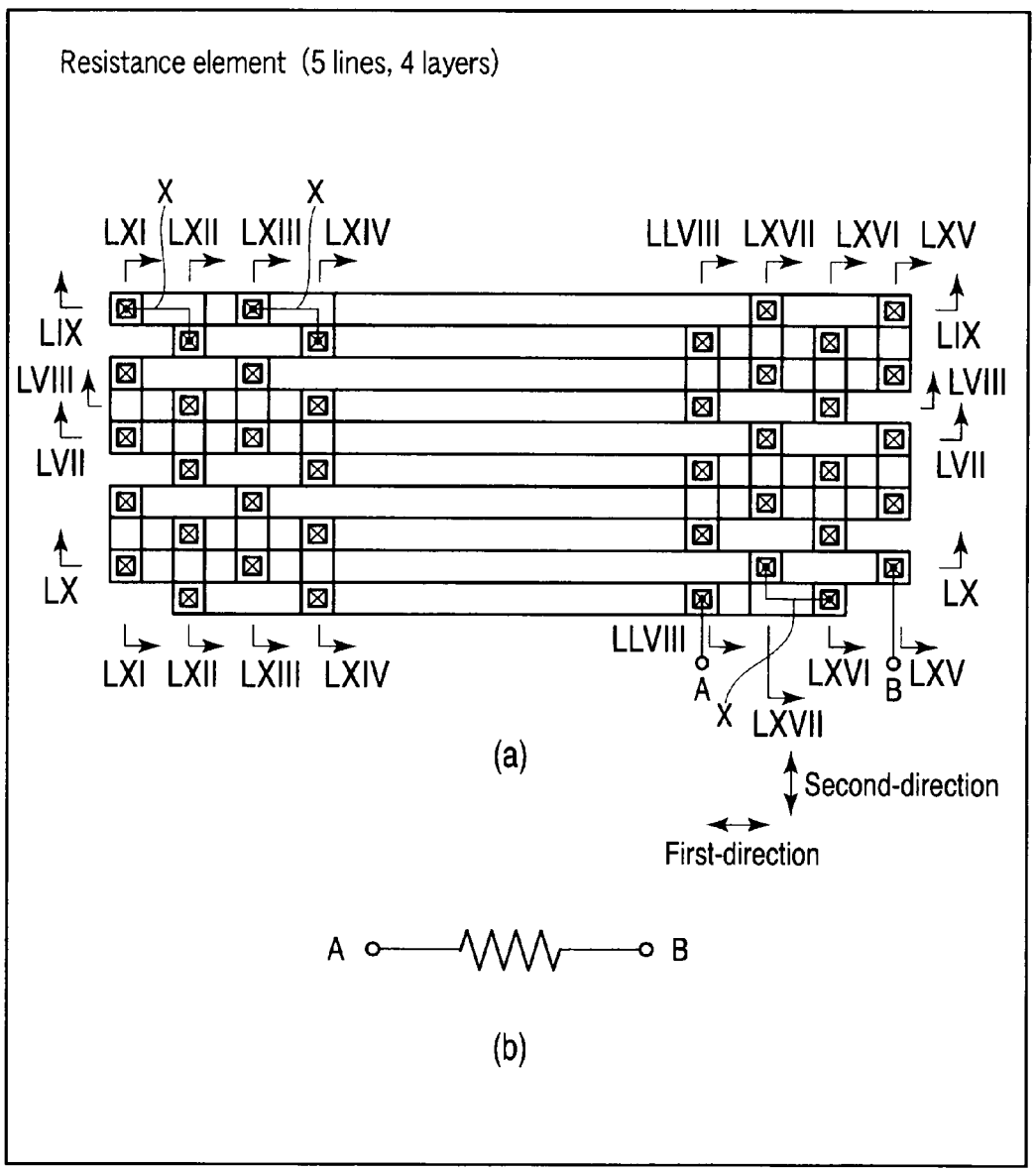
FIG. 56 is a plane view showing a seventh example of a resistance element.
Figure 61:
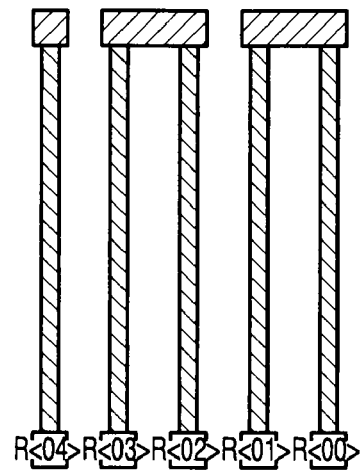
FIG. 61 is a cross sectional view along line LXI-LXI in FIG. 56.
Figure 62:
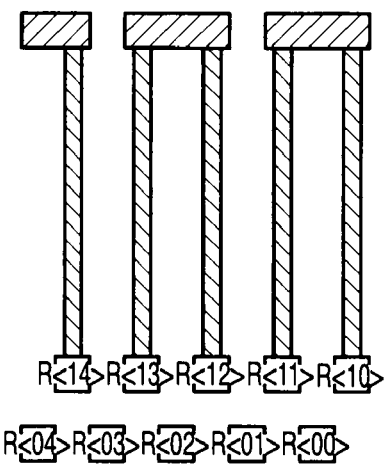
FIG. 62 is a cross sectional view along line LXII-LXII in FIG. 56.
Figure 63:
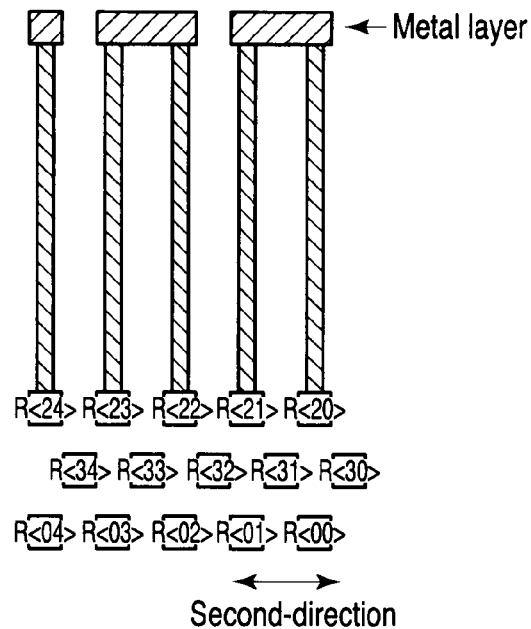
FIG. 63 is a cross sectional view along line LXIII-LXIII in FIG. 56.
Figure 64:
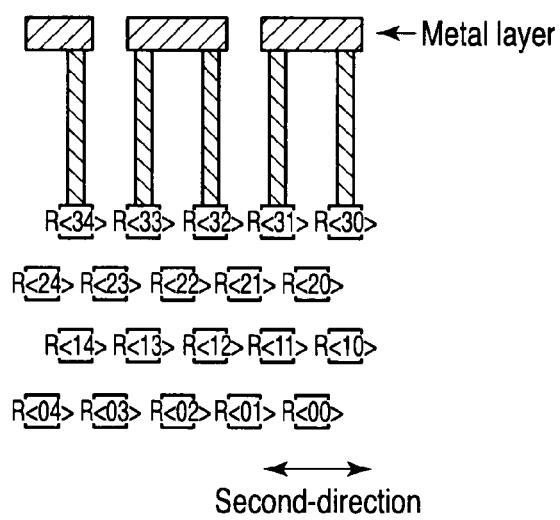
FIG. 64 is a cross sectional view along line LXIV-LXIV in FIG. 56.
Figure 67:
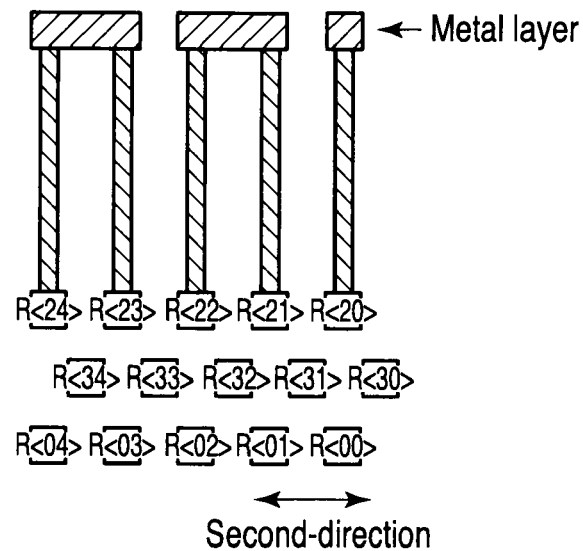
FIG. 67 is a cross sectional view along line LXVII-LXVII in FIG. 56.
Figure 68:
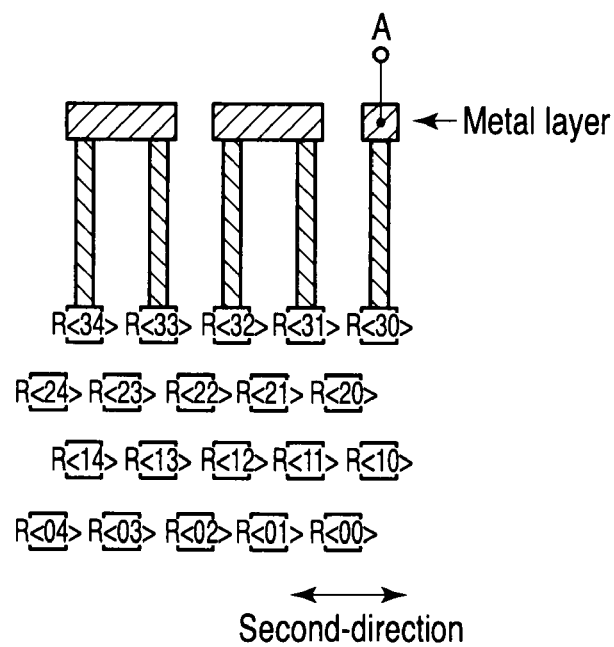
FIG. 68 is a cross sectional view along line LXVIII-LXVIII in FIG. 56.

FIG. 56 shows a resistance element according to a seventh example of the invention. FIG. 56A is a plan view of the semiconductor substrate, and FIG. 56B shows an equivalent circuit of FIG. 56A.

In the seventh example, it is assumed that the number of stacked conductive layers is set to four and the number of conductive lines in each conductive layer is set to five. The five conductive lines in each conductive layer are made of conductive polysilicon.

It is assumed that R<00>, R<01>, R<02>, R<03>, and R<04> are the five conductive lines of the first layer (lowermost layer), R<10>, R<11>, R<12>, R<13>, and R<14> are the five conductive lines of the second layer, and R<20>, R<21>, R<22>, R<23>, and R<24> are the five conductive lines of the third layer, and R<30>, R<31>, R<32>, R<33>, and R<34> are the five conductive lines of the fourth layer (uppermost layer).

The five conductive lines in each conductive layer are extended in the first direction. Preferably the conductive lines are disposed with a constant pitch in the second direction, and the widths in the second direction of the five conductive lines are equally set.

The five conductive lines in the odd-numbered conductive layer (first layer and third layer) and the five conductive lines in the even-numbered conductive layer (second layer and fourth layer) are shifted in a half pitch of the conductive lines in the direction perpendicular to the direction in which the conductive lines extend.

The length in the first direction of the conductive line is gradually shortened from the lowermost layer toward the uppermost layer. That is, both ends of the four conductive layers have stairsteps respectively.

FIGS. 57 to 60 show the state in which both ends (two end portions in the first direction) of the four conductive layers have stairsteps respectively. The four conductive layers are connected in series by the metal layer which is provided on the stairsteps. In the metal layer, the portion designated by the letter X expresses the line connecting the upper layer and the lower layer.

As shown in FIGS. 61 to 68, the five conductive lines in each conductive layer are connected in series by the metal layer which is provided on the stairsteps.

In the seventh example, because the number of stacked layers is the even number (four layers), two terminals A and B of the 3-dimensional-structure resistance element are drawn from one end side of the four conductive layers.

In the seventh example, both the ends of the four conductive layers have stairsteps respectively, and the four conductive layers are connected in series by the metal layer which is provided on the stairsteps, so that the resistance element that is matched with the semiconductor integrated circuit (such as BiCS-NAND, PRAM, ReRAM, and MRAM) having the 3-dimensional stacked layer structure can be implemented.

The five conductive lines in the odd-numbered conductive layer and the five conductive lines in the even-numbered conductive layer are shifted in a half pitch of the conductive lines in the direction perpendicular to the direction in which the conductive lines extend, so that the parasitic capacitance between the upper layer and the lower layer can be reduced.

When the seventh example is applied to the resistance element in the peripheral circuit of BiCS-NAND, the four conductive layers are formed identical to the four conductive layers constituting word line WL<0>, WL<1>, WL<2>, and WL<3> of FIG. 3. Therefore, the 3-dimensional resistance element can be formed without adding a process.

When the seventh example is applied to the resistance element in the peripheral circuit of the resistance change memory, the four conductive layers are formed identical to the four conductive layers constituting word lines WL(d)i−1, WL(d)i, WL(d)i+1, WL(u)i−1, WL(u)i, and WL(u)i+1 and bit lines BL(d)j−1, BL(d)j, BL(d)j+1, BL(u)j−1, BL(u)j, and BL(u)j+1 of FIG. 29. Therefore, the 3-dimensional resistance element can be formed without adding a process.

Alternatively, as with the first example, in the four conductive layers, the word line may be made of CoSi or NiSi by the salicide process to lower the wiring resistance. In such cases, the process in which W, Co, and Ni are not stacked in the resistance element region or the process in which an insulating film is left on polysilicon such that a salicide reaction is not generated may be performed to each of the four conductive layers.

(8) Eighth Example

Figure 69:
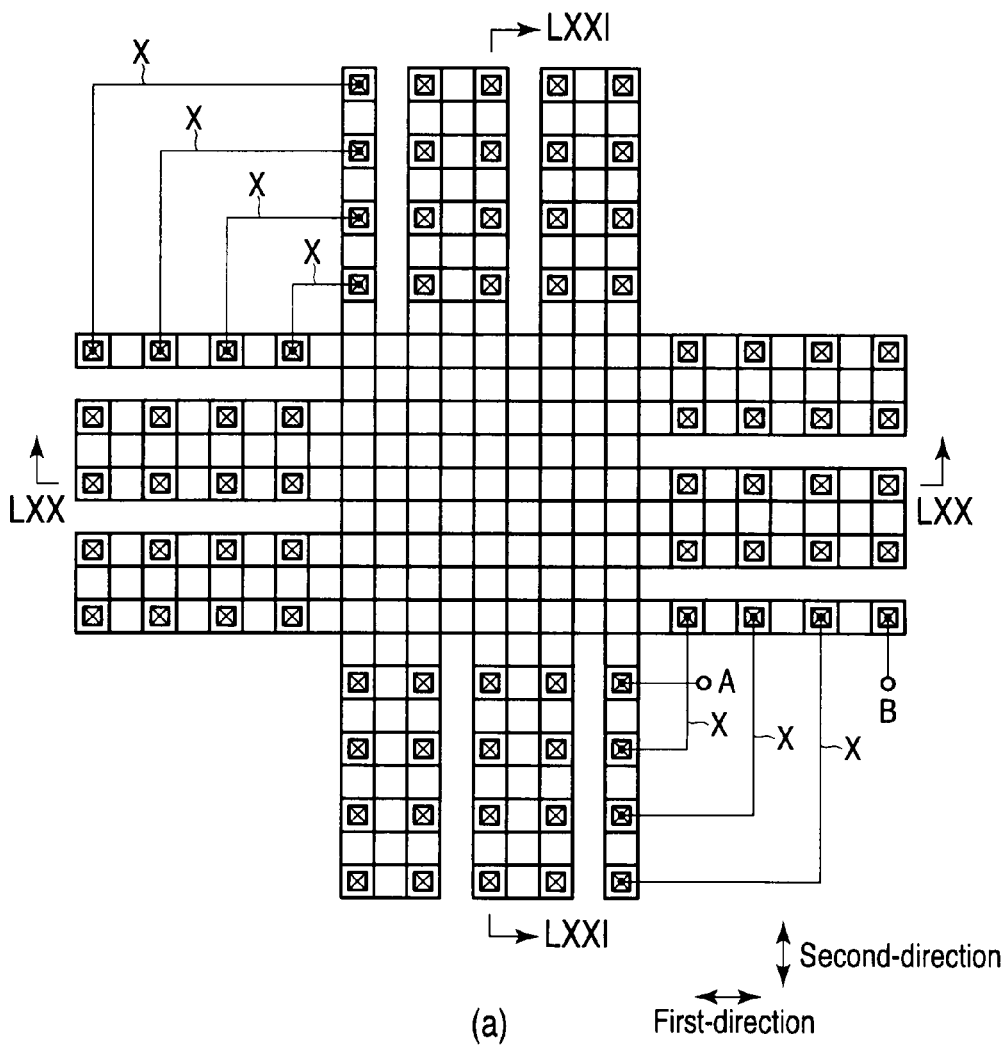
FIG. 69 is a plane view showing a eighth example of a resistance element.

FIG. 69 shows a resistance element according to an eighth example of the invention. FIG. 69A is a plan view of the semiconductor substrate, and FIG. 69B shows an equivalent circuit of FIG. 69A.

In the eighth example, it is assumed that the number of stacked conductive layers is set to eighth and the number of conductive lines in each conductive layer is set to five. The five conductive lines in each conductive layer are made of conductive polysilicon.

It is assumed that R<00>, R<01>, R<02>, R<03>, and R<04> are the five conductive lines of the first layer (lowermost layer), R<10>, R<11>, R<12>, R<13>, and R<14> are the five conductive lines of the second layer, and R<20>, R<21>, R<22>, R<23>, and R<24> are the five conductive lines of the third layer, and R<30>, R<31>, R<32>, R<33>, and R<34> are the five conductive lines of the fourth layer.

It is assumed that R<40>, R<41>, R<42>, R<43>, and R<44> are the five conductive lines of the fifth layer, R<50>, R<51>, R<52>, R<53>, and R<54> are the five conductive lines of the sixth layer, and R<60>, R<61>, R<62>, R<63>, and R<64> are the five conductive lines of the seventh layer, and R<70>, R<71>, R<72>, R<73>, and R<74> are the five conductive lines of the eighth layer (uppermost layer).

The five conductive lines in the odd-numbered conductive layer (first layer, third layer, fifth layer, and seventh layer) are extended in the first direction. Preferably the conductive lines are disposed with a constant pitch in the second direction, and the widths in the second direction of the five conductive lines are equally set.

The five conductive lines in the even-numbered conductive layer (second layer, fourth layer, sixth layer, and eighth layer) are extended in the second direction crossing to the first direction. Preferably the conductive lines are disposed with a constant pitch in the first direction, and the widths in the first direction of the five conductive lines are equally set.

The length in the first direction of the five conductive lines in the odd-numbered conductive layer is gradually shortened from the first layer toward the seventh layer. That is, both ends of the four odd-numbered conductive layers have stairsteps respectively.

The length in the second direction of the five conductive lines in the even-numbered conductive layer is gradually shortened from the second layer toward the eighth layer. That is, both ends of the four even-numbered conductive layers have stairsteps respectively.

FIG. 70 shows the state in which both ends (two end portions in the first direction) of the four odd-numbered conductive layers have stairsteps respectively. The four conductive layers are connected in series by the metal layer which is provided on the stairsteps. In the metal layer, the portion designated by the letter X expresses the line connecting the upper layer and the lower layer.

FIG. 71 shows the state in which both ends (two end portions in the second direction) of the four even-numbered conductive layers have stairsteps respectively. The four conductive layers are connected in series by the metal layer which is provided on the stairsteps. In the metal layer, the portion designated by the letter X expresses the line connecting the upper layer and the lower layer.

As with the first and second examples, the five conductive lines in each conductive layer are connected in series by the metal layer which is provided on the stairsteps.

In the eighth example, both the ends of the eight conductive layers have stairsteps respectively, and the conductive layers are connected in series by the metal layer which is provided on the stairsteps, so that the resistance element that is matched with the semiconductor integrated circuit (such as BiCS-NAND, PRAM, ReRAM, and MRAM) having the 3-dimensional stacked layer structure can be implemented.

The direction in which the five conductive lines in the odd-numbered conductive layer extend and the direction in which the five conductive lines in the even-numbered conductive layer extend are crossed each other, so that the parasitic capacitance between the upper layer and the lower layer can be reduced.

When the eighth example is applied to the resistance element in the peripheral circuit of BiCS-NAND, the four conductive layers are formed identical to the four conductive layers constituting word line WL<0>, WL<1>, WL<2>, and WL<3> of FIG. 3. Therefore, the 3-dimensional resistance element can be formed without adding a process.

When the eighth example is applied to the resistance element in the peripheral circuit of the resistance change memory, the four conductive layers are formed identical to the four conductive layers constituting word lines WL(d)i−1, WL(d)i, WL(d)i+1, WL(u)i−1, WL(u)i, and WL(u)i+1 and bit lines BL(d)j−1, BL(d)j, BL(d)j+1, BL(u)j−1, BL(u)j, and BL(u)j+1 of FIG. 29. Therefore, the 3-dimensional resistance element can be formed without adding a process.

Alternatively, as with the first example, in the four conductive layers, the word line may be made of CoSi or NiSi by the salicide process to lower the wiring resistance. In such cases, the process in which W, Co, and Ni are not stacked in the resistance element region or the process in which the insulating film is left on polysilicon such that the salicide reaction is not generated may be performed to each of the four conductive layers.

6. Capacitance Element

A 3-dimensional-structure capacitance element of the example of the invention will be described below.

The capacitance element of the example of the invention includes three or more conductive layers stacked above the semiconductor substrate, which is made of a conductive polysilicon, and the metal layer is provided above the three or more conductive layers.

(1) First Example

Figure 72:
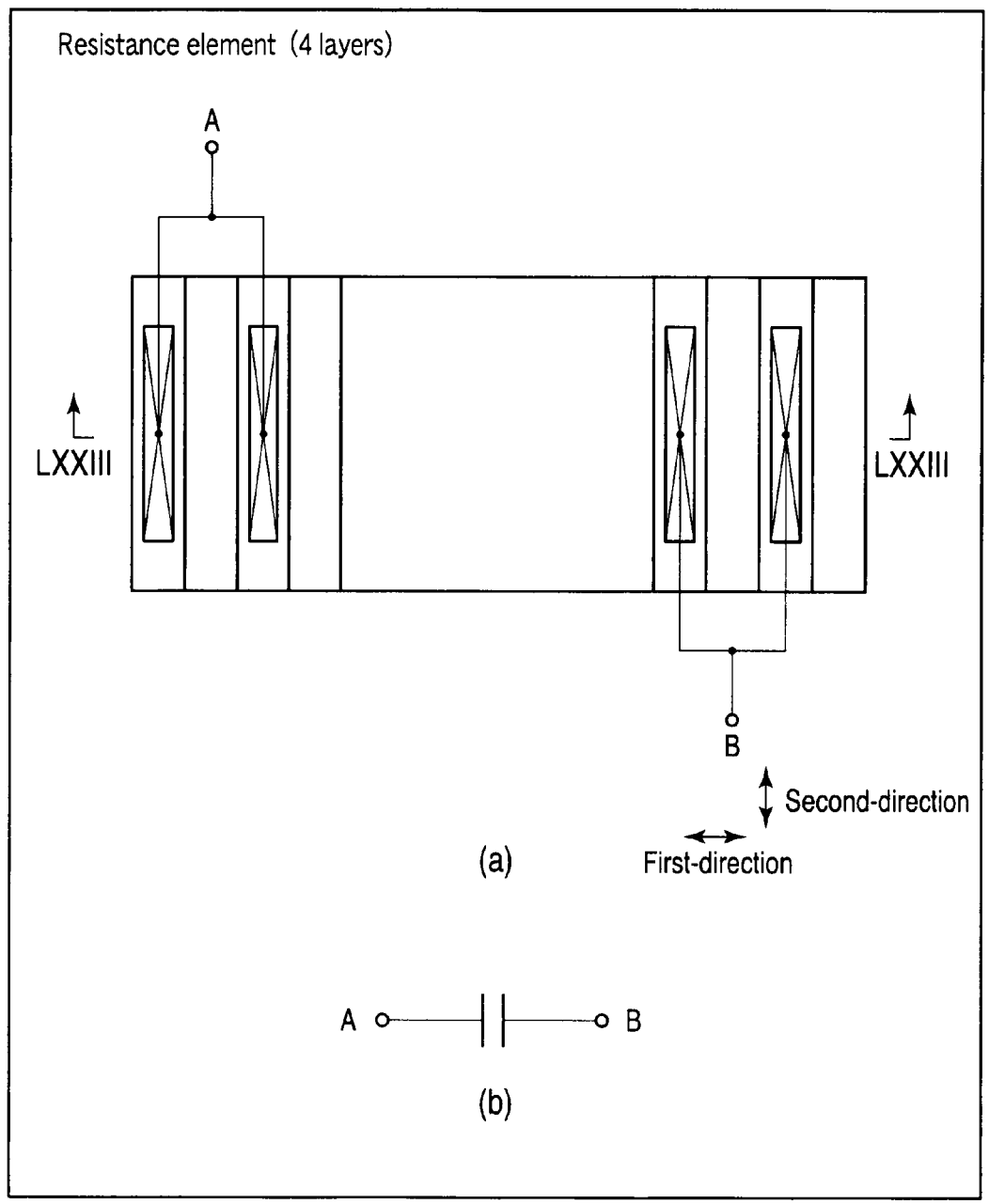
FIG. 72 is a plane view showing a first example of a capacitance element.

FIG. 72 shows a capacitance element according to a First example of the invention. FIG. 72A is a plan view of the semiconductor substrate, and FIG. 72B shows an equivalent circuit of FIG. 72A.

In the First example, it is assumed that the number of stacked conductive layers is set to four. Each conductive layer is made of conductive polysilicon.

Each conductive layer is extended in the first direction. The length in the first direction of the conductive layer is gradually shortened from the first layer (lowermost layer) toward the fourth layer (uppermost layer). That is, both ends of the four conductive layers have stairsteps respectively.

FIG. 73 shows the state in which both ends (two end portions in the first direction) of the four conductive layers have stairsteps respectively.

The odd-numbered conductive layers (first layer and third layer) are connected in series by the metal layer which is provided on the stairsteps, and the odd-numbered conductive layers connected in series include a first electrode of the capacitance element. The even-numbered conductive layers (second layer and fourth layer) are connected in series by the metal layer which is provided on the stairsteps, and the even-numbered conductive layers connected in series include a second electrode of the capacitance element.

Thus, in the First example, both the ends of the four conductive layers have stairsteps respectively, and the capacitance element includes the first electrode having the odd-numbered conductive layer and the second electrode having the even-numbered conductive layer, so that the capacitance element matched with the semiconductor integrated circuit (such as BiCS-NAND, PRAM, ReRAM, and MRAM) having the 3-dimensional stacked layer structure can be implemented.

When the First example is applied to the capacitance element in the peripheral circuit of BiCS-NAND, the four conductive layers are formed identical to the four conductive layers constituting word line WL<0>, WL<1>, WL<2>, and WL<3> of FIG. 3. Therefore, the 3-dimensional resistance element can be formed without adding a process.

When the First example is applied to the capacitance element in the peripheral circuit of the resistance change memory, the four conductive layers are formed identical to the four conductive layers constituting word lines WL(d)i−1, WL(d)i, WL(d)i+1, WL(u)i−1, WL(u)i, and WL(u)i+1 and bit lines BL(d)j−1, BL(d)j, BL(d)j+1, BL(u)j−1, BL(u)j, and BL(u)j+1 of FIG. 29. Therefore, the 3-dimensional resistance element can be formed without adding a process.

(2) Second Example

Figure 74:
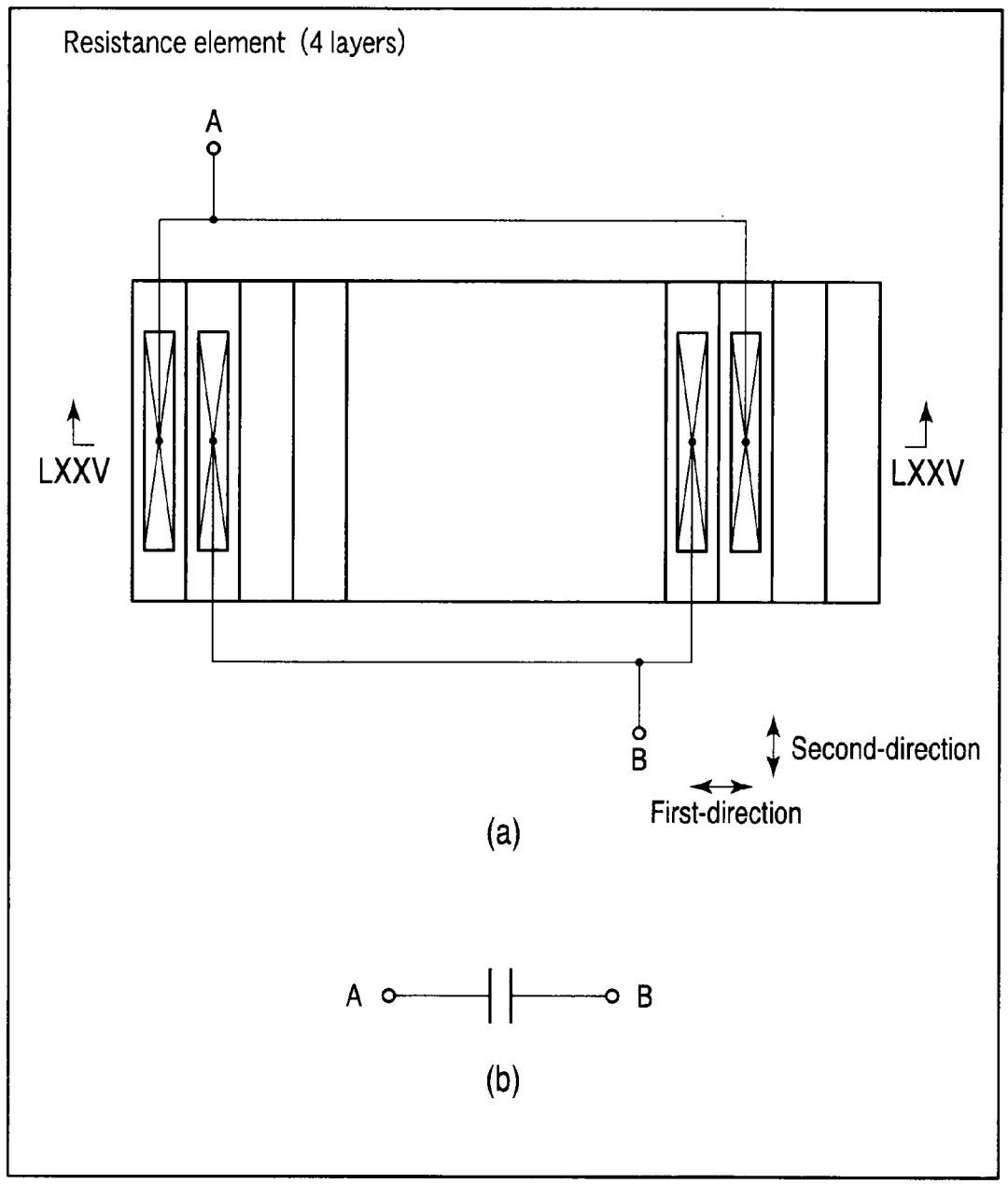
FIG. 74 is a plane view showing a second example of a capacitance element.

FIG. 74 shows a capacitance element according to a second example of the invention. FIG. 74A is a plan view of the semiconductor substrate, and FIG. 74B shows an equivalent circuit of FIG. 74A.

In the second example, it is assumed that the number of stacked conductive layers is set to four. Each conductive layer is made of conductive polysilicon.

Each conductive layer is extended in the first direction. The length in the first direction of the conductive layer is gradually shortened from the first layer (lowermost layer) toward the fourth layer (uppermost layer). That is, both ends of the four conductive layers have stairsteps respectively.

Figure 75:
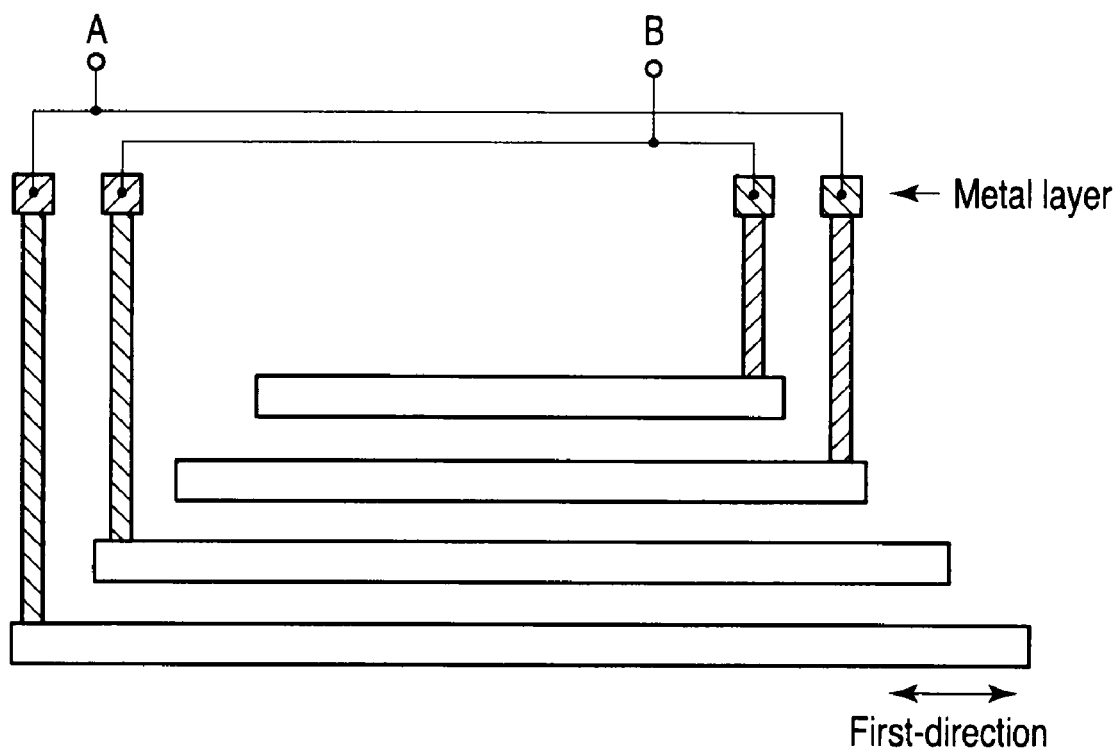
FIG. 75 is a cross sectional view along line LXXV-LXXV in FIG. 74.

FIG. 75 shows the state in which both ends (two end portions in the first direction) of the four conductive layers have stairsteps respectively.

The odd-numbered conductive layers (first layer and third layer) are connected in series by the metal layer which is provided on the stairsteps, and the odd-numbered conductive layers connected in series include the first electrode of the capacitance element. The even-numbered conductive layers (second layer and fourth layer) are connected in series by the metal layer which is provided on the stairsteps, and the even-numbered conductive layers connected in series include the second electrode of the capacitance element.

The second example differs from the First example in a method of extracting the first and second electrodes of the capacitance element.

In the second example, both the ends of the four conductive layers have stairsteps respectively, and the capacitance element includes the first electrode having the odd-numbered conductive layer and the second electrode having the even-numbered conductive layer, so that the capacitance element matched with the semiconductor integrated circuit (such as BiCS-NAND, PRAM, ReRAM, and MRAM) having the 3-dimensional stacked layer structure can be implemented.

When the second example is applied to the capacitance element in the peripheral circuit of BiCS-NAND, the four conductive layers are formed identical to the four conductive layers constituting word line WL<0>, WL<1>, WL<2>, and WL<3> of FIG. 3. Therefore, the 3-dimensional resistance element can be formed without adding a process.

When the second example is applied to the capacitance element in the peripheral circuit of the resistance change memory, the four conductive layers are formed identical to the four conductive layers constituting word lines WL(d)i−1, WL(d)i, WL(d)i+1, WL(u)i−1, WL(u)i, and WL(u)i+1 and bit lines BL(d)j−1, BL(d)j, BL(d)j+1, BL(u)j−1, BL(u)j, and BL(u)j+1 of FIG. 29. Therefore, the 3-dimensional resistance element can be formed without adding a process.

(3) Third Example

Figure 76:
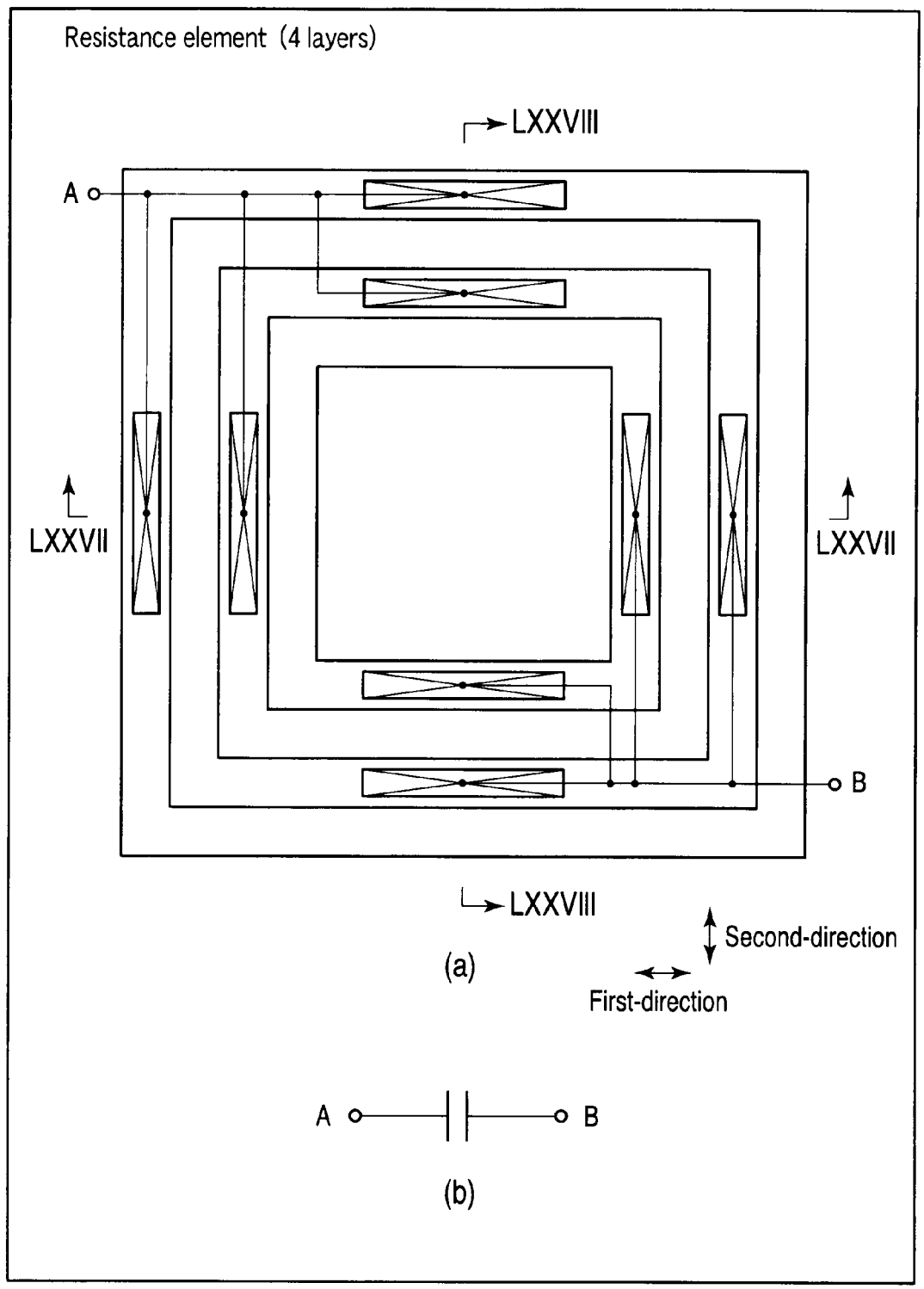
FIG. 76 is a plane view showing a third example of a capacitance element.

FIG. 76 shows a capacitance element according to a third example of the invention. FIG. 76A is a plan view of the semiconductor substrate, and FIG. 76B shows an equivalent circuit of FIG. 76A.

In the third example, it is assumed that the number of stacked conductive layers is set to four. Each conductive layer is made of conductive polysilicon.

The length in the first and second directions of the four conductive layers is gradually shortened from the first layer (lowermost layer) toward the fourth layer (uppermost layer). That is, all the end portions of the four conductive layers have stairsteps respectively (pyramid shape).

FIGS. 77 and 78 show the state in which all the end portions (four end portions in the first and second directions) of the four conductive layers have stairsteps respectively.

The odd-numbered conductive layers (first layer and third layer) are connected in series by the metal layer which is provided on the stairsteps, and the odd-numbered conductive layers connected in series include the first electrode of the capacitance element. The even-numbered conductive layers (second layer and fourth layer) are connected in series by the metal layer which is provided on the stairsteps, and the even-numbered conductive layers connected in series include the second electrode of the capacitance element.

In the third example, all the end portions of the four conductive layers have stairsteps respectively, and the capacitance element includes the first electrode having the odd-numbered conductive layer and the second electrode having the even-numbered conductive layer, so that the capacitance element matched with the semiconductor integrated circuit (such as BiCS-NAND, PRAM, ReRAM, and MRAM) having the 3-dimensional stacked layer structure can be implemented.

When the third example is applied to the capacitance element in the peripheral circuit of BiCS-NAND, the four conductive layers are formed identical to the four conductive layers constituting word line WL<0>, WL<1>, WL<2>, and WL<3> of FIG. 3. Therefore, the 3-dimensional resistance element can be formed without adding a process.

When the third example is applied to the capacitance element in the peripheral circuit of the resistance change memory, the four conductive layers are formed identical to the four conductive layers constituting word lines WL(d)i−1, WL(d)i, WL(d)i+1, WL(u)i−1, WL(u)i, and WL(u)i+1 and bit lines BL(d)j−1, BL(d)j, BL(d)j+1, BL(u)j−1, BL(u)j, and BL(u)j+1 of FIG. 29. Therefore, the 3-dimensional resistance element can be formed without adding a process.

7. Application Examples

In order to realize the bit cost scalability, the techniques of the invention are effectively applied to the BiCS-NAND flash memory including one cell unit in which the memory cells (NAND string) are connected in series.

Figure 79:
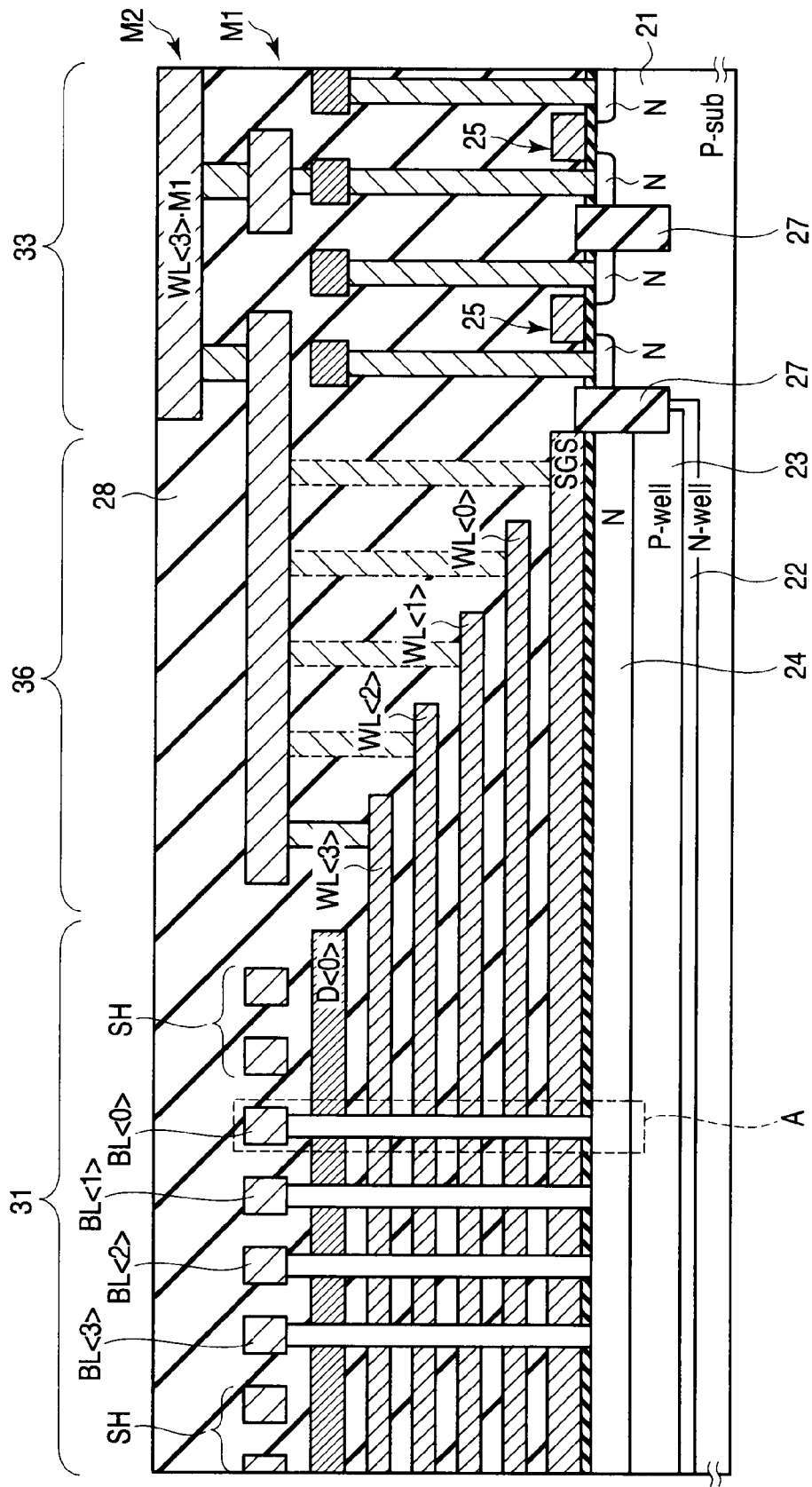
FIG. 79 is a cross sectional view showing a memory cell array in a BiCS-NAND chip as an application example.
Figure 80:
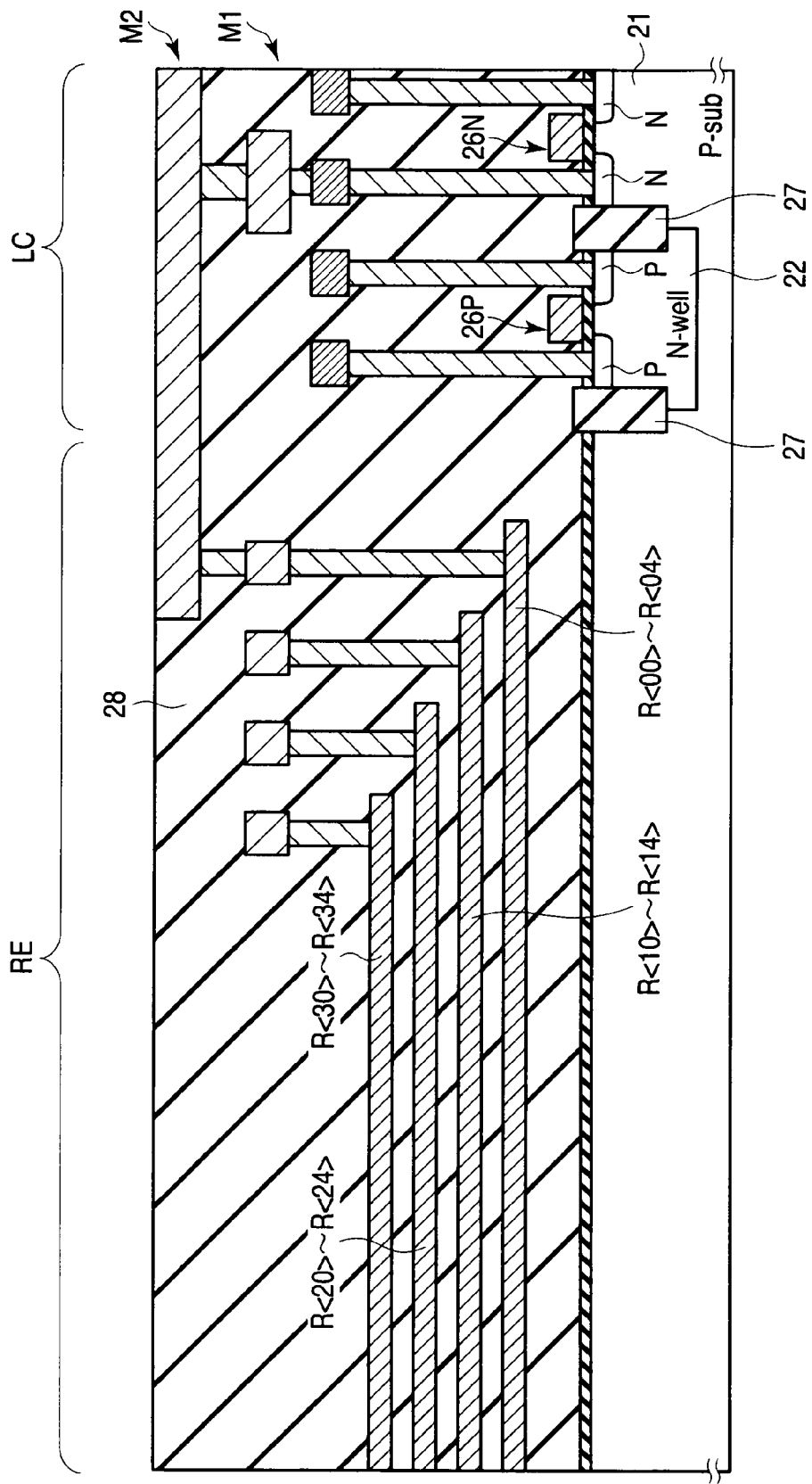
FIG. 80 is a cross sectional view showing a resistance element in a BiCS-NAND chip as an application example.

FIGS. 79 and 80 show specific examples when the resistance element of the example of the invention is applied to the BiCS-NAND flash memory.

The numerals of FIG. 79 correspond to the numerals of FIGS. 3 to 23 used in the description of BiCS-NAND. Both the structure of FIG. 79 and the structure of FIG. 80 are formed on the common semiconductor substrate 21. In FIG. 80, the letter RE designates the resistance element, and the letter LC designates the logic circuit (CMOS circuit).

In BiCS-NAND, word lines WL<0>, WL<1>, WL<2>, and WL<3> are formed with a uniform thickness (for example, 100 mm to 200 mm). Therefore, the capacitance element is formed by utilizing the four conductive layers. For example, the four conductive layers R<00> to R<04>, R<10> to R<14>, R<20> to R<24>, and R<30> to R<34> constituting resistance element RE correspond to the four conductive layers constituting word lines WL<0>, WL<1>, WL<2>, and WL<3>. In the four conductive layers, the conductive layers located in the same level are formed at the same time.

The conductive layer constituting source-side select gate line SGS in BiCS-NAND corresponds to the conductive layer constituting the gate electrode of the transistor in logic circuit LC. The conductive layer is also simultaneously formed.

It is considered that a so-called MONOS type in which the charge accumulation layer is made of the insulating material (for example, nitride) is effectively applied to the memory cell structure of the BiCS memory. However, the example of the invention is not limited to the MONOS type, but the example of the invention can be applied to the floating gate type in which the charge accumulation layer is made of conductive polysilicon.

In the example of the invention, the data value stored in one memory cell may be a binary value (two-level) or a multi-level value of three-level value or more.

8. Conclusion

According to the invention, the resistance element and the capacitance element are 3-dimensionally formed, so that the areas necessary for the resistance element and the capacitance element can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   first conductive layers stacked above the semiconductor substrate, which are comprised of a conductive polysilicon;
   a metal layer provided above the first conductive layers; and
   a 3-dimensional memory which includes second conductive layers stacked above the semiconductor substrate, said second conductive layers comprising a conductive polysilicon,
   wherein ends of the first conductive layers have stairsteps respectively, the first conductive layers are connected in series by a metal layer which is provided on the stairsteps, and the first conductive layers connected in series comprises a resistance element,
   wherein the number of the first conductive layers is equal to the number of the second conductive layers.

2. The device according to claim 1,
   wherein the 3-dimensional memory is a nonvolatile semiconductor memory which is applied by a BiCS technique.

3. The device according to claim 1,
wherein the resistance element is provided in a peripheral circuit of the 3-dimensional memory.

4. The device according to claim 1, further comprising
a driver electrically connected to the 3-dimensional memory and including a high-voltage transistor;
a level shifter electrically connected to the driver; and
an address decoder electrically connected to the level shifter.

5. The device according to claim 1,
wherein each of the first and second conductive layers is comprised of conductive lines which extend to the same direction, and the conductive lines are connected in series by the metal layer.

6. The device according to claim 5,
wherein the conductive lines in the odd-numbered first and second conductive layer form the semiconductor substrate and the conductive lines in the even-numbered first and second conductive layer form the semiconductor substrate are shifted in a half pitch of the conductive lines in a direction perpendicular to a direction in which the first and second conductive layers extend.

7. The device according to claim 5,
wherein a direction in which the conductive lines in the odd-numbered first and second conductive layer form the semiconductor substrate extend and a direction in which the conductive lines in the even-numbered first and second conductive layer form the semiconductor substrate extend are crossed each other.

8. A semiconductor device comprising:
a semiconductor substrate;
three or more conductive layers stacked above the semiconductor substrate, which are comprised of a conductive polysilicon; and
a metal layer provided above the conductive layers,
wherein ends of the conductive layers have stairsteps respectively,
wherein the odd-numbered conductive layers are connected in series by a metal layer which is provided on the stairsteps, and the odd-numbered conductive layers connected in series comprise a first electrode of a capacitance element,
wherein the even-numbered conductive layers are connected in series by a metal layer which is provided on the stairsteps, and the even-numbered conductive layers connected in series comprise a second electrode of the capacitance element.

9. The device according to claim 8, further comprising
a first metal layer connected between the odd-numbered conductive layers and extending toward a first direction;
a second metal layer connected between the even-numbered conductive layers and extending toward the first direction;
a third metal layer connected between the odd-numbered conductive layers and extending toward a second direction; and
a fourth metal layer connected between the even-numbered conductive layers and extending toward the second direction,
wherein the first metal layer and the third metal layer is electrically connected, the second metal layer and the fourth metal layer is electrically connected.

10. The device according to claim 8, further comprising
a 3-dimensional memory which includes conductive layers stacked above the semiconductor substrate, which is comprised of a conductive polysilicon,
wherein the number of the conductive layers which comprises the capacitance element is equal to the number of the conductive layers which comprises the 3-dimensional memory.

11. The device according to claim 10,
wherein the 3-dimensional memory is a nonvolatile semiconductor memory which is applied by a BiCS technique.

12. The device according to claim 10,
wherein the capacitance element is provided in a peripheral circuit of the 3-dimensional memory.

13. The device according to claim 10, further comprising
a driver electrically connected to the 3-dimensional memory and including a high-voltage transistor;
a level shifter electrically connected to the driver; and
an address decoder electrically connected to the level shifter.

14. A semiconductor device comprising:
a semiconductor substrate;
conductive layers stacked above the semiconductor substrate, which are comprised of a conductive polysilicon; and
a metal layer provided above the conductive layers,
wherein ends of the conductive layers have stairsteps respectively, the conductive layers are connected in series by a metal layer which is provided on the stairsteps, and the conductive layers connected in series comprises a resistance element,
wherein each of the conductive layers is comprised of conductive lines which are extend to the same direction, and the conductive lines are connected in series by the metal layer,
wherein the conductive lines in the odd-numbered conductive layer form the semiconductor substrate and the conductive lines in the even-numbered conductive layer form the semiconductor substrate are shifted in a half pitch of the conductive lines in a direction perpendicular to a direction in which the conductive layers extend.

15. The device according to claim 14,
wherein a direction in which the conductive lines in the odd-numbered conductive layer form the semiconductor substrate extend and a direction in which the conductive lines in the even-numbered conductive layer form the semiconductor substrate extend are crossed each other.

16. The device according to claim 14, further comprising
a driver electrically connected to a 3-dimensional memory and including a high-voltage transistor;
a level shifter electrically connected to the driver; and
an address decoder electrically connected to the level shifter.

17. The device according to claim 14, further comprising
a first metal layer connected between the odd-numbered conductive layers and extending toward a first direction;
a second metal layer connected between the even-numbered conductive layers and extending toward the first direction;
a third metal layer connected between the odd-numbered conductive layers and extending toward a second direction; and
a fourth metal layer connected between the even-numbered conductive layers and extending toward the second direction,
wherein the first metal layer and the third metal layer is electrically connected, the second metal layer and the fourth metal layer is electrically connected.

* * * * *